United States Patent [19]
Emoto et al.

[11] Patent Number: 5,572,443
[45] Date of Patent: Nov. 5, 1996

[54] ACOUSTIC CHARACTERISTIC CORRECTION DEVICE

[75] Inventors: Naohiro Emoto; Tsugio Ito, both of Hamamatsu, Japan

[73] Assignee: Yamaha Corporation, Hamamatsu, Japan

[21] Appl. No.: 238,510

[22] Filed: May 5, 1994

[30] Foreign Application Priority Data

| May 11, 1993 | [JP] | Japan | 5-132756 |
|---|---|---|---|
| Jul. 16, 1993 | [JP] | Japan | 5-198977 |
| Jul. 22, 1993 | [JP] | Japan | 5-201765 |
| Jul. 22, 1993 | [JP] | Japan | 5-201766 |
| Jul. 29, 1993 | [JP] | Japan | 5-207281 |
| Sep. 21, 1993 | [JP] | Japan | 5-257596 |

[51] Int. Cl.$^6$ .................................................. H03G 5/00
[52] U.S. Cl. ................... 364/550; 364/724.19; 381/101; 381/103; 359/173
[58] Field of Search ................ 364/550, 724.19; 381/103, 101; 359/173

[56] References Cited

U.S. PATENT DOCUMENTS

| 4,156,809 | 5/1979 | Phillips | 359/173 |
|---|---|---|---|
| 4,458,362 | 7/1984 | Berkovitz et al. | 381/103 |
| 4,631,749 | 12/1986 | Rapaich | 381/103 |
| 4,694,498 | 9/1987 | Suzuki et al. | 381/103 |
| 4,739,513 | 4/1988 | Kunugi et al. | 381/103 |
| 4,888,808 | 12/1989 | Ishikana et al. | 381/103 |
| 4,888,809 | 12/1989 | Knibbeler | 381/103 |
| 4,967,380 | 10/1990 | Szajnowski | 364/550 |
| 5,270,954 | 12/1993 | Sakata | 364/724.19 |
| 5,272,656 | 12/1993 | Genereux | 364/724.19 |

FOREIGN PATENT DOCUMENTS 529158  8/1991  European Pat. Off. .
571635  11/1992  European Pat. Off. .

OTHER PUBLICATIONS

European Search Report dated, Sep. 18, 1995, Appl. No. 94107305.8.
Robert W. Adams, "An Automatic Equalizer/Analyzer", An Audio Engineering Society Preprint, Presented at the 67th Convention 1980 Oct. 31/Nov. 3, New York.
Cecil W. Solomon, et al., "A 12–Band Microprocessor Controlled Graphic Equalizer Display Filter IC", IEEE Transactions on Consumer Electronics 37 (1991) Aug., No. 3, New York.

*Primary Examiner*—Emanuel T. Voeltz
*Assistant Examiner*—Patrick J. Assouad
*Attorney, Agent, or Firm*—Loeb & Loeb LLP

[57] ABSTRACT

An acoustic characteristic correction device includes a section for setting a desired characteristic of a response characteristic in a reproduction system including a sound field, a section for outputting information of a measured characteristic of the response characteristic, a section for computing a correction characteristic for realizing the desired characteristic on the basis of the desired characteristic and the measured characteristic, and a section for imparting the computed correction characteristic to a sound signal to be reproduced. The device may further includes a display section for displaying the set desired characteristic, a section for controlling the level or frequency of the computed correction characteristic, a section for imparting a compensation characteristic to the correction characteristic. Results of measurement at plural points for plural measuring times may be stored and an average value of the results of measurement may be used as a measuring signal. In measuring a response characteristic by using a TSP signal, a convolution operator may be used commonly for time compression by an inverse filter characteristic and imparting of a correction characteristic.

24 Claims, 32 Drawing Sheets

MEASURING AND CORRECTION EFFECT CONFIRMATION MODES

MUSIC PLAYBACK MODE

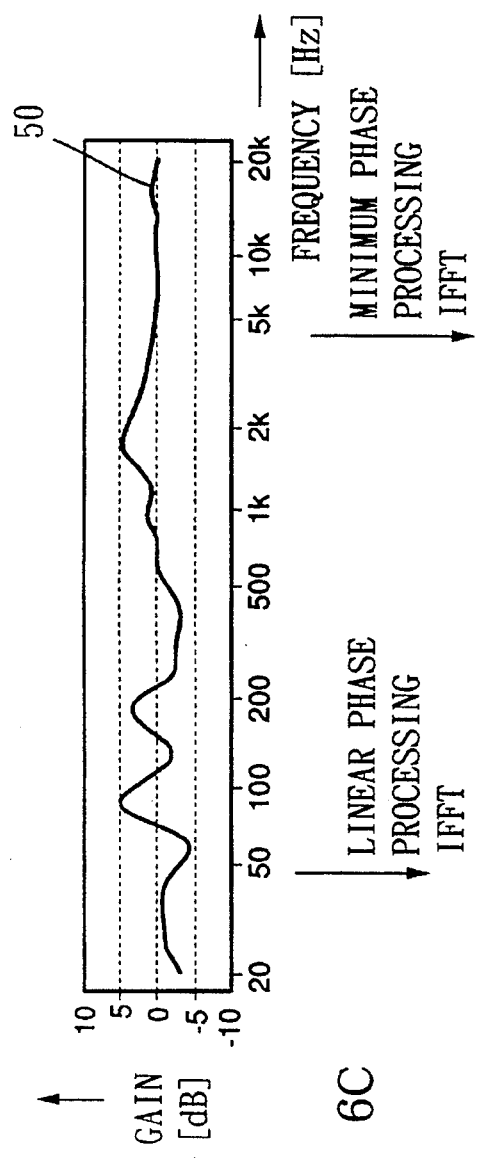
FIG. 6C
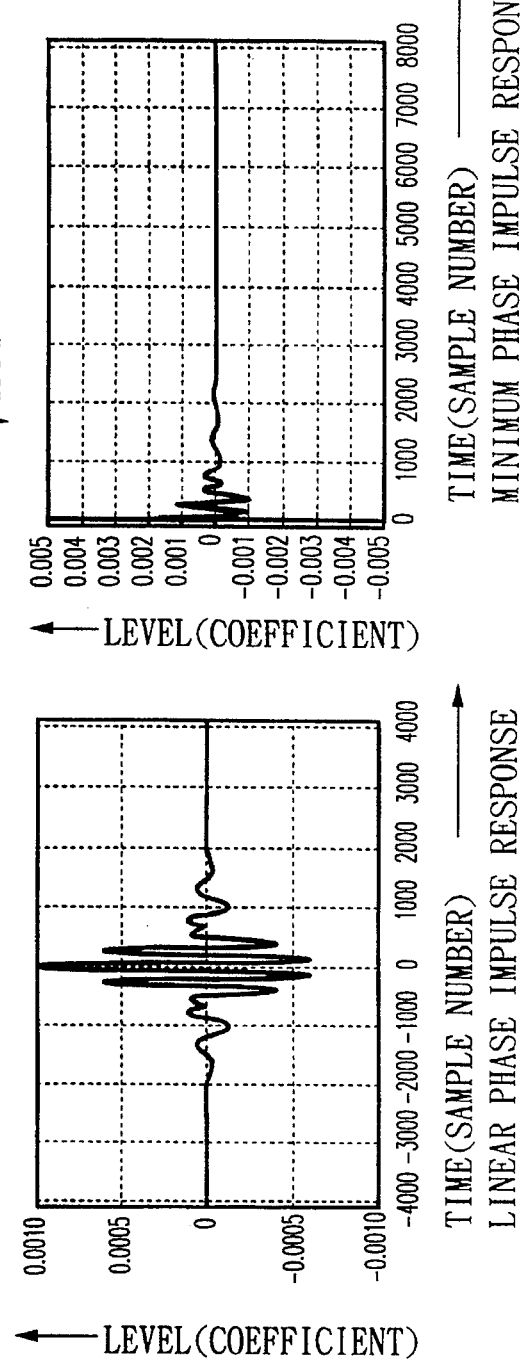
FIG. 6E
FIG. 6D

BAND SIGNAL WAVEFORM CENTER
FREQUENCIES (31 BANDS)

EXAMPLE OF BAND
SIGNAL WAVEFORM (100Hz)

BAND SIGNAL WAVEFORM
OUTPUT FLOW

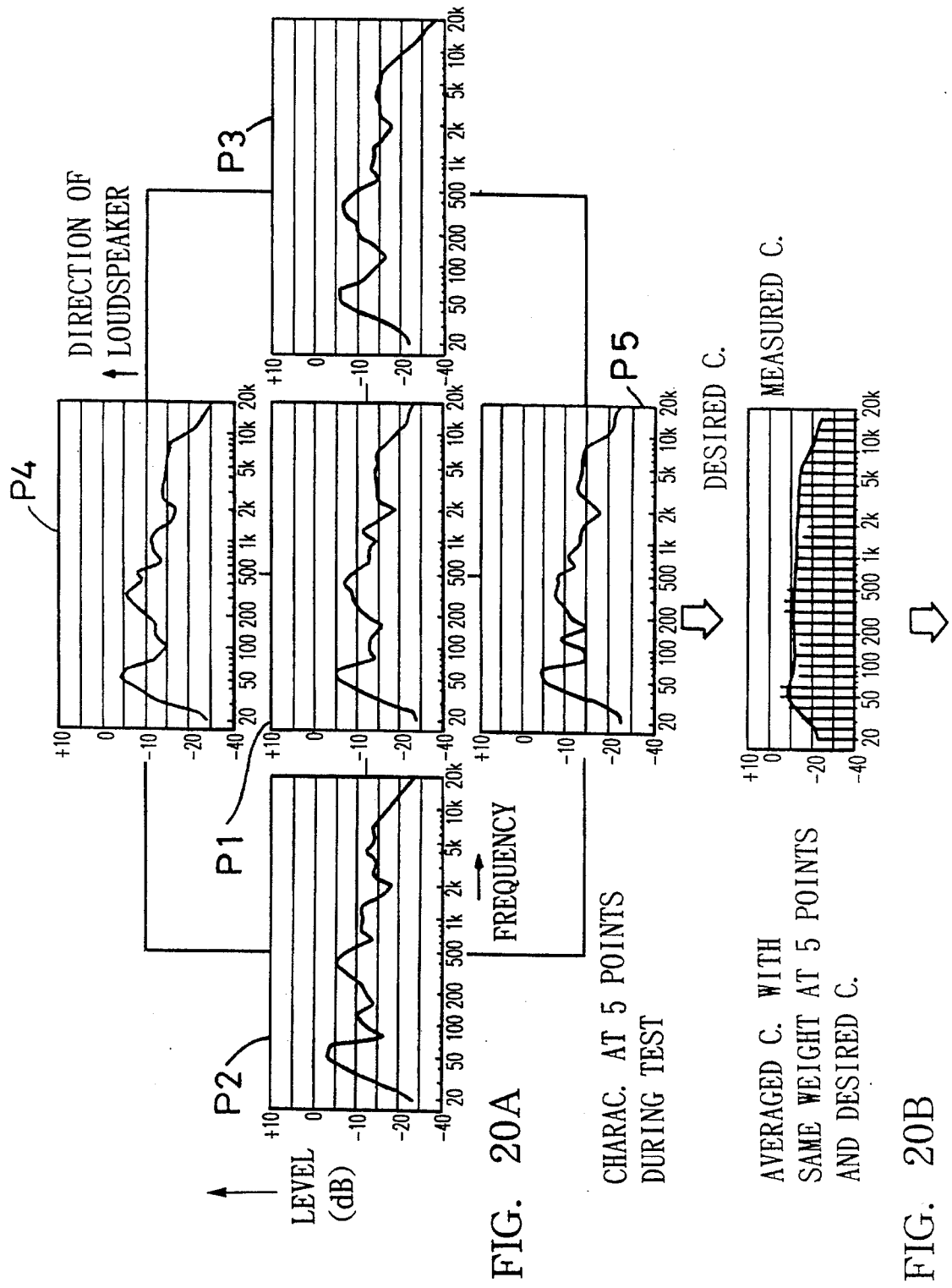
FIG. 20A  CHARAC. AT 5 POINTS DURING TEST
FIG. 20B  AVERAGED C. WITH SAME WEIGHT AT 5 POINTS AND DESIRED C.

ACOUSTIC CHARACTERISTIC CORRECTION DEVICE

BACKGROUND OF THE INVENTION

This invention relates to an acoustic characteristic correction device for correcting a response characteristic such as frequency response of reproduction system including a sound field such as listening room to a desired characteristic.

As a device for correcting a response characteristic of an entire reproduction system including a room and loudspeaker, there is generally known a graphic equalizer which divides an audio frequency range into several regions and adjusts gain of each divided region. It is, however, not possible in the graphic equalizer to know how a reproduced sound can be adjusted to a desired characteristic.

For solving this problem of the conventional graphic equalizer and enabling a response characteristic of the entire reproduction system to be automatically set to a desired characteristic, there is a device disclosed, for example, in Japanese Patent Publication No. Sho 61-59004. According to this device, a user of a listener sets a desired characteristic, reproduces a measuring signal such as a white noise or impulse by a loudspeaker of a reproduction system in a sound field in which a tone signal is to be reproduced, collects the measuring signal by a microphone to measure a response characteristic, obtains a correction characteristic so that the measured characteristic will conform to the desired characteristic, sets a filter characteristic of the equalizer so as to agree with the correction characteristic, and reproduces a tone signal through this equalizer whereby music can be enjoyed in a state adjusted to the desired characteristic. The amount of correction obtained by the automatic adjustment is displayed graphically as in the conventional graphic equalizer.

Since the graphic equalizer is used to equalize (i.e., to obtain a flat characteristic) a response characteristic of a reproduction system including a sound field, it is conceivable, for setting a desired characteristic in the case of automatically adjusting the amount of correction, to preset, in a ROM or the like device, several characteristics such as a flat characteristic and, if necessary, a characteristic obtained by attenuating a high frequency region or a low frequency region from a flat characteristic and to select a desired one of these preset characteristics on the basis of an operation by a user and set this selected characteristic as a desired characteristic. In this case, the device disclosed in the above mentioned Japanese Publication No. Sho 61-59004 which merely displays the automatically adjusted amount of correction does not teach the user how to produce the object desired characteristic.

It is, therefore, a first object of the invention to facilitate setting of a desired characteristic in an acoustic characteristic correction device capable of automatically adjusting the amount of correction to comply with a desired characteristic.

By measuring response character in a room, it is found that there is a significant difference in the characteristic depending upon the position where the measurement is made. This is because reflected sound waves from the ceiling, floor and walls of the room interfere with one another and thereby changes the frequency characteristic. This phenomenon becomes remarkable notwithstanding that there is not much difference in the measured position as the wave length becomes shorter and the frequency becomes higher. Accordingly, if a correction characteristic is obtained on the basis of data at a single measuring point and filter coefficients of the equalizer are computed on the basis of this correction characteristic, the best result will be available at this point but, in an area in the vicinity of this point (e.g., a range within which the listener's head moves), an extreme peak dip sometimes occurs and therefore the best result is not always available. For this reason, a slight movement of the listener's head sometimes causes a sound with an emphasized peak dip which gives an unnatural impression in hearing.

When a correction is made on the basis of a correction characteristic obtained by directly using a measured characteristic which has been finely obtained for each frequency band, a peak dip tends to be emphasized with the result that an unnatural impression is caused in hearing.

It is, therefore, a second object of the invention to provide an acoustic characteristic correction device capable preventing such unnatural impression in hearing occurring due to an excessive correction of a measured characteristic.

The above described prior art device requires a structure for measuring response characterisitc and a separate structure for correcting the response characteristic and, therefore, the prior art device has an extremely complex hardware structure.

It is, therefore, a third object of the invention to provide a more compact acoustic characteristic correction device having a simplified hardware structure.

Computation of fi 1 ter coefficients of an equalizer which conform to a correction characteristic is achieved by computing a corresponding impulse response by applying Fourier inverse transform to the correction characteristic. The impulse response obtained in this way is set as the filter coefficients in the equalizer (FIR filter), and the correction characteristic is thereby imparted to a music signal.

There are various types of algorithins for Fourier inverse transform. It has been fund that they have both benefits and defects peculiar to each of them when they are used for computation of FIR filter coefficients for the correction of a response characteristic of a music signal and in some cases some of them are not proper for use.

It is, therefore, a fourth object of the invention to provide an acoustic characteristic correction device capable of imparting an optimum correction characteristic for a particular use.

When a response characteristic is measured in a sound field to be reproduced, there is a case where a measured characteristic having a large peak dip is observed. This peak dip nften is caused by a slight change in the measuring environment. If such correction characteristic is used directly for equalizing, portions in the correction characteristic which a large amount of correction has been made of ten fail to become a desired correction due to a slight change in the environment (e.g., a slight change in the frequency characteristic due to temperature and humidity of the air) and rather become significant correction errors in the equalizing characteristic which do not normally appear with the result that a proper equalized characteristic cannot be obtained.

Further, in a case where a desired characteristic having a relatively wide low or high frequency range is set, this poses an undue burden of correction to the loudspeaker with the result that a proper characecistic cannot be obtained or an excessive load is applied to the loudspeaker.

It is, therefore, a fifth object of the invention to provide an acoustic characteristic correction device capable of preventing an excessive or undue correction.

A response characteristic (i.e., transmission frequency characteristic) which is measured by using a measuring signal is a characteristic of a time-mean value of sound power combining a direct sound, a reflected sound and a reverberation sound. The frequency characteristic of reverberation time is longer as the frequency is lower and shorter as the frequency is higher and, therefore, the response characteristic which is measured as a sum of the direct sound, reflected sound and reverberation sound tends to increase in the low frequency even if the frequency characteristic of the direct sound itself is flat. For this reason, when a correction characteristic is computed on the basis of this measured characteristic, a low sound tends to drop. Since, however, a frequency characteristic in hearing tends to be dominated by a direct sound, when correction made by using the correction characteristic computed in this manner, a low sound tends to become lower than a desired characteristic in hearing.

It is, therefore, a sixth object the invention to provide an acoustic characteristic correction device capable of conforming a characteristic in hearing to a desired characteristic.

SUMMARY OF THE INVENTION

For achieving the invention, an acoustic characteristic correct ion device comprises desired characteristic setting means for setting, on the basis of an operation by an operating person, a desired characteristic of a response characteristic in a reproduction system including a sound field, desired characteristic display means for graphically displaying the set desired characteristic, measured characteristic input means for inputting information of a measured characteristic of the response characteristic of the reprodue tion sys tern including the sound field, correction characteristic computing means for computing a correction characteristic for realizing the desired characteristic on the basis of the desired characteristic and the measured characteristic, and correction characteristic imparting means for imparting the computed correction characteristic to a sound signal to be reproduced.

According the invention, since a desired characteristic set on the basis of an operation by an operating person is graphically displayed, the operating person can set his desired characteristic while watching this display so that setting of the desired characteristic can be facilitated.

In one aspect of the invention, the above described device further comprises measured characteristic display means for graphically displaying the measured characteristic.

According to this aspect of the invention, since the measured characteristic is also graphically displayed, the response characteristic of the reproduction system including the sound field can be readily understood.

In another aspect of the invention, in this device, the desired characteristic display means and the measured characteristic display means display the desired characteristic and the measured characteristic so that these characteristics are superposed one upon the other on a common axis of a graph.

According to this aspect of the invention, difference between the desired characteristic and the measured characteristic can be readily understood and this will help setting a desired characteristic (e.g., by setting a desired characteristic within a range in which the difference between the desired characteristic and the measured characteristic will not become to large).

In another aspect of the invention, the device further comprises correction characteristic display means for graphically displaying the correction characteristic.

According to this aspect of the invention, the correction characteristic can be readily understood.

In another aspect of the invention, in the device, said desired characteristic setting means comprises a non-volatile memory for holding a plurality of the desired characteristics, and desired characteristic selection means for selectively reading out one of the desired characteristics held by the non-volatile memory on the basis of an operation by the operating person for setting the selected characteristic as the desired characteristic.

According to this aspect of the invention, a plurality of desired characteristics are prestored in a non-volatile memory and a desired one of them is read out on the basis of the uperation of the operating person and set as the desired characteristic, so that setting of the desired characteristic can be facilitated.

In still another aspect of the invention, the device further comprises desired characteristic correction means for correcting the selected desired characteristic on the basis of an operation of the operating person.

According this aspect of the invention, a desired characterisLic read from the non-volatile memory can be corrected on the basis of the operation by the operating person and, therefore, a desired characteristic can be created anew as desired by the operating person.

In another aspect of the invention, the device further comprises corrected desired characteristic storage means for storing the desired characteristic which has been corrected by said desired characteristic correction means and said desired characteristic selection means read out, on the basis of an operation by the operaling person. A desired one from among the corrected desired characteristic stored in said corrected desired characteristic storage means and the desired characteristics stored in said non-volatile memory for setting the selected characteristic as the desired characteristic.

According to this aspect of the invention, the corrected desired characteristic is stored and a desired one of the corrected desired characteristic and the original desired characteristics can be selectively used, so that a desired characteristic which has once been created can be stored and used repeatedly whereby work for producing the same desired characteristic again each time it is used can be saved.

In another aspect of the invention, the device further comprises correcting characteristic correction means for correcting, on the basis of an operation by the operating person for designating a correction frequency range, the characteristic outside of said range to a characteristic which is free from correction.

According to this aspect of the invention, a range where no correction is made is set, so that correction ranging over a frequency range (e. g., the lower or upper limit of the frequency characteristic) in which correction is undesirable can be prevented.

In another aspect of the invention, the device further comprises measuring signal output means for outputting a measuring signal imparted with or without the correction characteristic on the basis of an operation by the operating person, and response characteristic measuring means for obtaining information of the measured characteristic by inputting the output measuring signal which has been reproduced by a loudspeaker and collected by a microphone and thereby measuring the response characteristic of the reproduction system including the sound field.

According to this aspect of the invention, in measuring a response characteristic, the measurement can be made with respect to the measuring signal imparted with or without the correction characteristic and, therefore, not only the response characteristic of the reproduction system before correction can be measured but the degree of correction of the response characteristic achieved by the correction (i.e., the effect of the correction) can also be known.

For achieving the above described second object of the invention, an acoustic characteristic correction device comprises measuring signal output means for outputting a measuring signal, response characteristic measuring means for obtaining information of a measured characteristic by inputting the output measuring signal which has been reproduced by a loudspeaker and collected by a microphone and thereby measuring a response characteristic of a reproduction system including a sound field, desired characteristic setting means for setting, on the basis of an operation by an operating person, a desired characteristic of the response characteristic in the reproduction system including the sound field, correction characteristic computing means for computing a correction characteristic of the response characteristic for realizing the desired characteristic on the basis of the desired characteristic and the measured characteristic, and correction characteristic imparting means for imparting the computed correction characteristic to a sound signal to be reproduced, said response characteristic measuring means comprising measured result storing means for storing results of measurement at plural points for plural measuring times with respect to the same measuring signal, and average characteristic computing means for computing an average value of the stored results of measurement to obtain the measured characteristic information.

According to this aspect of the invention, results of measurement at plural measuring points for plural measuring times are stored and an average value of the results of measurement is computed and a correction characteristic is obtained by using the average value as the measured characteristic and, therefore, correction by which a peak dip is not emphasized and an unnatural impression is not given in hearing can be achieved.

In one aspect of the invention, there is provided a device which has this structure and further comprises measured result selection means for selecting, for the computation of the average value, one of the results of measurement at plural points for plural measuring times stored in said measured result storing means which satisfies a predetermined condition or which has been selected by an operation by the operating person.

According to this aspect of the invention, a good result of measuring can be selected from among plural results of measurement and an average value can be computed on the basis of this selected result, so that an excellent correction characteristic can be obtained.

In another aspect of the invention, there is provided a device which has the above described structure and further comprises weighting means for performing a predetermined weighting or a weighting set by an operation of the operating person with respect to the results of measurement at plural points for plural measuring times for outputting the weighted results of measurement for the computation of the average value.

According to this aspect of the invention, weighting is made on results of measurement at plural points for plural measuring times and, therefore, necessary weighting can be made depending upon, for example, the degree of influence excerted by a measuring point (e.g., giving much weight to data at a measuring point which has a great degree of influence) and a proper correction characteristic thereby can be obtained.

For achieving the second object of the invention, there is also provided an acoustic characteristic correction device comprising, measuring signal output means for outputting a measuring signal, response characteristic measuring means for obtaining information of a measured characteristic by in putting the output measuring signal which has been reproduced by a loudspeaker and collected by a microphone and thereby measuring a response characteristic of a reproduction system including a sound field, desired characteristic setting means for setting, on the basis of an operation by an operating person, a desired characteristic of the response characteristic in the reproduction system including the sound field, correction characteristic computing means for computing a correction characteristic of the response characteristic for realizing the desired characteristic on the basis of the desired characteristic and the measured characteristic; and correction characteristic imparting means for imparting the computed correction characteristic to a sound signal to be reproduced, said response characteristic measuring means comprising, band average value computing means for computing an average value of result of measurement for each of frequency divided bands, and interpolation means for computing values between average values for the respective divided bands by interpolation by treating these average values computed for the respective divided bands substantially as values at center frequency of the respective divided bands and thereby obtaining the measured characteristic information.

According to this aspect of the invention, results of measurement of the response characteristic are divided into plural frequency bands an average value and for each divided band is computed. This average value is treated as a value at the center frequency of each band and values between the center frequencies are obtained by interpolation and used as the measured characteristic. Accordingly, occurrence of a large peak dip due to phase interference in the measured characteristic can be prevented, so that an unnatural impression in hearing caused by an excessive correction which occurs when a measured characteristic is directly used for providing a correction characteristic and correction is made on the basis of this covrection characteristic can be prevented.

In one aspect of the invention, there is provided a device which has the above described structure and wherein the respective divided bands are so divided that an end portion of each of the divided bands is overlapped with an end portion of an adjacent one of the divided bands.

According to this aspect of the invention, the band division is made while the adjacent bands overlap with each other and, therefore, connection between the bands in the measured characteristic is improved whereby an excellent correction characteristic can be obtained.

In another aspect of the invention, there is provided a device which has the above described structure and further comprises means for generating measuring signals which are divided in the frequency with a time lag to divide the frequency into bands.

In another aspect of the invention, there is also provided a device which has the above described structure and further comprises means for generating a time stretched pulse (TSP)

as the measuring signal and means for analyzing an impulse response collected by the microphone in frequency to divide result of analysis into bands.

According to these aspects of the invention, the band division is realized by dividing the measuring signal in frequency and generating the measuring signals with a time lag or by generating a time stretched pulse as the measuring signal and analyzing the impulse response which is a collected sound signal of the measuring signal in frequency and dividing the result of the analysis in frequency.

For achieving the second object of the invention, there is also provided an acoustic characteristic correction device comprising measuring signal output means for outputting a measuring signal, response characteristic measuring means for obtaining information of a measured characteristic by inputting the output measuring signal which has been reproduced by a loudspeaker and collected by a microphone and thereby measuring a response characteristic of a reproduction system including a sound field, desired characteristic setting means for setting, on the basis of an operation by an operating person, a desired characteristic of the response characteristic in the reproduction system including the sound field, correction characteristic computing means for computing a correction characteristic of the response characteristic for realizing the desired characteristic on the basis of the desired characteristic and the measured characteristic; and correction characteristic imparting means for imparting the computed correction characteristic to a sound signal to be reproduced, said correction characteristic imparting means comprising band correction value computing means for computing, as a correction value for each of frequency divided bands, correction information of the response characteristic for realizing the desired characteristic on the basis of a measured characteristic computed for each of the frequency divided bands and a desired characteristic set for each of the frequency divided bands, and interpolation means for computing values between the correction values for the respective divided bands by interpolation by treating these correction values computed for the respective divided bands substantially as values at center frequency of the respective divided bands and thereby obtaining the measured characteristic information.

According to this aspect of the invention, a correction value is computed for each divided band in the computation of a correction characteristic. Each correction value is treated as a value at the center frequency of each band and values between the center frequencies are obtained by interpolation and this characteristic is used as the correction characteristic. Occurrence of a large peak dip in the correction characteristic therefore is prevented and an unnatural impression in hearing due to an excessive correction is prevented. Further, since the measured characteristic and the desired characteristic can be obtained by data for each band, the amount of computation in a prestage can be reduced and, moreover, no significant deterioration in precision occurs in a finally obtained correction characteristic.

An acoustic characteristic correction device achieving the above described third object of the invention comprises measuring signal output means for outputting a time stretched pulse (TSP) signal as a measuring signal, inverse filter means for obtaining impulse response by inputting the output measuring signal which has been reproduced by a loudspeaker and collected by a microphone and performing time compression by a convolution operation with an inverse characteristic of the TSP signal, frequency conversion means for converting the obtained impulse response in frequency to obtain information of a measured characteristic of a reproduction system inlcuding a sound field, desired characteristic setting means for setting, on the basis of an operation by an operating person, a desired characteristic of the response characteristic in the reproduction system including the sound field, correction characteristic computing means for computing a correction characteristic of the response characteristic for realizing the desired characteristic on the basis of the desired characteristic and the measured characteristic, and correction characteristic imparting means for imparting the computed correction characteristic to a sound signal to be reproduced by a convolution operation, said correction characteristic imparting means performing the convolution operation by utilizing a convolution operator which is commonly used for the convolution operation by said inverse filter means.

According to this aspect of the invention, in measuring response characteristic by using a TSP signal as a measuring signal, a convolution operator which is used for time cmpression by the inverse filter characteristic during measuring is used commonly for imparting a correction characteristic and, therefore, the hardware structure of the device is simplified and the device can be made in a compact design.

In realizing the above measurement, the number of a convolution operator necessary for time compression by an inverse filter is generally larger than the number of stages necessary for imparting a correction characteristic and, accordingly, if the number of stages necessary for the time compression by the inverse filter is prepared, some of these stages will be left unused in imparting of the correction characteristic. Therefore, in one aspect of the invention, in the device having this structure. said convolution operator has the number of stages necessary for imparting the correction characteristic and has not the number of stages necessary for the time compression by said inverse filter characteristic and performs the time compression on timewise divided basis.

An acoustic characteristic correction device achieving the fourth object of the invention comprises desired characteristic setting means for setting, on the basis of an operation by an operating person, a desired characteristic of a response characteristic in a reproduction system including a sound field, measured characteristic output means for outputting information of a measured characteristic of the response characteristic of the reproduction system including the sound field, correction characteristic computing means for computing a correction characteristic for realizing the desired characteristic on the basis of the desired characteristic and the measured characteristic, and correction characteristic imparting means for imparting the computed correction characteristic to a sound signal to be reproduced, said correction characteristic imparting means comprising, filter coefficient completing means for computing, as filter coefficients for a convolution operation corresponding said correction characteristic, filter coefficients of a filter characteristic selected from among a plurality of filter characteristics including at least a linear phase filter according to which the entire range of the reproduction system becomes a linear phase characteristic and a minimum phase filter according to which the entire range of the reproduction system becomes a characteristic having no delay, and a convolution operator for i mparting said correction characteristic corresponding to the filter characteristic by performing a convolution operation using the filter coefficients of the selected filter characteristic with respect to the sound signal to be reproduced.

The linear phase filter and the minimum phase filter have the following benefits and defects:

|  | Transmission characteristic | Amount of delay | Easiness of computing filter co-efficients |
| --- | --- | --- | --- |
| Linear phase | good | large | easy |
| Minimum phase filter | normal | small | normal |

According to this comparison, the linear phase filter has a good transmission characteristic and is easy for computing filter coefficients but is amount of delay is too large and, therefore, is not usable in a case where real time transmission is required as in pulic address and mixing down (because there is delay between a live sound and an equalized sound). The minimum phase filter is inferior to the linear phase filter in the transmission characteristic and easiness in computation of filter coefficients but has little delay and, therefore, it is suited for a case where real time transmission is required. Accordingly, the operating person can select one of the algorithms depending upon application of the device, so that a single device can be used for various purposes.

In one aspect of the invention, in the device having the this structure, said filter coefficient computing means further has, as a selectable filter characteristic, a complex phase filter characteristic according to which a low frequency region in the reproduction system becomes a minimum phase characteristic, a high frequency region becomes a linear phase characteristic, and an intermediate frequency region becomes a characteristic which changes from the minimum phase characteristic to the linear phase characteristic.

According to this aspect of the invention, the following characteristics can be obtained:

|  | Transmission characteristic | Amount of delay | Easiness of computing filter co-efficients |
| --- | --- | --- | --- |
| Complex phase filter | normal | good (small) | normal |

This filter enables, even in a case where real time transmission is required, the transmission characteristic to approach the linear phase while restraining the amount of delay to a degree at which no problem will be caused in practical use.

An acoustic characteristic correction device for achieving the fifth object of the invention comprises desired characteristic setting means for setting, on the basis of an operation by an operating person, a desired characteristic of a response characteristic in a reproduction system including a sound field, measured characteristic output means for outputting information of a measured characteristic of the response characteristic of the reproduction system including the sound field, correction characteristic computing means for computing a correction characteristic for realizing the desired characteristic on the basis of the desired characteristic and the measured characteristic, correction characteristic level control means for controlling at least either an upper limit value or a lower limit value of the level of the computed correction characteristic, and correction characteristic imparting means for imparting the computed correction characteristic which has been controlled in the level to a sound signal to be reproduced.

According to this aspect of the invention, at least either an upper limit value or a lower limit value of the correction characteristic is controlled and, therefore, occurrence of an improper characteristic due to an excessive correction can be prevented.

For achieving the fifth object of the invention, there is also provided an acoustic characteristic correction device comprising desired characteristic setting means for setting, on the basis of an operation by an operating person, a desired characteristic of a response characteristic in a reproduction system including a sound field, measured characteristic output means for outputting information of a measured characteristic of the response characteristic of the reproduction system including the sound field, correction characteristic computing means for computing a correction characteristic for realizing the desired characteristic on the basis of the desired characteristic and the measured characteristic, correction characteristic frequency control means for controlling at least either an upper limit value or a lower limit value of the frequency range of the computed correction characteristic, and correction characteristic imparting means for imparting the computed correction characteristic which has been controlled in the frequency range to a sound signal to be reproduced.

According to this aspect of the invention, at least either an upper limit value or a lower limit value of the frequency of the correction characteristic is controlled and, therefore, occurrence of an improper characteristic due to a forced and undue correction can be prevented.

An acoustic characteristic correction device for achieving the sixth object of the invention comprises desired characteristic setting means for setting, on the basis of an operation by an operating person, a desired characteristic of a response characteristic in a reproduction system including a sound field, measured characteristic output means for outputting information of a measured characteristic of the response characteristic of the reproduction system including the sound field, correction characteristic computing means for computing a correction characteristic for realizing the desired characteristic on the basis of the desired characteristic and the measured characteristic, correction characteristic imparting means for imparting the computed correction characteristic to a sound signal to be reproduced, reverberation time frequency characteristic/average sound absorption rate frequency characteristic output means for outputting information of a reverberation time frequency characteristic or an average sound absorption rate frequency characteristic of said sound field, and character compensation means for imparting, on the basis of the information of the reverberation time frequency characteristic or the average sound absorption rate frequency characteristic, a compensation characteristic to the correction characteristic so as to relatively increase the level of the correction characteristic with respect to frequency for which the reverberation time is long of for which the average sound absorption rate is low.

According to this aspect of the invention, compensation of the correction characteristic is made on the basis of a reverberation time frequency characteristic or an average sound absorption rate frequency characteristic of a sound field to be reproduced and, therefore, a characteristic in hearing can conform to a desired characteristic.

Preferred Embodiments of the invention will be described below with reference to the accompanying drawings.

BRIEF DESCRIPTION OF THE DRAWINGS

In the accompanying drawings,

FIGS. 6A to 6E are graphs showing characteristics in the processing of FIG. 4;

FIGS. 20A to 20D are graphs showing actually measured values of a measured characteristic, correction characteristic and correction effect;

DESCRIPTION OF PREFERRED EMBODIMENTS

Figure 2:
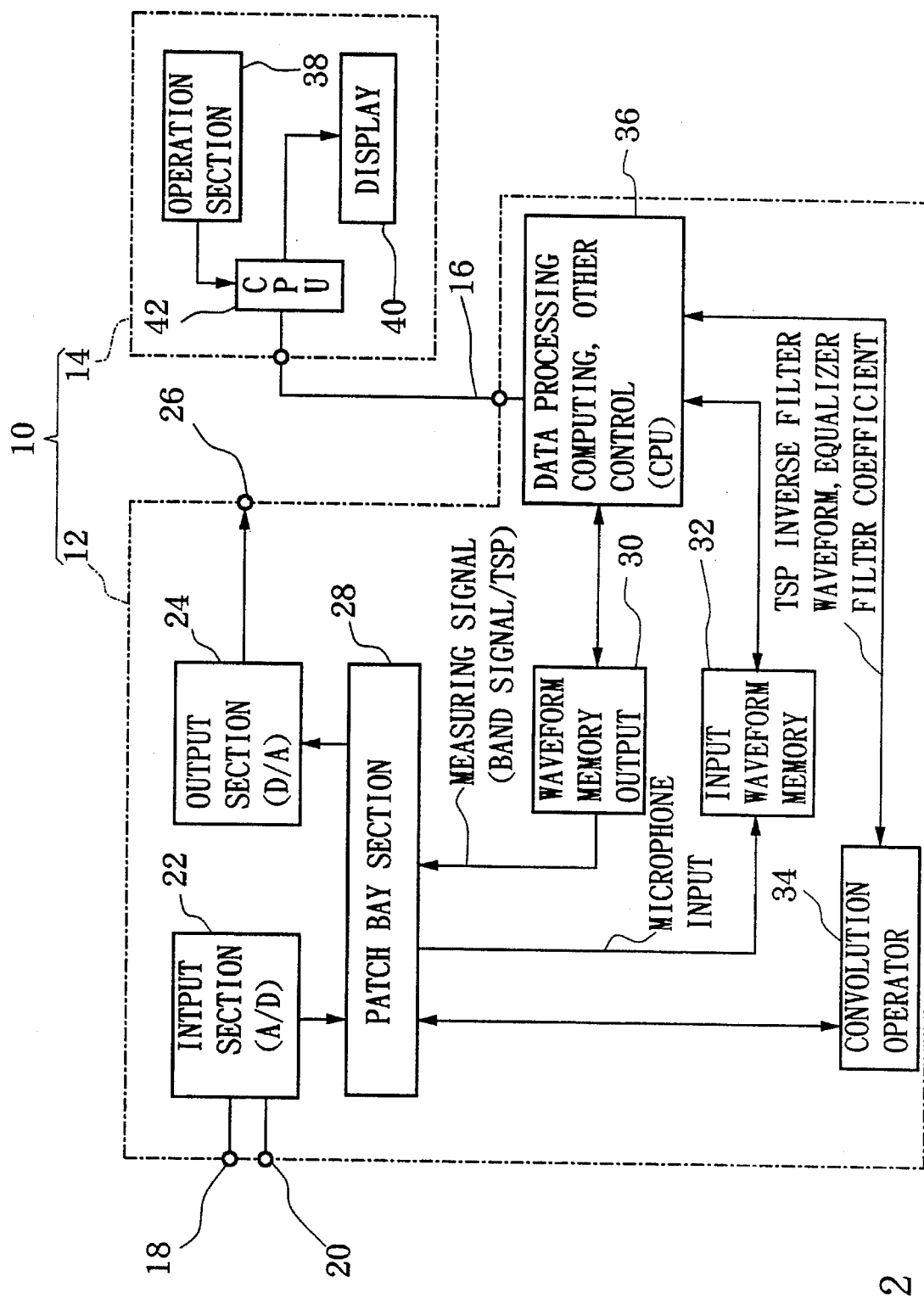
FIG. 2 is a block diagram showing a hardware structure of the acoustic characteristic correction device 10.

An embodiment of the invention will now be described. In this embodiment, the invention is applied to an acoustic characteristic correction device having a response characteristic measuring function. FIG. 2 schematically shows an entire hardware structure of the the device. An acoustic characteristic correction device 10 is composed of a main unit 12 and a remote control unit 14 which two units are connected to each other with a detachable signal cable 16.

The main unit 12 performs, in a response characteristic measuring mode, various operations including generation of a measuring signal, a frequency characteristic computation on the basis of a singal collected by a microphone, a correction characteristic computation and computation of an FIR filter coefficient corresponding to the correction characteristic. The main unit 12 performs, when it is used as an equalizer after measuring the response characteristic, correction of the response characteristic by imparting a set FIR filter characteristic to a sound signal to be reproduced. The remote control section 14 instructs various operations during measuring and a desired characteristic setting to the main unit 12 and also performs display of various response characteristics (measuring characteristic, desire characteristic, correction characteristic etc.).

In the main unit 12, to a microphone input terminal 18 is connected a measuring microphone during measurement of a response characteristic to receive a sound signal collected by the microphone. To a source input terminal 20 is connected a source device such as a CD player to receive a source signal reproduced by the source device when this device is used as an equalizer. An input section 22 converts the analog microphone input signal and the analog source input signal to digital signals. An output section 24 converts an equalizer processed source signal and a measuring signal (test tone signal) to analog signals and outputs them from an output terminal 26. A patch bay section 28 changes connections of signal lines of input and output signals and other signals between the measuring mode and the equalizer mode. A waveform memory output section 30 reads out and outputs measuring signal waveforms (a band signal waveform and TSP (time stretched pulse) waveform) and TSP inverted filter waveform stored in a ROM (read-only memory).

An input waveform memory section 32 stores the ananlog-to-digital converted mi crophone input in a RAM. A convolution operator 34 is made of a real time convolution circuit (e.g., a convolution circuit of several thousand stages constructed by cascade connecting LSIYM 7309 manufactured by Yamaha Corporation). In the equalizer mode, an equalizer of an FIR filter is constructed by supplying filter coefficients of the equalizer to this convolution operator 34. In the measuring mode in which the TSP signal is used as a measuring signal, a TSP inverted filter is constructed by supplying TSP inverted filter coefficients to the convolution operator 34. A data processing computation and other control section 36 is made of a CPU (central processing unit) and performs processing of measured data including computation of measured characteristic, desired characteristic and correction characteristic and computation of the equalizer filter coefficients corresponding to the correction characteristic (Fourier inverse transform), switching of connections in the patch bay section 28 and other necessary controls in the main unit 12 and exchange of signals with a CPU 42 in the remote control unit 14.

In the remote control unit 14. an operation section 38 performs all instructions necessary to the main unit 12 during measuring, setting of a desired characteristic and setting of a correction characteristic. The CPU performs exchange of data with the CPU 36 of the main unit 12.

Figure 3:
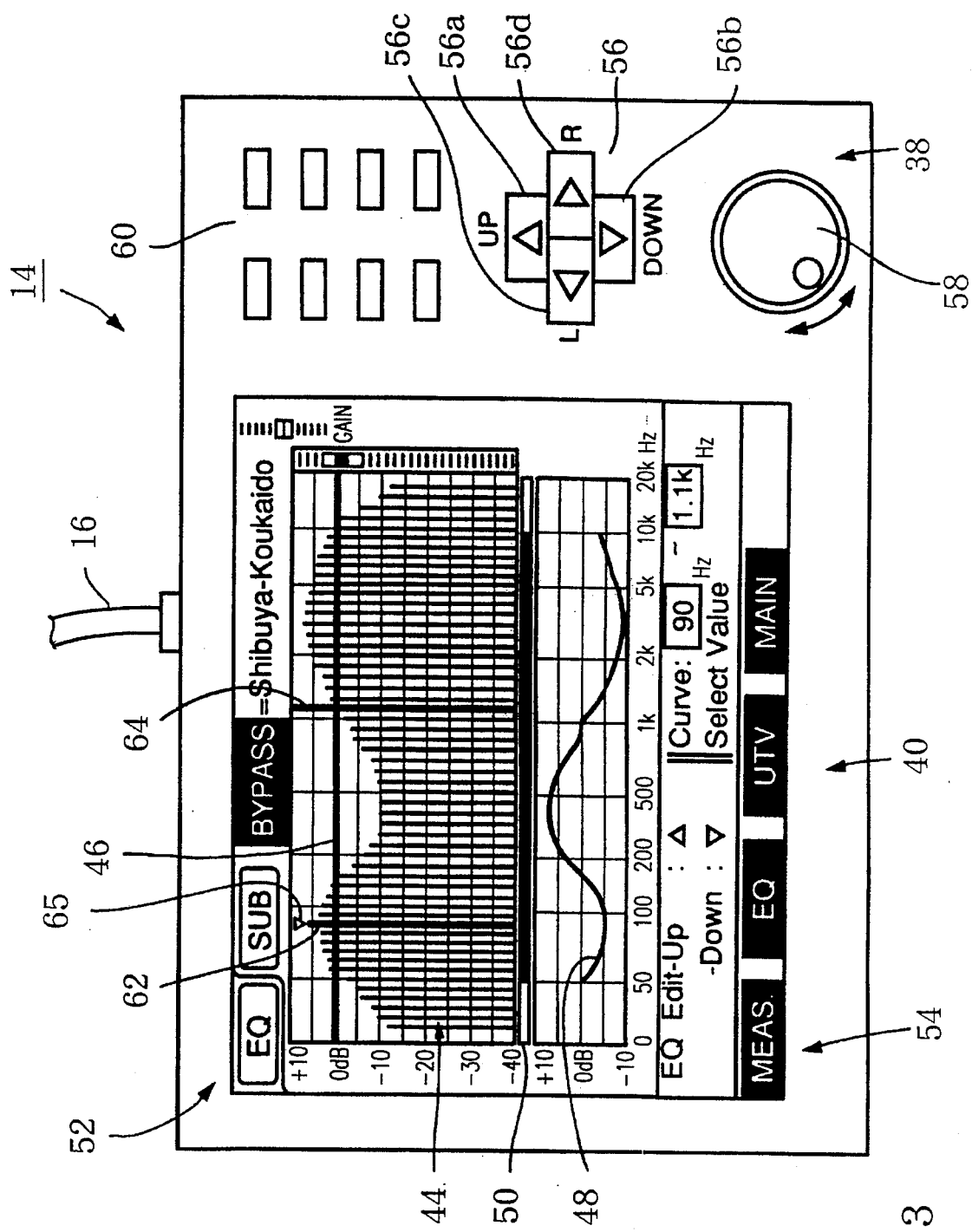
FIG. 3 is a view showing the outside of a panel structure of remote control unit 14 of FIG. 2.

An example of a panel of the remote control unit 14 is shown in FIG. 3. A display section 40 is constructed of an LCD dispily or the like device and displays response characteristic graphically. In an upper graph display section of the display section 40, a measured characteristic is indicated with a bar graph 44 and a desired characteristic (a flat characteristic in this example) with a line graph, one superposed upon the other, on common graph axes in which the horizontal axis represents frequency and the vertical axis represents level. Cursors 62 and 64 indicating the frequence range are displayed with vertical lines. In a lower graph display section of the display section 40, a correction characteristic which is computed as a difference between the desired characteristic and the measured characteristic is displayed with a line graph 48. A correction frequency range set by an operation by an operating person is displayed with a horizontal bar graph 50 between the upper and lower display sections. In this ease, the correction characteristic display 48 is not made (or displayed flatly with a 0 dB line) in frequency regions outside ofthe correction frequency range. Display sections 52 and 54 are provided above and below the graph display sections for displaying currently set items and set contents.

The operation section 38 inleudes cursor keys 56, a shuttle key (rotary encoder) 58 and key switches 60. The cursor keys 56 are composed of an up key 56a, a down key 56b, a left cursor selection key 56c and a right cursor selection key 56d. The left and right cursor selection keys 56c and 56d are used for either one of the left and right cursors 62 and 64 in the display section 40 when, for example, a desired characteristic is corrected or a correction frequency range is set. By depressing the left cursor selection key 56c and turning the shuttle key 58, the left cursor 52 is moved to set a lower limit value of the frequency range. By depressing the right cursor selection key 56d and turning the shuttle key 58, the right cursor 64 is moved to set an upper limit value of the frequency range. An inverted triangle mark 65, for example, is displayed at a position of the selected one of the cursors 62 and 64 and which one of the cursors 62 and 64 is selected thereby is indicated. The up and down keys 56a and 56b are used, for example, for correcting a desired characteristic. By depvessing the up key 56a with respect to a des ignated frequency range, the level of the desired characteristic is gradually increased in a curve. By depressing the dwon key 56b, the level of the desired characteristic is gradually decreased in a curve. The key switches 60 are used for various designations including selection of a set item, selection of measured data and execution of an operation.

Figure 4:
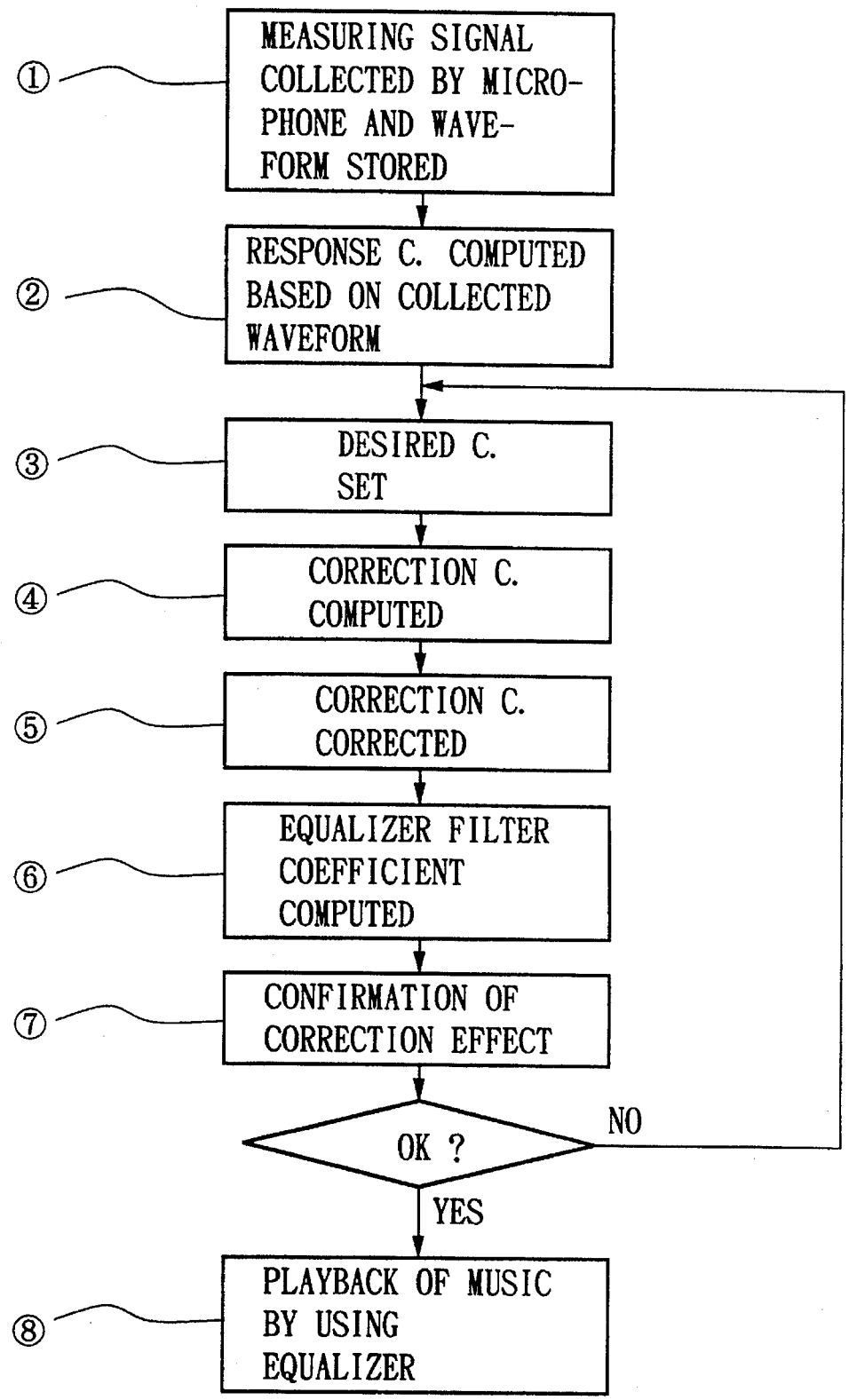
FIG. 4 is a flow chart showing an outline of processing from measurement of a characteristic by the acoustic characteristic correction device of FIG. 1 to use of the same device as an equalizer.

An outline of processings from measurement of a frequency characteristic by using the acoustic characteristic correction device 10 of FIG. 2 to using of the same device 10 as an equalizer is shown in FIG. 4. Each processing is sequentially carried out on the basis of a mode progressing operation by the operating person (for example, the processing proceeds to a next one each time a single key is depressed). An outline of each processing will be described below.

(1) Test

Figure 5A:
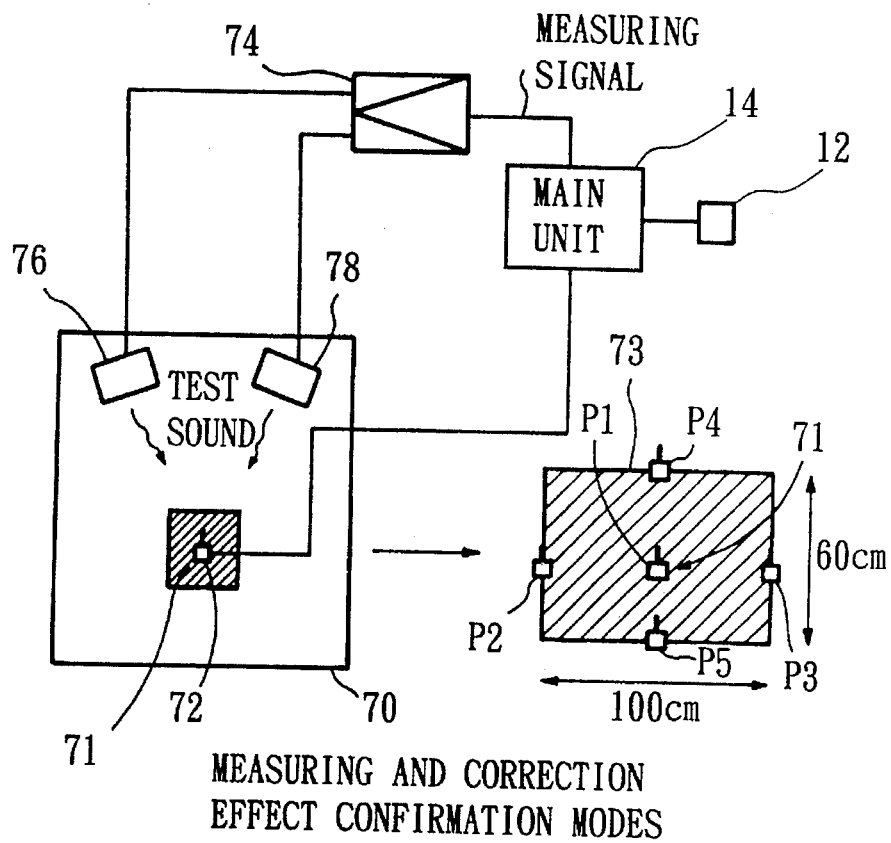
FIG. 5A is a view showing a state of connection of the device and location of a microphone when the acoustic characteristic correction device of FIGS. 1A and 1B is used for measuring an acoustic characteristic.

As shown in FIG. 5A, a microphone 72 is disposed at a listening position 71 in a room 70 where music is played back. A measuring signal is generated by the device 10 and reproduced from reproducing loudspeakers 76 and 78 through a power amplifier 74. The measuring signal is collected by the microphone 72 and the waveform of the collected signal is stored in a memory in the device 10. If necessary, this measurement is made by moving, as shown in the lower right cursor of FIG. 5A, the microphone 72 to several points (e.g., 5) about the listening point 71.

(2) Computation of a measured characteristic

Figure 6A:
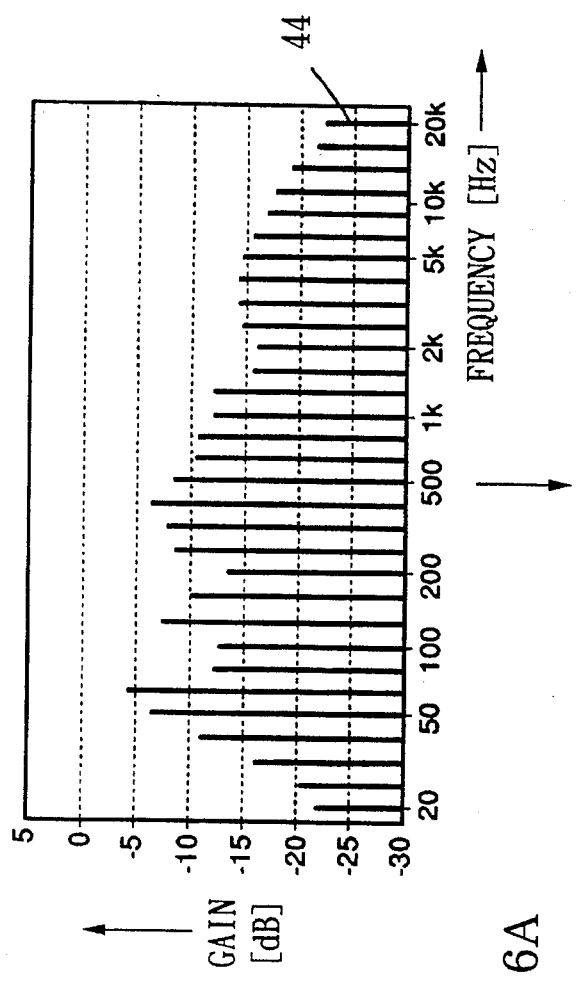

A response characteristic is computed on the basis of a collected sound signal stored in the memory. An obtain ed response characteristic (i.e., measured characteristic) is diplayed, for example, by a bar graph as shown in FIG. 6A in the display section 40 of the remote control unit 14.

(3) Setting of a desired characteristic

Figure 6B:
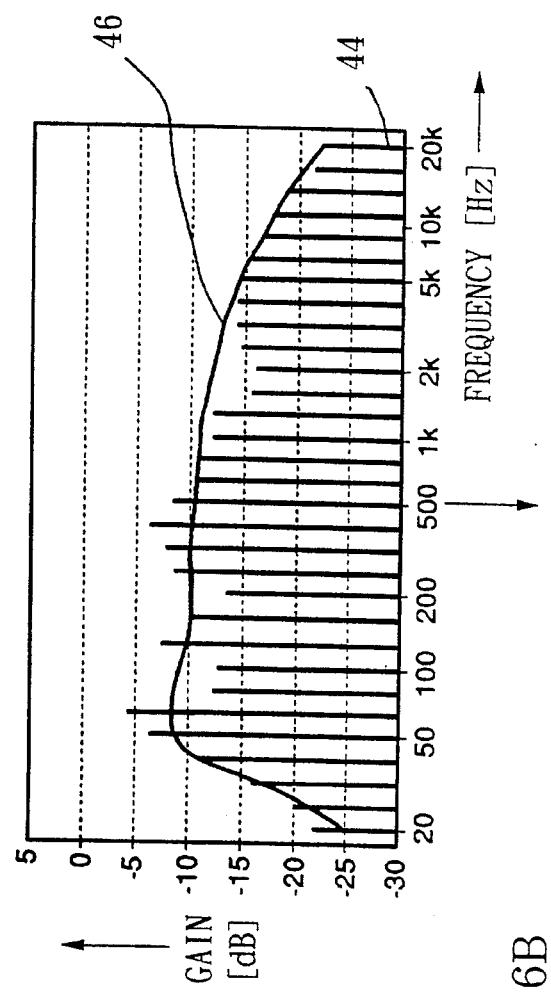

A desired characteristic is set by operating the operation section 38 while watching the display section 40. A selected or set characteristic is displayed, as shown in FIG. 6B, with a line graph 46 in a state superposed on the measured characteristic representation 44 on the same graph axes in the display section 40. In a case where a desired characteristic is set in a form which is obtained by smoothing and thereby flattening the measured characteristic 44 as shown in FIG. 6B, the superposed display of the two characteristics on the same graph axes is convenient because how the desired characteristic can be obtained is understood at a glance on the superposed display and, therefore, setting is greatly facilitated.

(4) Upon setting of the desired characteristic, the correction characteristic is computed automatically as a difference between the desired characteristic and the measured characteristic and is displayed by a line graph 50 in the display section 40 as shown in FIG. 6C. When correction of the desired characteristic is made, the correction characteristic is also computed and displayed.

(5) Correction of the correction characteristic

Since unnaturalness in hearing occurs if the peak in the correction characteristic is large, the upper and lower limit values in the level of the correction characteristic is controlled when necessary. When there is restriction in the range of correction due to the limitation in the reproduced frequency characteristic of loudpeakers employed, the correction frequency range is controlled if necessary (i.e., the amount of correction in frequency regions outside of the correction frequency range is made 0 dB).

(6) Computation of equalizer filter coefficients

Upon determination of the correction characteristic, a corresponding impulse response is obtained by subjecting the correction characteristic to Fourier inverse transform. In this case, a suitable one of linear phase Fourier inverse transform, minimum phase Fourier inverse transform and Fourier inverse transforms of other algorithm is selectively used. As a result, the impulse response as shown in FIG. 6D or FIG. 6E is determined. Equalizer (FIR) filter coefficients are given as level values at respective positions on the time base of this impulse response. In this manner, the equalizer characteristic over the entire frequency range is determined.

(7) Confirmation of the correction effect

Confirmation of the correction effect is made when necessary. For this purpose, an equalizer is constructed by setting the obtained equalizer filter coefficients in the convolution operator 34, the measuring signal is imparted with the correction characteristic by this equalizer and reproduced from the loudspeakers to measure the response characteristic again, and the measured characteristic and the desired characteristic are displayed in a superposed state in the display section 40 and the correction effect is thereby confirmed. The larger the degree to which two characteristic agree with each other, the more satisfactory is the correction for obtaining the desired characteristic. In a case where a state of correction as expected is not obtained due to the limitation in the loudspeaker characteristic or other reason, re-correction of the desired characteristic is made if necessary.

(8) Playback of music

Figure 5B:
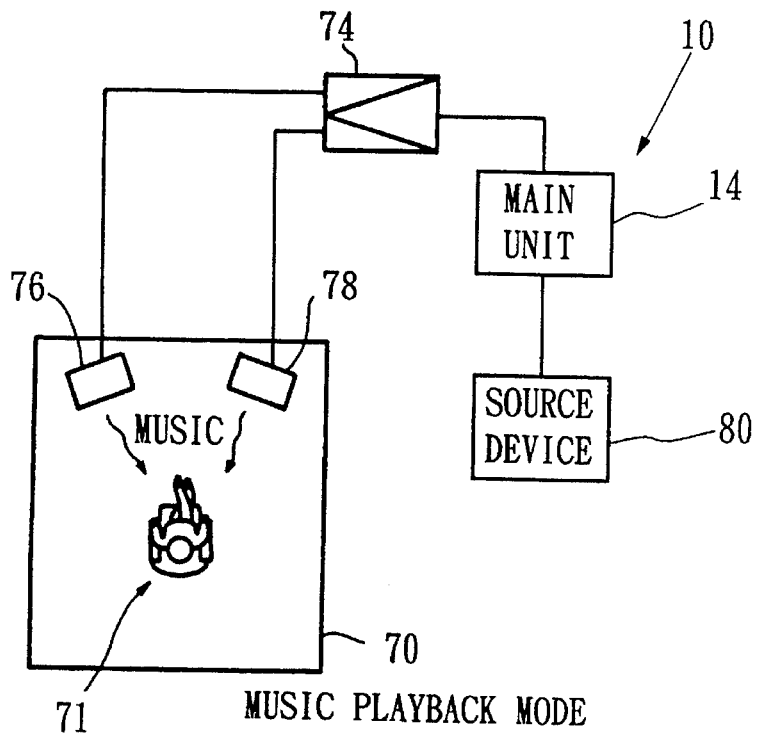
FIG. 5B is a view showing a state of connection of the device when the device is used as an equalizer for playback of music.

When the equalizer filter characteristic has finally been determined, the source device 80 such as a CD player is connected as shown in FIG. 5B and the main unit 12 of the device 10 is utilized as an equalizer for performing music playback which is the ultimate object of the device 10.

Figure 1A:
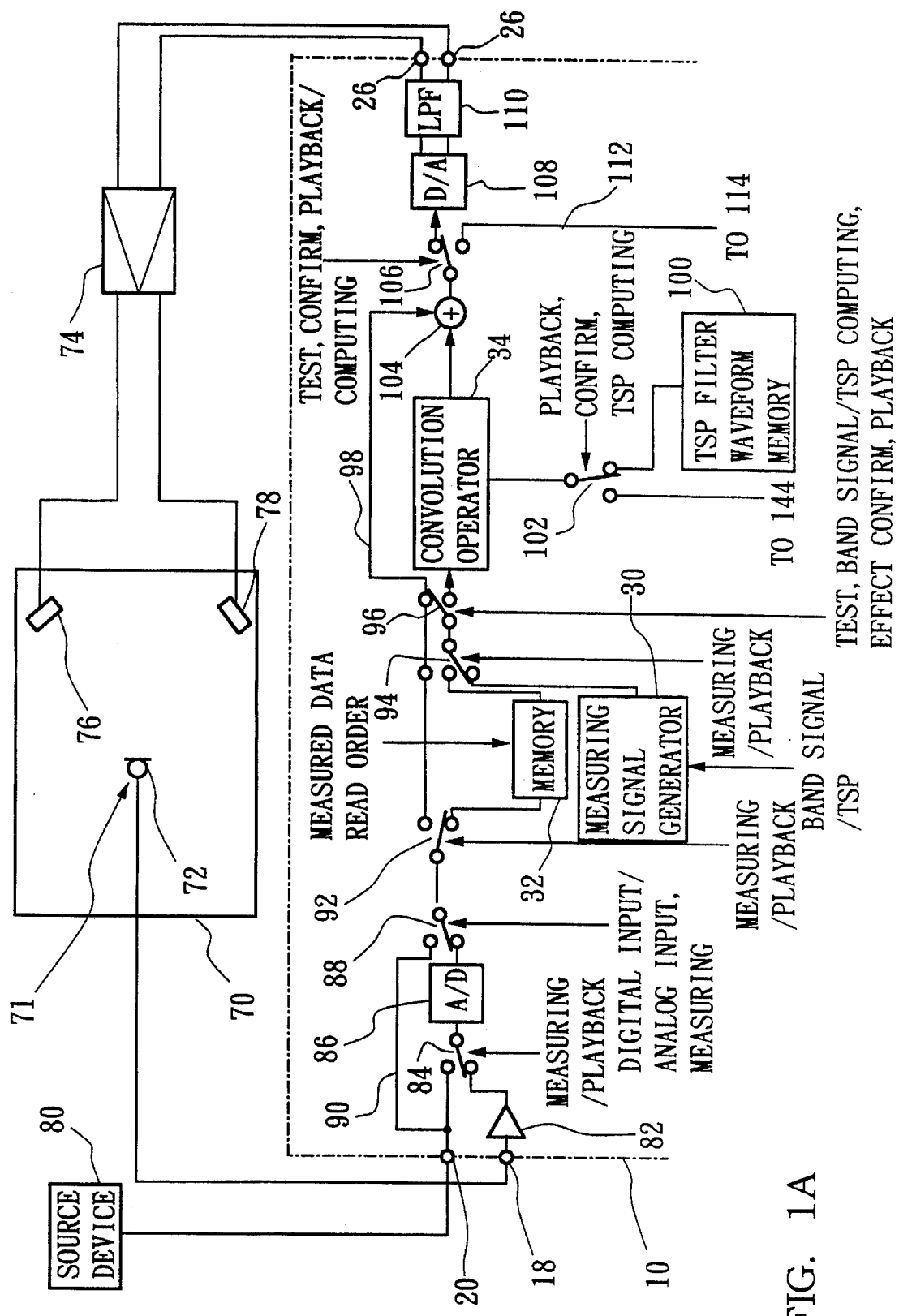
FIGS. 1A and 1B are block diagrams showing an embodiment of the invention and show a controlling structure of the acoustic characteristic correction device of FIG. 2.
Figure 1B:
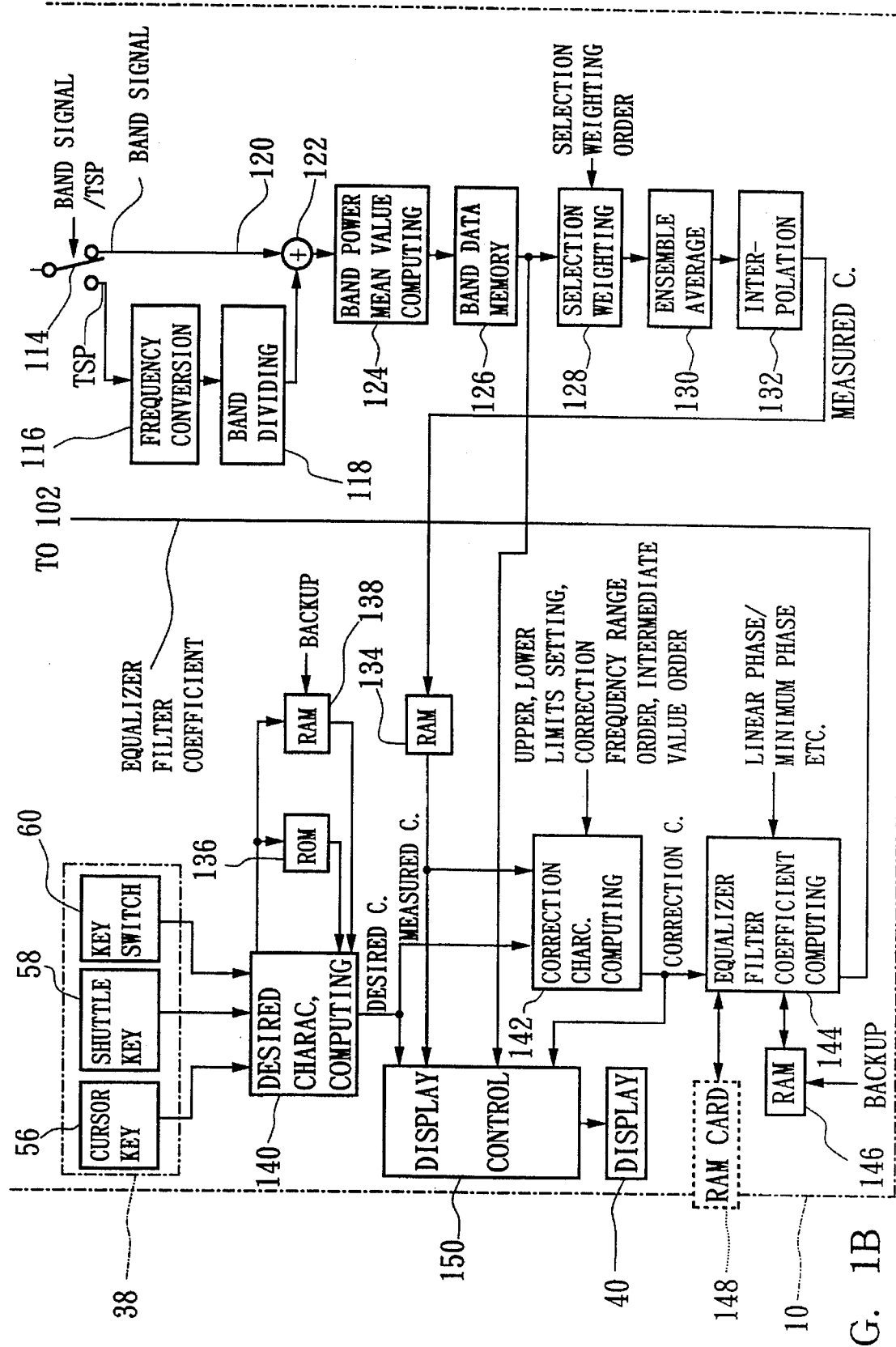

A control block structure in the acoustic characteristic correction device 10 for realizing the above described processings in order is shown in FIGS. 1A and 1B. FIGS. 1A and 1B show a state of connection in the measuring mode. To a microphone input terminal 18 is connected a measuring microphone 72 and to a source input terminal 20 is connected a source device 80. A measuring signal applied to the microphone input terminal 18 is amplified by a microphone amplifier 82. A switch 84 is switched between the measuring mode (the above described processings (1) to (7)) and the reproduction mode (the processing of (8)). An analog-to-digital converter 86 converts a microphone input or analog source input to a digital signal. A switch 88 is provided for passing the digital source input to a bypass route 90 and is swithced between a digital source input and reproduction mode and other modes (an analog input reproduction mode and the measuring mode). A switch 92 is switched between the measuring mode and the reproduction mode. A waveform memory 32 is provided for storing the microphone input during the test. A measuring signal generator 30 is constructed of a ROM storing waveforms of measuring signals. In this embodiment, a band signal according to the band signal method (to be described later) and a TSP signal according to the TSP method (to be described later) are stored and either one of them is read out by a selective operation by the operating person.

A switch 94 is switched among the reproduction mode, the responce characteristic computation mode and the test mode. A switch 96 is provided for switching between a route passing the convolution operator 34 and a route 98 bypassing this route. The switch 96 selects the bypass route 98 during the test and computation of the response characteristic according to the band signal method and selects the route passing through the convolution operator 34 during computation of the response characteristic according to the TSP method, confirmation of the correction effect and playback of music. The convolution operator 34 changes its use by switching of a switch 102. When the response characteristic according to the TSP method is computed, the TSP inverted filter waveform read from a TSP inverted filter waveform memory 100 is set as filter coefficients and the convolution operator 34 performs, as a TSP inverted filter, compression of the collected TSP signal in time to obtain impulse response. During confirmation of the correction effect or playback of music, equalizer filter coefficients corresponding to the correction characteristic obtained by the computation are set as filter coefficients and the convolution operator 34 operates as an equalizer. Thus, since the convolution operator 34 is used as the inverted filter in the TSP method during the response characteristic computation and also as the equalizer during the correction effect and confirmation and playback of music, hardware structure of the device can be simplified. The use of the convolution operator 34 for the dual purposes will not cause any problem because the response characteristic computation and the confirmation of the correction effect and playback of music are not simultaneously performed.

The output of the convolution operator 34 or an output which has passed through the bypass route 98 is applied to a switch 106 through an addition point 104. The switch 106 is switched between a state in the test mode, correction effect confirmation mode or music playback mode and a state in the response characteristic computation mode. During the test, confirmation of the correction effect or playback of music, a measuring signal or music signal passing through the switch 106 is converted to an analog signal by a digital-to-analog converter 108 and a low-pass filter 110 and is delivered from the output terminal 26. The output signal from the loudspeaker 76 and 78 in the room 70 through the power amplifier 74.

A signal led from the switch 106 to a line 112 during the response characteristic computation is distributed by a switch 114 according to the manner of measurement. In the case of the TSP method, the impulse response signal is converted to frequency information by Fourier transform effected by a frequency conversion circuit 116 and thereafter is divided into predetermined frequency bands (e.g., ⅓ octave band) by a band division circuit 118. In the case of the band signal method, since measured data is divided in predetermined frequency bands (e.g., ⅓ octave band) by a band, the measured data is passed directly to a bypass route 120. The signal passing through either of the routes passes through an addition point 122 and supplied to a band power operation computing circuit 124 in which power mean value for each divided band is computed. Obtained band power data for all frequency range is stored in a band data memory 126. The dband data memory 126 can store measured data at plural measuring points and for several measuring times (e.g., eight times). Measured data for each measuring time is displayed with a bar graph on the basis of a display selection operation by the operating person (measured characteristic display 44 in FIG. 3).

A selection and weighting circuit 128 selectively outputs measured data from among measured data of plural measuring points and plural measuring times stored in the band data memory 126 which has been designated by the operating person or which satisfies a predetermined condition (e.g., one in which an extreme peak dip does not occur). Further, the circuit 128 weights, if necessary, measured data in accordance with positions of the measuring points P1 to P5 (FIG. 5A) with respect to the listening point 71. An ensemble averaging circuit 130 computes an ensemble average of plural selected and weighted measured data. An interpolation circuit 132 treats the ensemble averaged value for each band as the value at the center frequency in each band and interpolates the center frequencies of the respective bands and thereby provides a characteristic obtained by connecting the entire frequency range with a continuous and smooth curve. The interpolated data thus obtained is stored as a final measured characteristic in the RAM 134.

The ROM 136 stores, as desired characteristics, an averaged characteristic and some other characteristics. One of the characteristics selected by the key switch 60 is read from ROM 1346. The selected desired characteristic is corrected to a desired characteristic by the comuting circuit 140 on the basis of operation of the cursor key 56 and shuttle key 58 by the operating person. The corrected desired characteristic is stored in a RAM 138 having a backup power source and can be read out and used when necessary just as the characteristic stored in the ROM 136.

The computing circuit 142 computes a correction characteristic on the basis of a desired characteristic and a measured characteristic. Corrections such as restriction on the upper and lower limit values in the correction level and restriction on the corrected frequency range are made, when necessary, on the basis of an operation by the operating person.

A reverberation time frequency characteristic/average sound absorption rate frequency characteristic output circuit 143 outputs information of a reverberation time frequency characteristic or an average sound absorption rate frequency characteristic. This circuit 143 may be constructed as a reverberation time frequency characteristic measuring device of an average sound absorption rate frequency characteristic measuring device incorporated in the acoustic characteristic correction device 10. In case such device is not incorporated in the device 10, the circuit 143 may be constructed as a device for inputting information of a reverberation time frequency characteristic measured by an outside reverberation time frequency characteristic measuring device or information of an average sound absorption rate frequency characteristic measured by an outside average sound absorption rate frequency characteristic measuring device (e.g., an input terminal connected to such outside measuring device and inputting a result of measurement or a RAM card storing result of measurement).

A characteristic compensation circuit 145 imparts, on the basis of the information of the reverberation time frequency characteristic or the average sound absorption rate frequency characteristic, a compensation characteristic to the correction characteristic so as to relatively increase the level of the correction characteristic with respect to a frequency for which the reverberation time is long or the average sound absorption rate is low and thereby causes a characteristic in hearing after the correction to conform to the set desired characteristic.

An equalizer filter coefficient computing circuit 144 computes equalizer filter coefficients corresponding to the set correction characteristic. The computed filter coefficients are set in the convolution operator 34 whereby the equalzier characteristic during playback of music and confirmation of the correction effect is established. The computed filter coefficients are also stored in a RAM 146 having a backup power source and can be read out and used when necessary. The computed filter coefficients are also stored in a RAM card 148. By inserting this RAM card in another acoustic characteristic correction device, the filter coefficients can be used commonly for the other device.

A display control circuit 150 performs controls for displaying the computed measured characteristic, desired characteristic and correction characteristic in the display section 40 of the remote control unit 14. Various computation other than the switching control of the switches and computation by the convolution operator 34 is made by the CPU 36 in the main unit 12 (FIG. 2).

Controls of processings of FIG. 4 by the control circuits in FIG. 1 will be described more fully below.

(1) Test

By measuring response characteristic in a room, it is found that there is a significant difference in the characteristic depending upon the position where the measurement is made. This is because reflected waves from the ceiling, floor and walls of the room interfere with one another and thereby changes the frequency characteristic. This phenomenon becomes remarkable notwithstanding that there is not much difference in the measured position as the wavelength becomes shorter and the frequency becomes higher. Accordingly, if a correction characteristic is obtained on the basis data at a single measuring point and filter coefficients of the equalizer are computed on the basis of this correction characteristic, the best result will be available at this point but, in an area in the vicinity of this point (e.g., a range within which the listener's head moves), an extreme peak dip sometimes occurs and therefore the best result is not always available.

For this reason, in the present embodiment, as shown in the lower right corner of FIG. 5A, a measuring area 73 is set in the room 70 centering about the listening oint 71 and measuring points P1 to P5 including the listening point 71 are determined in this area 73. The microphone 72 is moved along these measuring points P1 to P5 for carrying out the measurement and the correction characteristic is computed from spatial average of these measuring points. Accordingly, an excellent correction characteristic on an average can be obtained at any position in the area 73 so that an area in which the correction is effective can be enlarged.

According to this embodiment, as described above, either the band signal method of the TSP method is selected by the operation by the operating person. The TSP method is advantageous in that the measuring time is relatively short and that continuous measured data, and not discrete measured data for each divied area, can be obtained. Since, however, the convolution operator 34 for the equalizer is used also as the TSP inverse filter used in carrying out the TSP method, there is limit in the length of the measuring TSP signal and, as a result, there is limit in the power of the measuring TSP signal. If, therefore, the TSP method is used for measurement in an environment in which much noise occurs, the signal-to-noise ratio of results of measurement will be deteriorate.

For this reason, the two methods should preferably be selectively used in such a manner that, in a case where there is much noise or where there is no particular restriction on the measuring time, the band signal method is used whereas, in a case where there is not much noise or where the measuring time is limited (e.g., in a hall where there are many reproduction systems (i.e., loudspeakers) so that it will take much time for measurement if the band signal method is employed), the TSP method is used.

The test methods using the band signal methods and the TSP method will be respectively described below.

(a) The band signal method

Figure 7A:
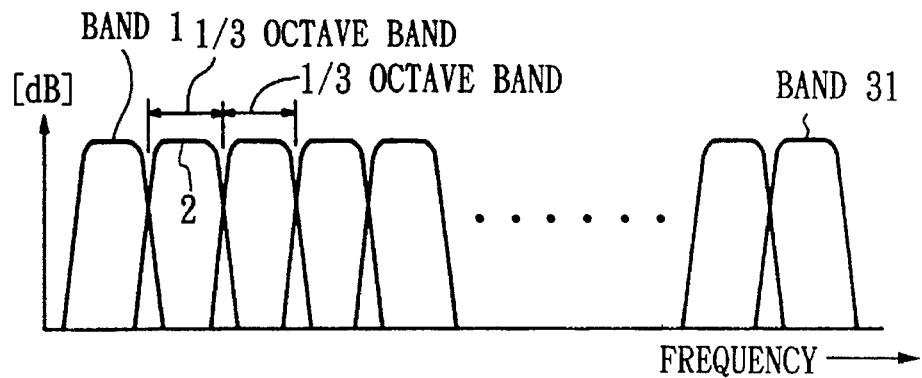
FIGS. 7A and 7B are graphs showing states of band division during measurement.
Figure 7B:
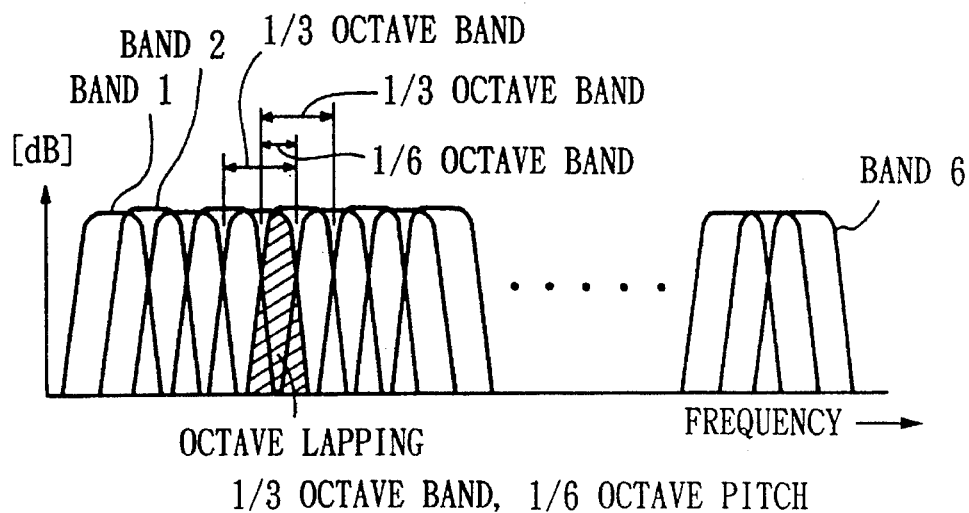

The band signal method is a method according to which band signals obtained by dividing a frequency range are sequentially provided with a time lag and response to each band is measured. In this embodiment, the band width of each band is determined by the ⅓ octave band method (i.e., a manner of dividing the frequency range so that each divided band will have a band width of ⅓ octave) which is said to be relatively close to the hearing characteristic. In this case, continuous data with a high resolution of division can be obtained if a fine pitch of the division is used but this will require a tremendously long time for providing band signals of the entire frequency range. For this reason, in the present embodiment, the pitch of division is set to either ⅓ octave pitch shown in FIG.7A or ⅙ octave pitch shown in FIG. 7B for measurement and measured data is interpolated to provide continuous data. When the pitch of division is set to the ⅓ octave pitch, there is no overlapping in the band width. When the pitch of division is set to the ⅙ octave pitch, the band width is shifted while overlapping by ⅓ octave. By overlapping, connection between the bands in the measured data is improved.

Figure 8A:
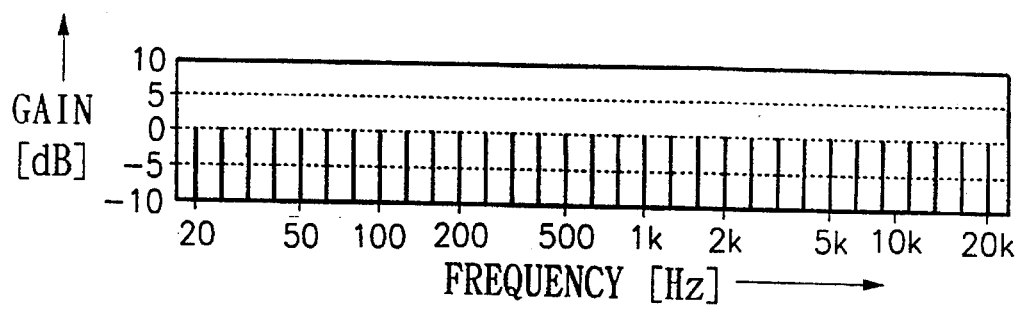
FIGS. 8A to 8C are graphs showing a band signal used for the band signal method.
Figure 8B:
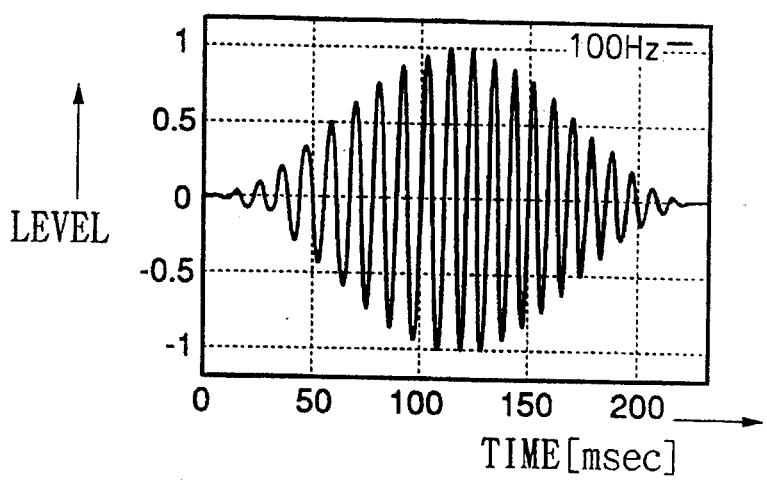
Figure 8C:
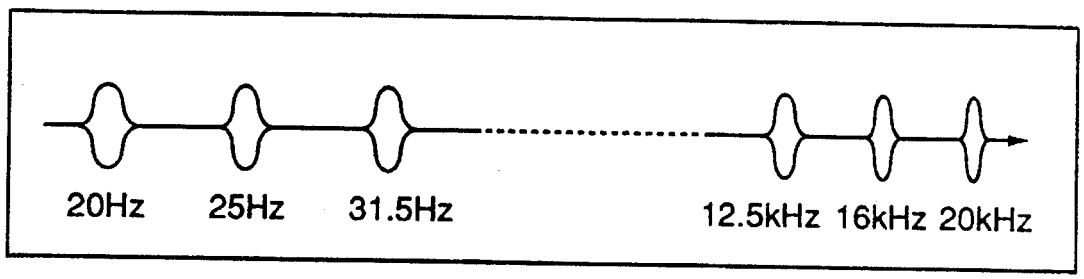

FIGS. 8A to 8C show an example in which a frequency band is divided into ⅓ obtave band and ⅓ octave pitch. FIG. 8A shows a band signal center frequency, FIG. 8B shows a band signal waveform (center frequency being 100 Hz) and FIG. 8C shows an output flow of the band signal waveform. The band signal waveform of FIG. 8B is stored in the measuring signal generator 30 (ROM) of FIG. 1A and, by changing the reading speed of this generator 30, measuring signals for the respective bands can be provided. The band signals propagated from the loudspeakers 76 and 78 sequentially with a time lag are collected by the microphone 72 band by band and the collected waveforms are stored in the waveform memory 32 of FIG. 1A.

(b) TSP method

A single-shot pulse is generally used for measuring impulse response in a hall. Since, however, the power of the signal is so small that a sufficient signal-to-noise ratio cannot be obtained even if other methods such as synchronized addition is additionally used. In contrast, when the TSP signal is used, a sufficiently large signal power is available for obtaining a sufficient signal-to-noise ratio. Moreover, an inverted filter can be readily obtained. Conversion of the response of the TSP signal to impulse response can be achieved by convolution operation with this inverted filter and, therefore, the conversion is easy when a convolution operator is available. Therefore, the TSP signal has a characteristic which is convenient for measurement.

Figure 9:
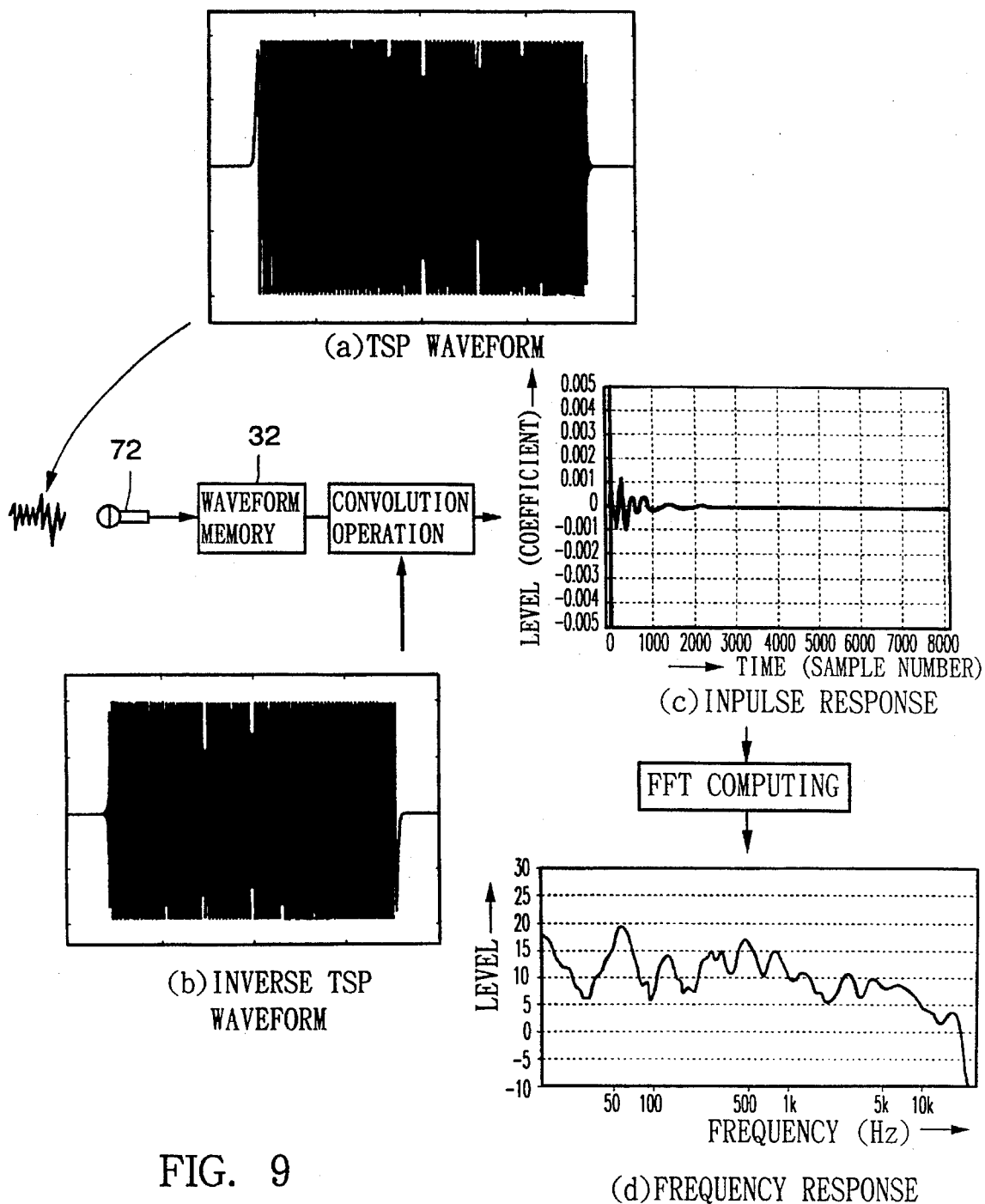
FIG. 9A to 9D are graphs showing an outline of the TSP method.

The TSP signal used in the TSP method has a waveform as shown in (a) of FIG. 9. This TSP waveform is stored in the measuring signal generator 30 of FIG. 1A. This TSP signal is read out once for one measurement and reproduced from the loudspeakers 76 and 78. The reproduced TSP signal is collected by the microphone 72 and the collected waveform is stored in the waveform memory 32.

(2) Computation of measured characteristic

Computation of a response characteristic based on the collected sound waveform stored in the waveform memory 30 is made in the manner to be described below in accordance with the rest method employed.

Band signal method

In the band signal method, a collected sound waveform for each divided band stored in the waveform memory 30 of FIG. 1A is immediately supplied to a band power-mean value computing circuit 124 through the switches 94 and 96, bypass route 98, addition point 104, switches 106 and 114, bypass route 120 and addition point 122. In the band power-mean value computing circuit 124, a band power-mean value for each divided band is computed and the obtained band power-mean value is stored in the band data memory 126. The band data memory 126 can s tore measured data for measurement of several times and measured data at the five points P1 to P5 shown in the lower right corner of FIG. 5A are stored. The selection and weighting circuit 128 selects and discards data on the basis of an operation by the operating person who watches each individual measured characteristic in the display section 40 and deletes, for example, data which is extremely different from other data. Weighting is made, if necessary, with respect to the remaining data. More specifically, when the measuring points are the five points of P1 to P5 shown in FIG. 5A, weighting is made in such a manner that, for example, weight of 1 is given to the point P1 at the central position (i.e., the position where the listener's head is mostly located) and weight of 0.5 is given to each of the other points P2 to P5. Alternatively, weight of 1 may be given to the point P1 and weight of 1 may be given to the total of the other points P2 to P5.

Figure 10:
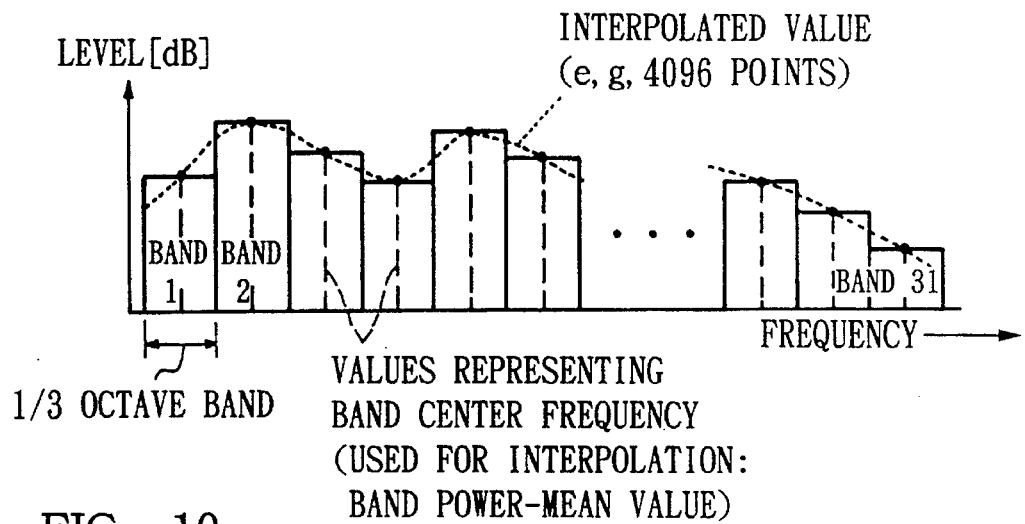
FIG. 10 is a graph showing the manner by which a measured characteristic is obtained by interpolating bands on the basis of data for each divided data.

An ensemble average of the selected and weighted measured data is obtained by the ensemble average circuit 130 and average measured data in the area where the measurement has been made thereby is obtained. Since the ensemble averaged measured data is a discrete data for each divided band, these data are interpolated by the interpolation circuit 132 to convert it to data of a continuous, smooth curve. As the interpolation method, the spline interpolation method which can achieve interpolation in a short time is suited. For interpolation, as shown in FIG. 10, data obtained as power-mean value for each divided band is treated as a value at the central frequency of each band and these central frequency points are spline-interpolated on the basis of several points before and after the central frequency points to obtain interpolated data at 4096 points. This interpolated data is used as the measured characteristic.

By treating power-mean value of each divided band as a value at the center frequency and spline-interpolating the respective values as described above, a useful and practical averaging of the measured characteristic is realized whereby occurrence of a large peak dip in the measured characteristic due to phase interference as in the conventional device is prevented and, therefore, unnaturalness in hearing due to an extreme correction occurring in a case where a measured characteristic is used directly for obtaining a correction characteristic for the correction of a characteristic can be prevented. Moreover, since values of several tens of bands (e.g., 31 bands or 61 bands) are interpolated to several thousands points (e.g., 4096 points), measured characteristic data sufficient for obtaining a correction characteristic in continuity of the frequency characteristic and resolution of division can be obtained. The data of the measured characteristic obtained in this manner is stored in the RAM 134 of FIG. 1B and displayed with a bar graph (measured characteristic display 44 in FIG. 3) in the display section 40.

(b) TSP method

In the TSP method, the collected sound waveform stored in the waveform memory 32 of FIG. 1A is immediately supplied to the convolution operator 34 through the switches 94 and 96. In the convolution operator 34, the collected sound waveform is subjected to a convolution operation (time compression) with the inverse TSP waveform b) of FIG. 9) stored in the TSP inverse filter coefficient memory 100 to provide the impulse response shown in (c) of FIG. 9. The inverse TSP waveform is a waveform obtained by timewise inverting the TSP waveform ((a) of FIG. 9). When the number of the stage of the convolution operator 34 is insufficient as the time compression filter for the TSP signal, the time compression may be made for each divided region.

The impulse response provided by the convolution operator 34 is supplied to the frequency conversion circuit 116 through addition point 104 and switches 106 and 114. In the frequency conversion circuit 116, the impulse response is Fourier converted to provide a frequency response characteristic ((d) of FIG. 9). The obtained frequency response characteristic is divided in band by a band dividing circuit 118 into the same state as in band signal method (i.e., ⅓ octave band width and ⅓ or ⅙ octave pitch). The measured data which has been divided in band is subjected to the same processing as in the band signal method. That is, measured data for each band divided by the band division circuit 118 is supplied to the band power-mean value computings circuit 124 though addition point 122. In the computing circuit 124, a band power-mean value for each divided band is computed and this band power-mean value is stored in the band data memory 126. The band data memory 126 can store measured data at plural measuring points for plural measuring times. The selection and weighting circuit 128 selects and discards data on the basis of an operation by the operating person who watches individual measured characteristic in the display section 40 and deletes data which is extremely different from other data. Weighting is made, if necessary, with respect to the remaining data. An ensemble average of the selected and weighted measured data is obtained by the ensemble average circuit 130 and an averaged measured data in the area where the measurement has been made is thereby obtained. The ensemble averaged measured data is a discrete data for each divided band and, therefore, this data is spline interpolated by the interpolation circuit 132 to convert it to data of a continuous, smooth curve. The interpolated measured data is stored in the RAM 34 and displayed with a bar graph in the display section 40.

Thus, as described above, in the TSP method also, measured data is once divided in band and power-mean value for each band is computed and this power-mean value is interpolated to provide continuous data. Accordingly, occurrence of a large peak dip due to phase interference in a measured characteristic is prevented so that unnaturalness in hearing due to an extreme correction when a measured characteristic is used directly to obtain a correction characteristic for the correction of a characteristic can be prevented. Moreover, since a band which has once been divided is interpolated, data of a sufficient measured characteristic in continuity of the frequency response and the resolution of division can be obtained.

Figure 23:
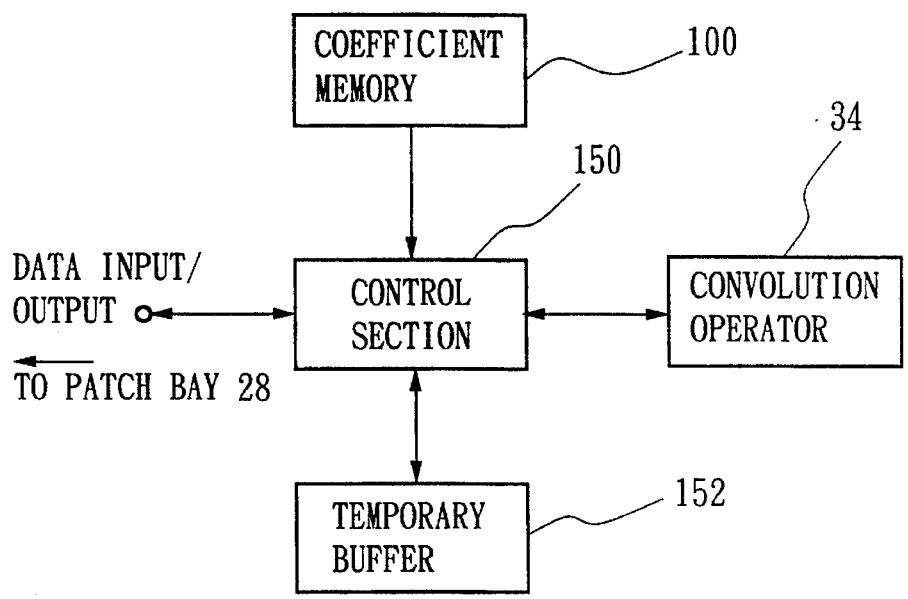
FIG. 23 is a block diagram showing a hardware structure for performing time compression by an inverse TSP signal on a time divided bass.

An embodiment realizing a method for performing time compression on timewise divided basis will now be described. FIG. 23 shows a hardware structure for this time compression.

Figure 24:
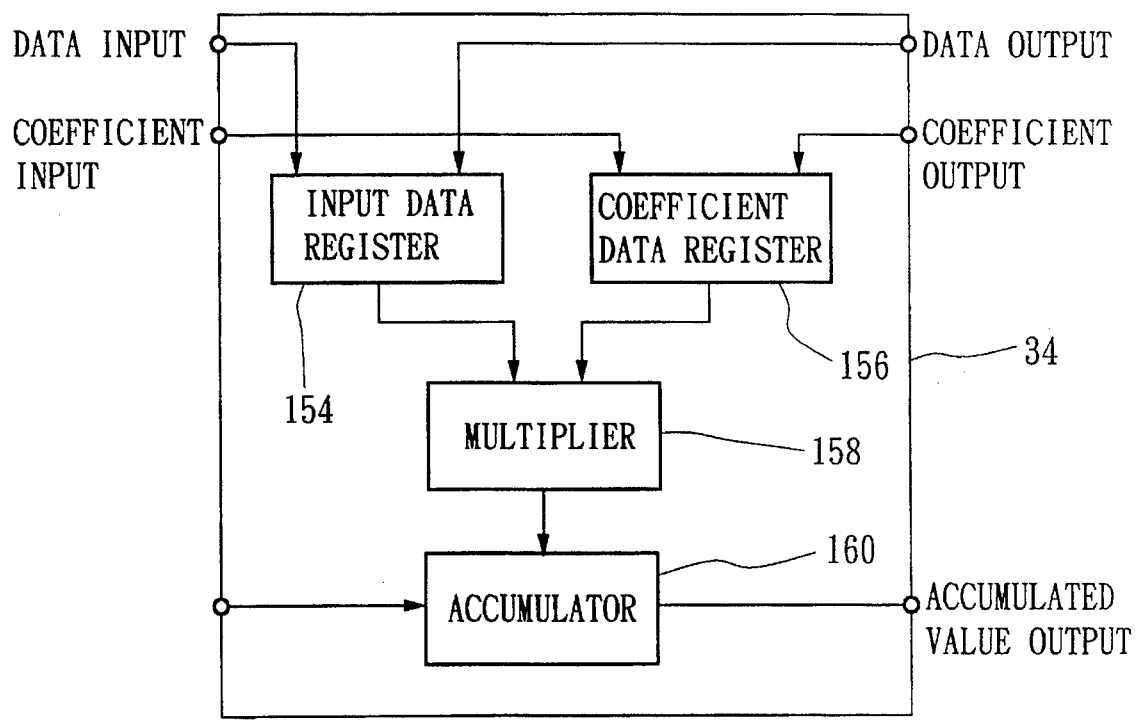
FIG. 24 is a block diagram showing an example of the convolution operator 34 of FIG. 23.

A portion of input data (collected sound data) which is sufficient for a convolution operation with an inverse TSP waveform is sequentially stored in a temporary buffer (a RAM) 152 through a control section 150. A coefficient memory (TSP inverse filter waveform memory) 100 stores a TSP inverse filter waveform as coefficients for the convolution operation. A convolution operator 34 is, for example, composed of, as shown in FIG. 24, an input data register 154 for holding plural input data, a coefficient register 156 for holding coefficient data which are to correspond to the plural input data, a multiplier 158 for multiplying these input data with the coefficient data sequentially and an accumulator 160 for accumulating products of the multiplication. In a case where the number of stages c,f the registers 154 and 156 of the convolution operator 34 is not sufficient for performing the convolution operation with the inverse TSP waveform, this problem can be simply overcome by serially connecting a plurality of the convolution operators 34 of FIG. 24. This will however increase the number of stages of the convolution operator 34 with resulting loss of the merit of using the convolution operator 34 commonly for imparting of the correction characteristic.

For this reason, in the circuit of FIG. 23, the convolution with the inverse TSP waveform is performed on a time divided basis by using the single convolution operator 34, i.e., in plural times by an amount capable of being processed by the single convolution operator 34 and result of computation for each time is accumulated to produce a final result of the convolution operation. More specifically, the control section 150 performs the convolution operation by reading out data of the number which can be processed for convolution operation for one operation time from among plural input data stored in the temporary buffer 152 and also reading out coefficients to be imparted to the read out data from the coefficient memory 100 and causes the temporary buffer 152 to temporarily store result of the convolution operation. Then, a similar convolution operation is performed with respect to data of a next divided section and result of the convolution operation is added to the preceding result of accumulation. By repeating the convolution operation with respect to each divided section and addition of the result thereof to the preceding accumulated value, a final result of the convolution operation can be obtained.

More specifically, if an operation of $$y(K) = \sum_{i=0}^{n-1} h(i) \times (k-i)$$

is necessary for obtaining one output sample y(k), the operation is made by dividing it in m times in the following manner:

$$y(K) = \sum_{i=0}^{l-1} h(i) \times (k-i) +$$

(first operation)

$$\sum_{i=0}^{2l} h(i) \times (k-i) +$$

(second operation)

$$\ldots \sum_{i=Pl}^{n-1} h(i) \times (k-i)$$

(m-th operation)

(where l represents the number of convolution operation which is possible in one time)

Figure 25:
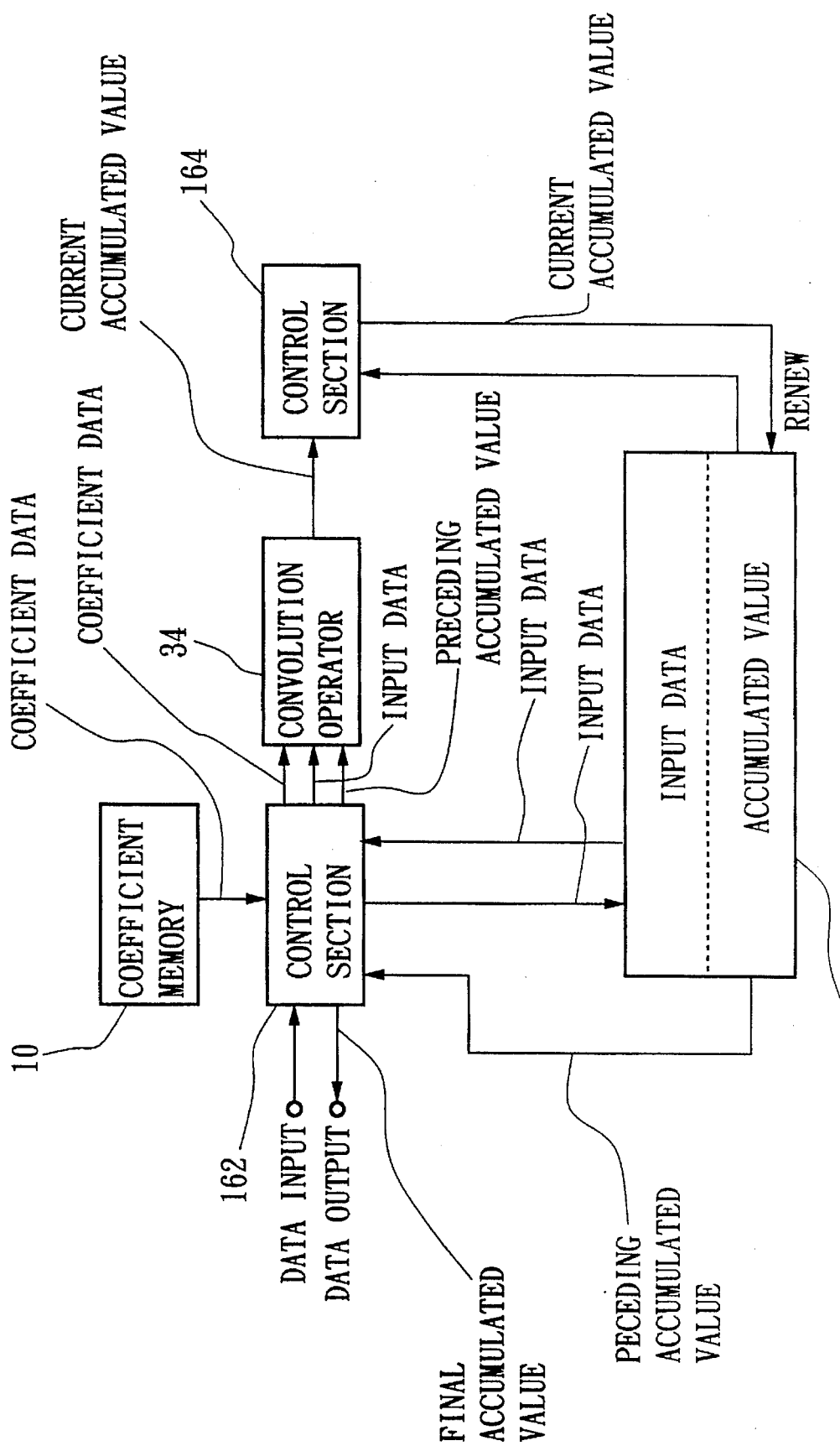
FIG. 25 is a block diagram showing an example of the control section 150 of FIG. 23.
Figure 26:
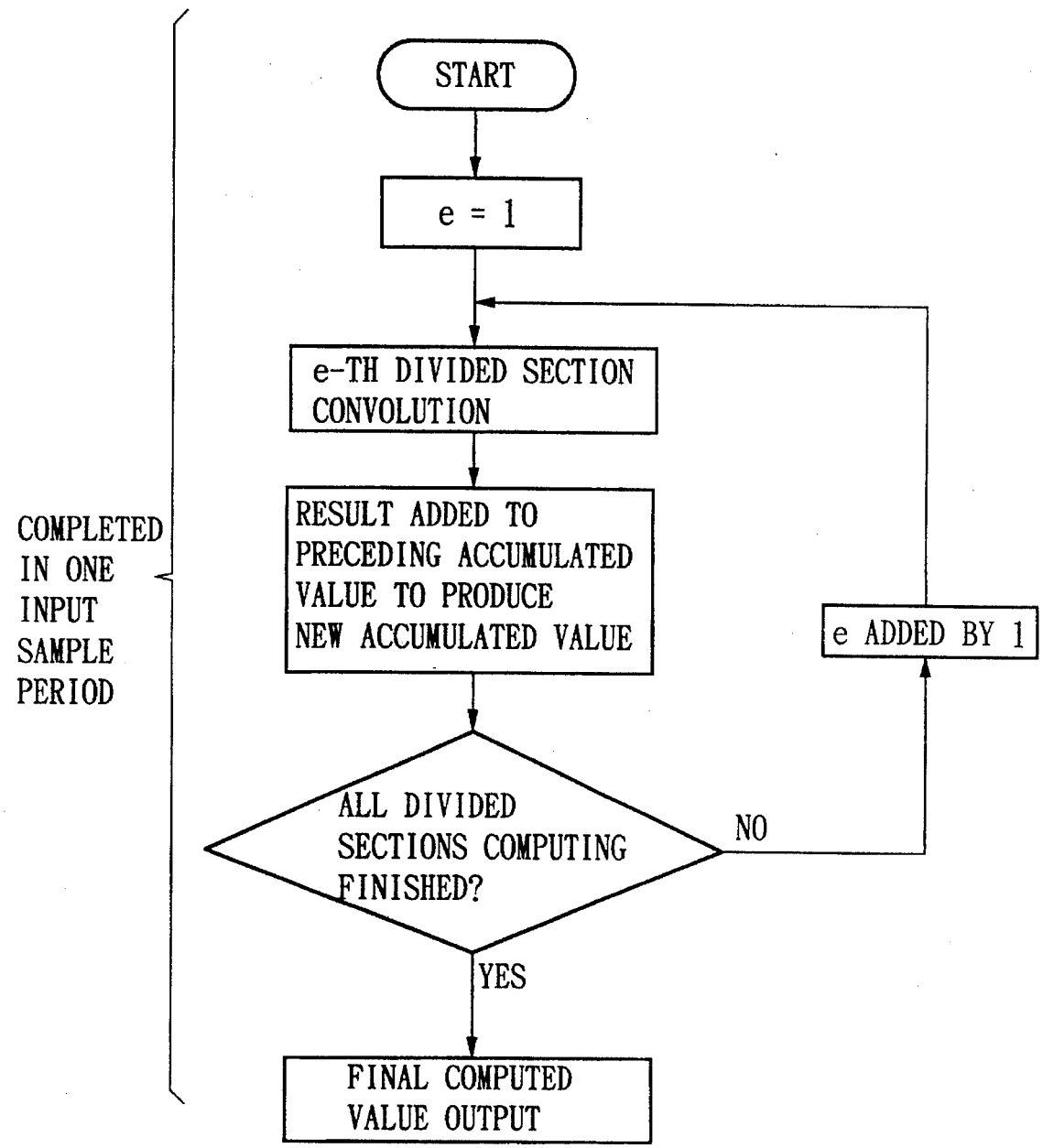
FIG. 26 is a flow chart showing a control by the control block of FIG. 25.

FIG. 25 shows a structure of the control section 150 for realizing the above described convolution operation. The temporary buffer 152 has an area where input data is stored and an area where an accumulated value is stored. Input data is stored in the temporary buffer 152 through a control section 162. The control section 162 causes the convolution operator 34 to perform a convolution operation by reading out input data of one divided section from the temporary buffer 152 and reading out coefficient data to correspond to the input data from the coefficient memory 100. Further, the control section 162 causes a new accumulated value to be obtained by reading out a preceding result of accumulation from the temporary buffer 152 and adding it to the current value of operation by the convolution operator 34. Upon determination of the new accumulated value, the accumulated value of the temporary buffer 152 is renewed to a new accumulated value. By repeating the convolution operation for each divided section, addition of the result of this convolution operation to the preceding accumulated value and renewal of the accumulated value, a final result of accumulation is obtained. This accumulated value is read from the temporary buffer 152 as a final result of accumulation and delivered out through a control section 162. FIG. 26 shows a flow chart of the above described control. The control is performed in such a manner that this control flow is completed within one sample period of the input data.

Figure 27:
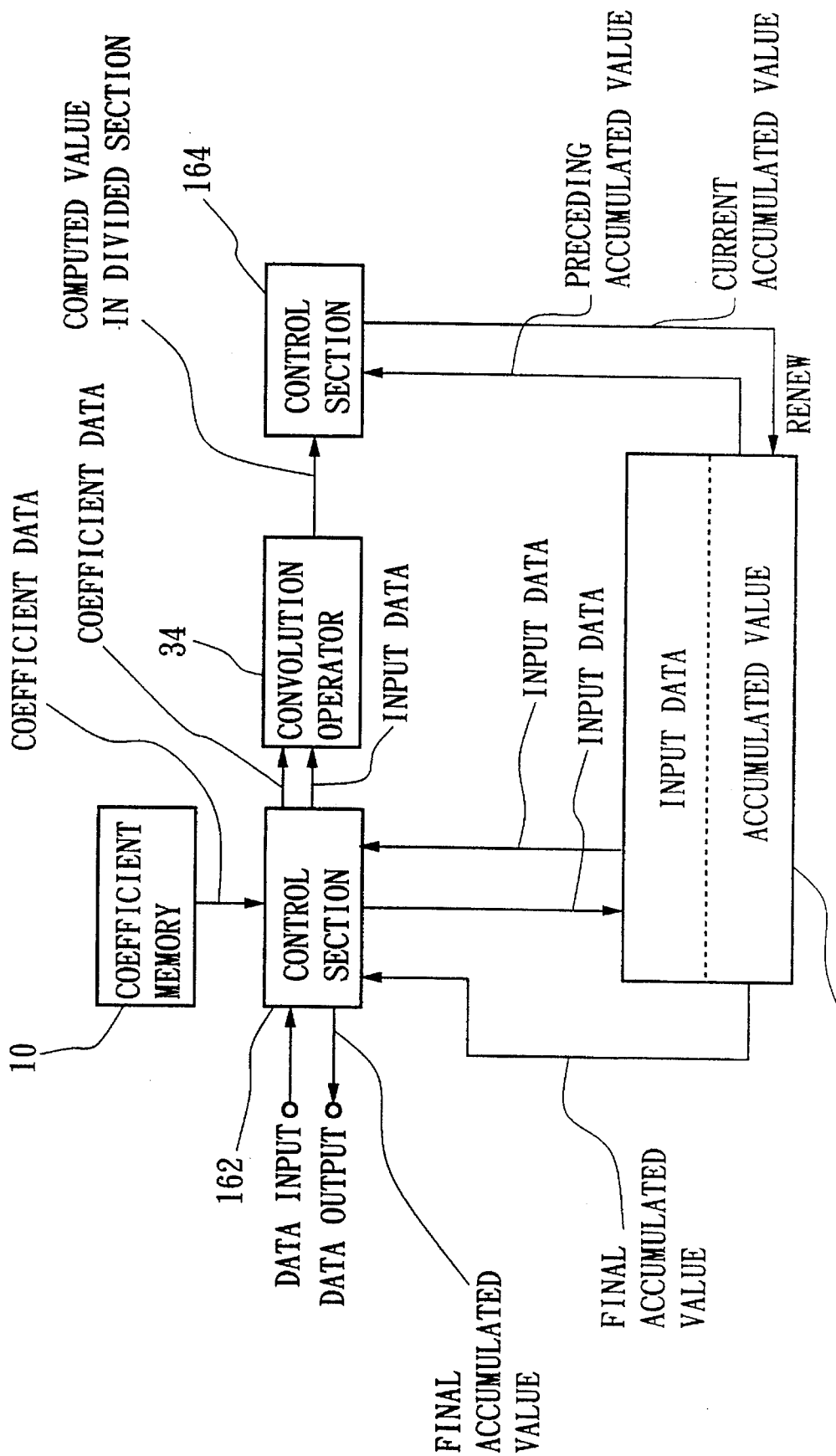
FIG. 27 is a block diagram showing another example of control by the control section 150 of FIG. 23.

Another example of the control by the control section 150 is shown in FIG. 27. In this example, accumulation of operation value for each divided section is performed not in the convolution operator 34 but in a control section 164. Upon determination of an operation value for one divided section, the control section 164 causes the preceding accumulated value to be read from the temporary buffer 152 and added to the operation value and causes an accumulated value in the temporary buffer 152 to be renewed by using the sum of the addition as a new accumulated value. A final result of accumulation is read from the temporary buffer 152 and delivered out through the control section 162.

Figure 11:
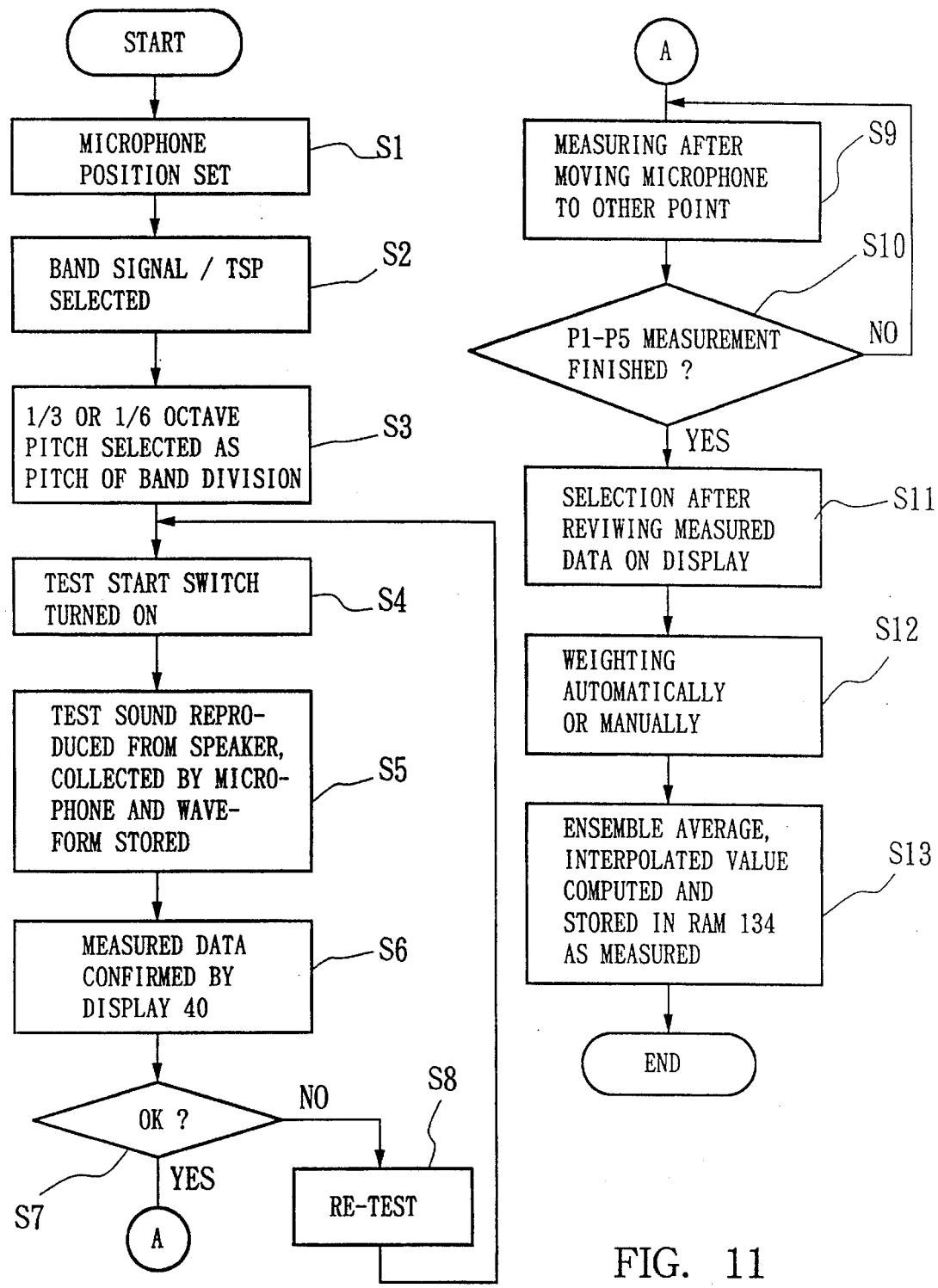
FIG. 11 is a flow chart showing an example of processing in the test and computation of a measured characteristic.

An example of processings executed in (1) Test and (2) Computation of measured characteristic is shown in FIG. 11. Initially, the microphoe position is set (S1) and either one of the band signal method and TSP method is selected as the test method (S2). Then, either one of ⅓ octave band pitch and the ⅙ octave band pitch is selected as the pitch of the band division (S3). Upon turning on of a test start button (S4), a test sound is reproduced from the loudspeakers 76 and 78, collected by the microphone 72 and stored in the waveform memory 32 (S5). Results of the measurement are display ed with a bar graph in the display section 40 (S6) and the operating person can thereby confirm the results of the measurement. In a case where the results of measurement are considered abnormal (e.g., due to a large noise), a test is made again at this point of abnormality (S7, S8). When the results of the measurement are good, the microphone 72 is moved to the next measuring point and the test is repeated (S9).

Upon completion of the test on all of the measuring points (S10), collected data are sequentially displayed in the display section 40 and selection and discarding of data is made when necessary (S11). The selected data is then subjected, when necessary, to weighting for each measuring point automatically or by a manual setting (S12). An ensemble average of interpolated value about the data of each measuring point are automatically computed and stored as final single measured characteristic data in the RAM 134 (S13) and the measurement is finished.

(3) Setting of a desired characteristic

Figure 12A:
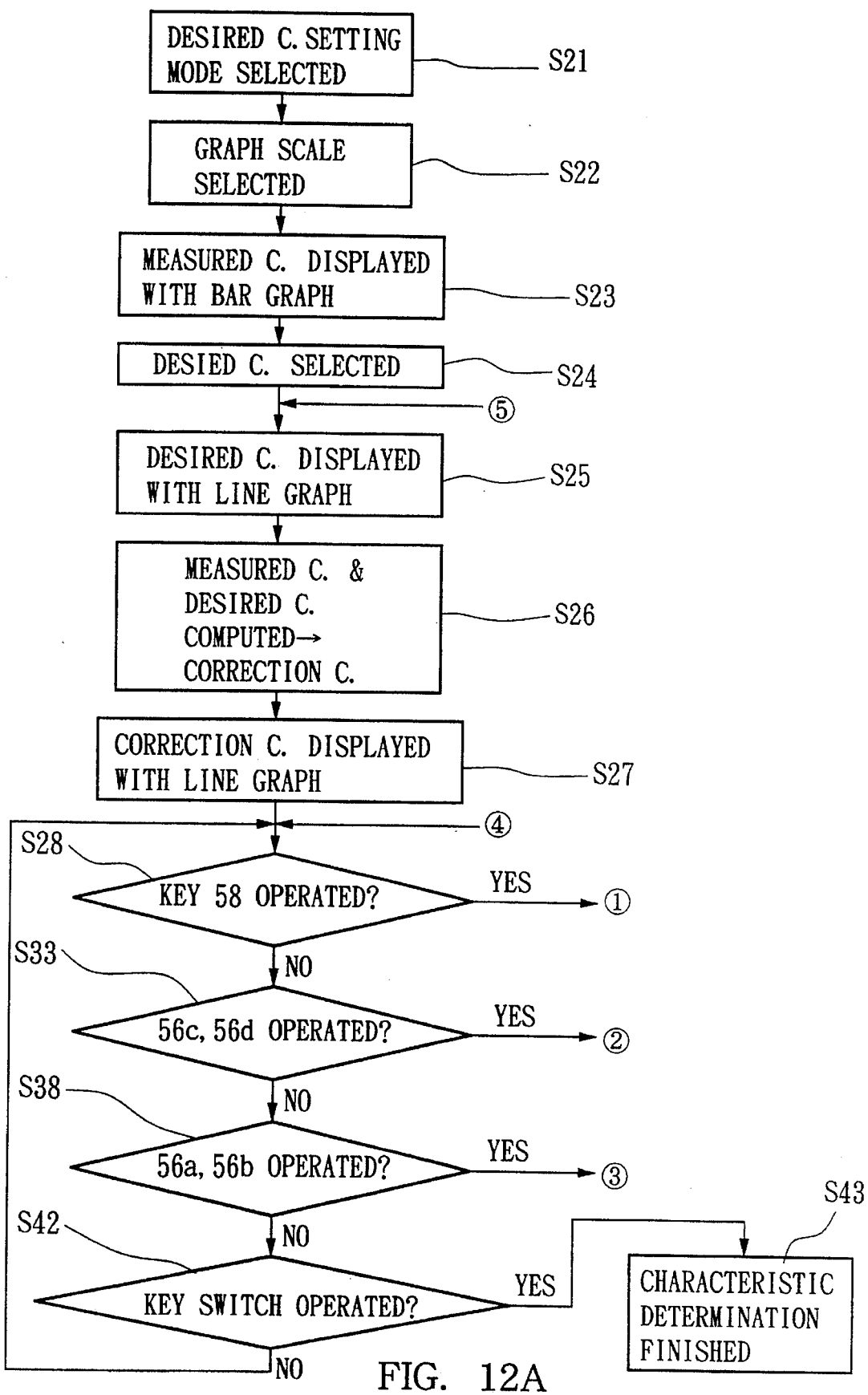
FIGS. 12A and 12B are flow charts showing a processing for setting a desired characteristic.
Figure 12B:
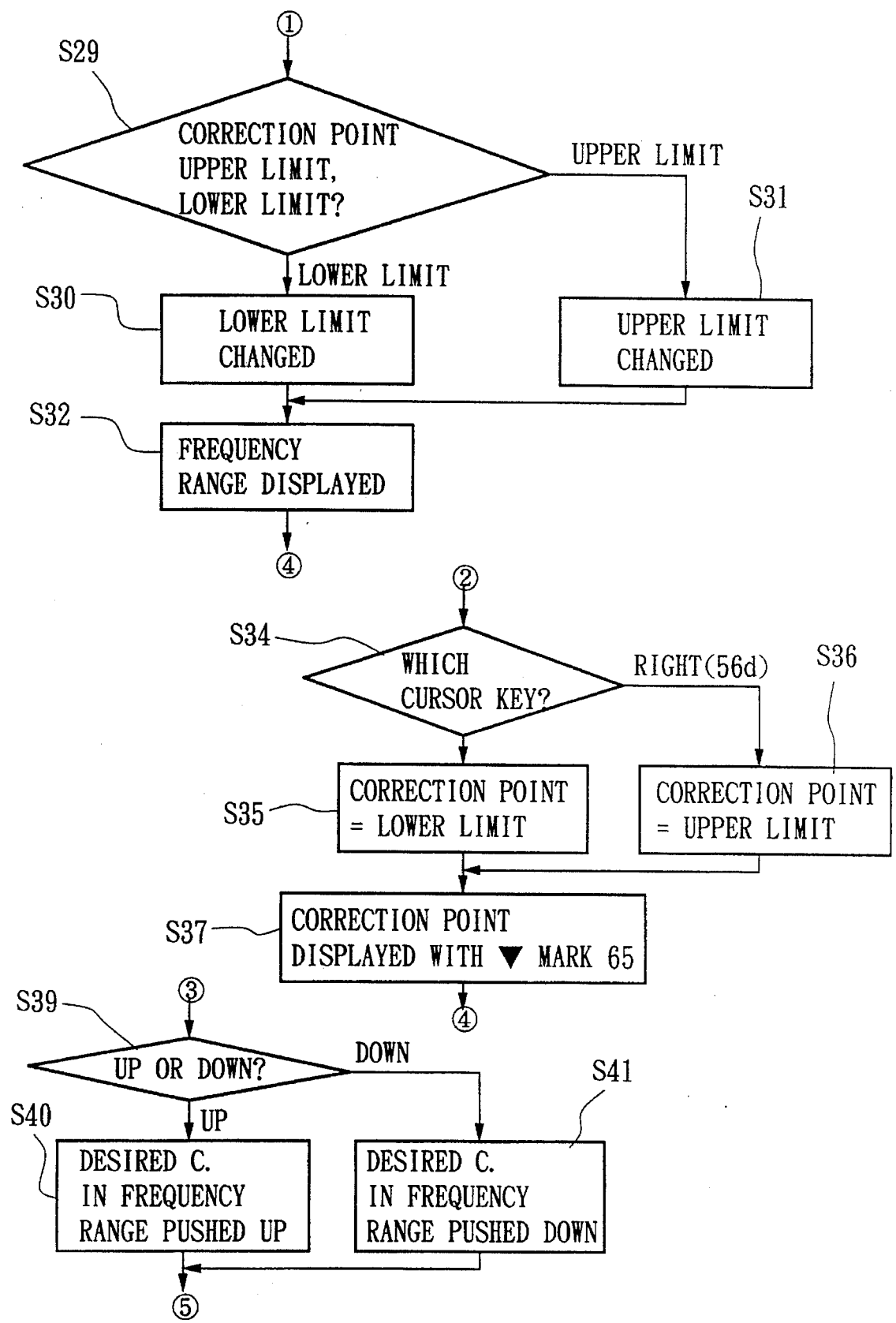

An example of a desired characteristic is shown in the flow chart of FIGS. 12A and 12B. Upon selection of the desired characteristic setting mode in the remote control unit 14 (FIG. 3), a graph scale is displayed in the display section 40 (S22) and the measured characteristic stored in the RAM 134 is displayed with the bar graph 44 (S23). Then, upon selection of a desired characteristic (S24), a corresponding desired characteristic is read from the ROM 136 or the RAM 138 and is displayed with the line graph 46 in the display section 40 (S25).

The transmission characteristic of a loudspeaker in a listening room or a hall changes with the directivity of the loudspeaker and the reverberation characteristic of the room and, besides, a desired characteristic in hearing does not always conform to flattening of the measured characteristic. It will therefore be convenient if a desired characteristic in the room can be readily determined. Correction of the characteristic to a desired characteristic can be easily achieved by previously determining and prestoring desirable characteristics such, for example, as a desired characteristic for public address in a hall by a large scale loudspeaker system and a desired characteristic when a listener listens to a music sounded from a small loudspeaker in a home listening room.

Figure 13:
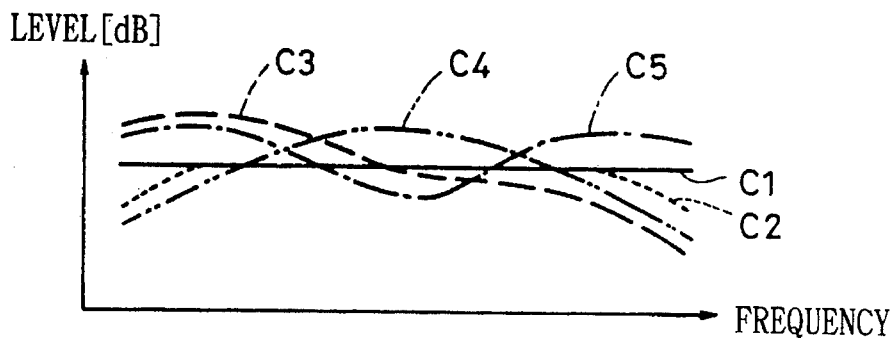
FIG. 13 is a graph showing patterns of a desired characteristic stored in a ROM.

For this purpose, it is convenient to prestore in the ROM 136 general patterns of desired characteristic which, for example, includes, as shown in FIG. 13, a characteristic C1 which is flat over the entire frequency range, a characteristic C2 in which levels of the low and high frequency regions in the flat characteristic are attenuated, a characteristic C3 in which emphasis is placed on the low frequency region, a characteristic C4 in which emphasis is placed on the middle frequency and a characteristic C5 in which emphasis is placed on the low and high frequency regions. In this case, by displaying the name of the characteristic pattern in the display section 40, the operating person can refer to this name and the move cursors to the desired characteristic pattern to read out corresponding characteristic data from the ROM 136 and use it as the desired characteristic. Alternatively, characteristic data classified according to the type of loudspeaker (e.g., one for public address in a hall, one for public address in an outside field, a hall type tweeter for monitoring in a studio, a direct radiator for monitoring in a studio and small loudspeaker) and the type of rooms (e.g., a Japanese style listening room, a western style listening room and a hall) may be stored in the ROM 136 and the loudspeaker type and the room type may be displayed in the display section 40. The operating person can refer to this and move the cursors according to the loudspeaker type and the room type to select a desired loudspeaker and room to read out corresponding characteristic data from the ROM 136 and use it as the desired characteristic. Upon setting of the desired characteristic, computation of measured characteristic minus desired characteristic is automatically made by a computing circuit 142 to provide a correction characteristic and display it with the line graph 48 in the display section 40 (S27). The characteristic data read from the ROM 136 can be directly used as the desired characteristic but it may be used after subjecting it to a further correction.

Figure 14:
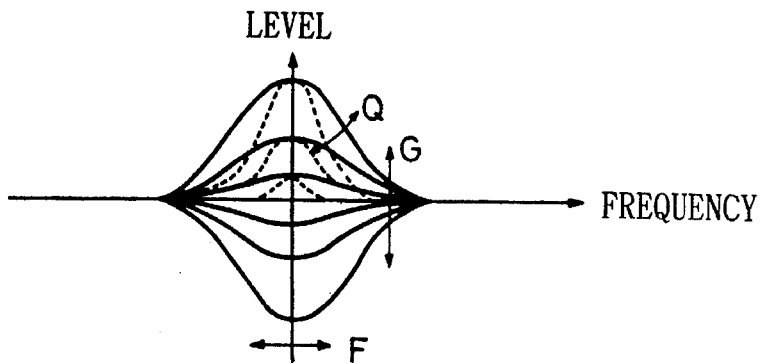
FIG. 14 is a graph showing a manner of adjusting a characteristic in a conventional graphic equalizer or a parametric equalizer.

For adjusting a characteristic of a conventional graphic equalizer or parametric equalizer, it is a general practice to adjust, as shown in FIG. 14, values of a center frequency F, gain G and sharpness Q. In this case, as the order of adjustment, the center frequency F is first determined. Then the value of Q is determined and finally the gain G is adjusted in the vertical direction. In the conventional method, however, it is necessary to realize a target characteristic by setting the three parameters independently from one another and this adjusting operation is not easy. Moreover, when Q is changed, its influence extends over the entire frequency range and, therefore, it is difficult to understood how the characteristic is changed by the change with resulting difficulty in the adjustment the characteristic.

In the present embodiment, the center frequency is not determined but a certain frequency range is determined and, by in creasing or decreasing the characteristic within the determined frequency range while maintaining smooth connections at the two ends, a characteristic curve of a desired characteristic which is smooth and nearer to the human sense can be easily set. The processings of step S28 and subsequent steps shown in FIG. 12 will be described below.

Initially upon setting of a desired characteristic, one of the lower limit value or the upper limit value of the frequency range designated by the cursors 62 and 64 in the display section 40 is selected and is in a correctable state (the selected one being displayed with the inverted triangle mark 65). By operating the shuttle key 58 in this state (S28), the selected one of the upper limit value and the lower limit value of the frequency range changes in the direction in which the shuttle key 58 is rotated (S29, S30, S31) and the mark 65 in the display section 40 is moved in the same direction (S32).

By depressing the left cursor key 56c or the right cursor key 56d for switching to the other cursor (S34), one of the upper limit value and the lower limit value to which the cursor has been switched becomes correctable and the inverted triangle mark 65 in the display section 40 is moved to the other cursor side. By operating the shuttle key 58 in this state (S28), the value of the corresponding side changes in the direction in which the shuttle key 58 is rotated (S29, S30, S31) and the inverted triangle mark 65 in the display section 40 is moved in the same direction (S32).

Figure 15:
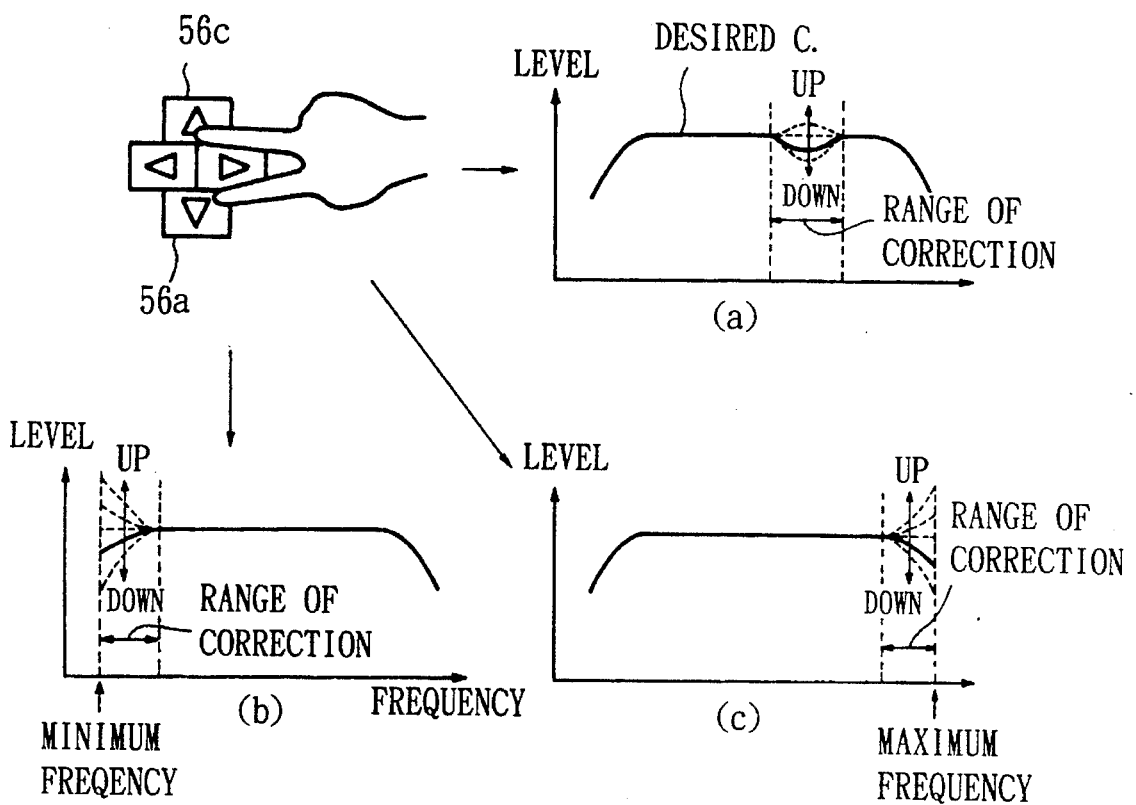
FIGS. 15A to 15C are graphs showing a manner of correcting a desired characteristic.

In this manner, by depress in g the up key 56a or the down key 56b (S39) upon setting the frequency range, as shown in FIG. 15A, the level of the desired characteristic increases or decreases in a curve having its peak at the center position in the frequency range in accordance with the number of times or time length of depression of the up key 56a or the down key 56b, while maintaining continuity with the outside of the set frequency range (S40, S41) and display of the desired characteristic in the display section 40 changes with this change in the level. According to this correction method, the correction operation is simple because it is only necessary to designate the frequency range and the amount of increase or decrease of the level. Moreover, since there is no influence by the level change over frequency regions other than the designated frequency range, it is easy to understand how the characteristic actually changes by the level changing operation, so that it is easy to correct the characteristic to a desired one. The computation for correcting the desired characteristic is performed by the computing circuit 142 shown in FIG. 1B.

As algorithm for specific correction processing in the computing circuit 142, for example, what correction curve should be used according to the set frequency range so as to conform the feeling of operation by the operating person to actual change of the characteristic may be previously stud i ed and a correction curve corresponding to the frequency range may be prestored in a table. Thus, a proper correction curve corresponding to the set frequency range can be read from the table and gain can be imparted according to the designated amount of increase or decrease. By this arrangement, the feeling of the level change operation conform to the actual change of the characteristic so that correction to the desired characteristic becomes easy.

When the up key 56a or the down key 56b is depressed in the condition in which the lower limit value of the frequency range is set to the minimum frequency in the entire frequency range, the desired characteristic changes to a s rate in which the lower frequency region is increased or decreased as shown in FIG. 15B. Similarly, when the up key 56a or the down key 56b is depressed in the condition in which the upper limit value of the frequency range is set to the maximum frequency in the entire frequency range, the desired characteristic changes to a state in which the high frequency range is increased or decreased as shown in FIG. 15C. In these cases also, correction curves of increase and decrease corresponding to the frequency range and the amount of increase or decrease may be stored in a table and a correction curve corresponding to the set frequency range may be read from the table and used after being imparted with gain corresponding to a designated amount of increase or decrease (the number of times the up key 56a or the down key 56b has been depressed).

After correcting the desired characteristic in this manner, the key switch 60 is depressed (S42) to end the determining and setting of characteristic (S43). The determined characteristic can, when necessary, be stored as corrected desired characteristic information in a designated area in the RAM 138 having a backup power source by designating such storage and can be read out and used when necessary. Accordingly, it is not necessary to adjust the desired characteristic each time it is changed.

Figure 16:
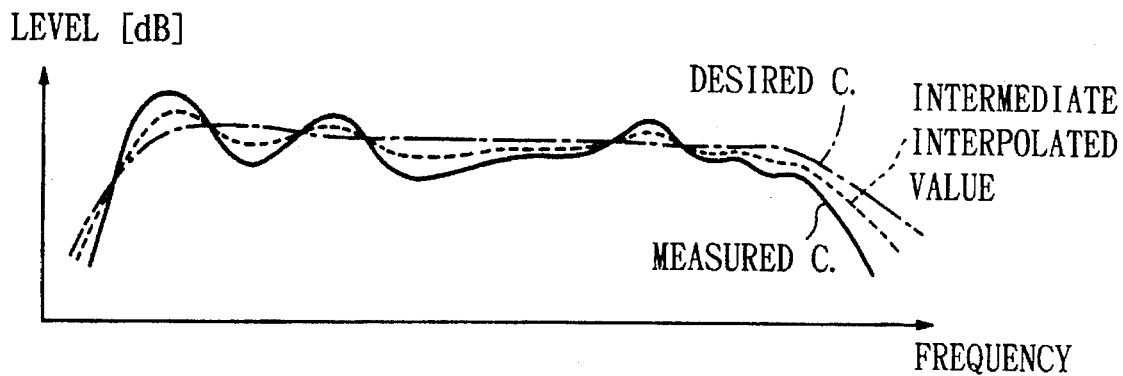
FIG. 16 is a graph showing another manner of correcting a desired characteristic.
Figure 17:
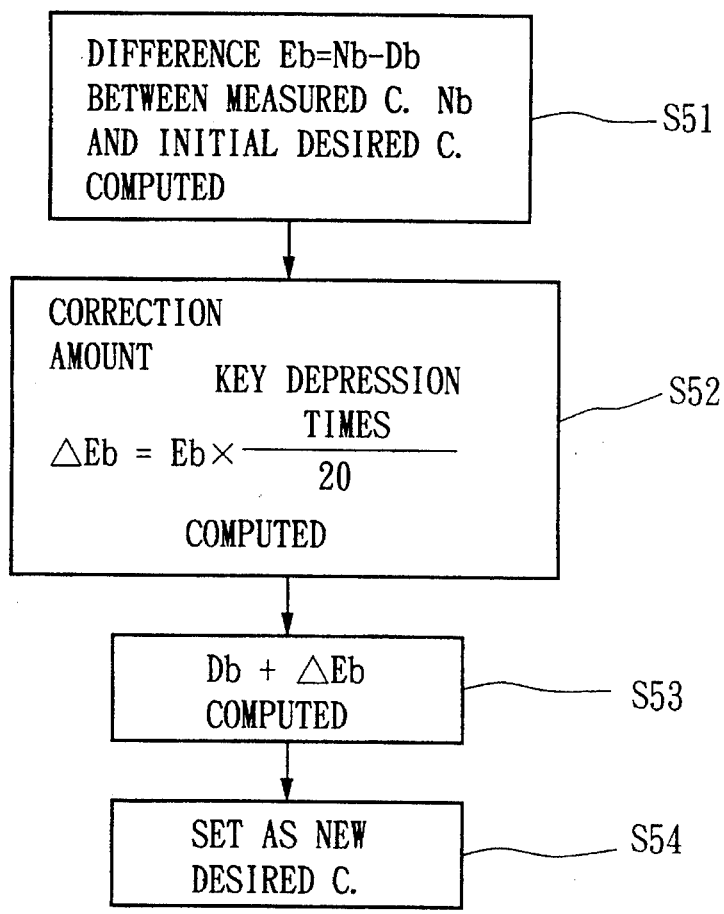
FIG. 17 is a flow chart showing a processing for computing for realizing the manner of FIG. 16.

Another method for correcting a desired characteristic will now be described. There is a case where, upon setting a desired characteristic, the operating person considers that there will be an excessive correction if a correction characteristic is directly obtain ed and used for equalizing. For overcoming this problem, as shown in FIG. 16, an intermediate characteristic between an initially set desired characteristic (it may be a corrected desired characteristic as shown in FIGS. 15A to 15C) and a measured characteristic may be automatically computed by the desired characteristic computing circuit 140 and this intermediate characteristic may be newly set and used as a corrected desired characteristic. More specifically, for example, difference in frequency between the initially set desired characteristic and the measured characteristic (i.e., a correction value of each frequency) is equally divided by 20 and, in accordance with this step, a characteristic change such that the desired characteristic approaches gradually to the measured characteristic of, conversely, the characteristic is gradually restored to the original desired characteristic each time the up key 56a or the down key 56b is depressed is computed and displayed and, when the characteristic has reached a desired characteristic, this characteristic is set as a new desired characteristic. FIG. 17 shows a flow of this computation processing. First, difference between a measured characteristic Nb and an initially set desired characteristic Db is obtained (S51). This difference Eb is multiplied by the number of times the up key 56a of the down key 56b has been depressed divided by 20 to obtain an amount of correction $\Delta$ Eb of the desired characteristic (S52). This amount of correction $\Delta$ Eb is added to the desired characteristic Db to obtain Db+$\Delta$Eb (S53) and this value is used as a new desired characteristic (S54). By this arrangement, an in termed i ate corrected value in which correction has not reached the initial desired characteristic Db can be set in a well balanced state in the entire frequency range by a simple operation. This intermediate characteristic may also be stored in the RAM 136.

(4) Computation of a correction characteristic

Upon setting a desired characteristic, a correction characteristic is automatically computed by the computing circuit 142 as a difference between the desired characteristic and a measured characteristic. The computed correction characteristic is displayed in the display section 40.

Compensation of a correction characteristic by the characteristic compensation characteristic 145 is made in the following manner:

Assuming that power P of a certain frequency is a sum of addition of power Pd of a direct sound and power Pr of a reflected sound, the power Pr of the reflected sound Pr can be expressed as $Pr=(1-\alpha)$ Pd where represents average sound absorption rate. Therefore, $P=Pd+Pr$ $P=Pd+(1+\alpha)$ Pd Therefore. $P=(2-\alpha)$ Pd.

As to reverberation time $RT_{60}$ and average sound absorption rate $\alpha$, $RT_{60}$ is proportional to V/S $\alpha$ (where V represents capacity of the room and S represents the surface area of the room). Accordingly, if the total power P of the frequency and the reverberation time $RT_{60}$ or the average sound absorption rate $\alpha$ are Known, the power Pd of the direct sound can be computed.

For this reason, the characteristic compensation circuit 145 computes the power Pd of a direct sound in each frequency tin the basis of a reverberation time frequency characteristic or an average sound absorption rate frequency characteristic provided by the reverberation time frequency characteristic/average sound absorption rate frequency characteristic output circuit 143 and thereby performs compensation of the correction characteristic. Since the frequency characteristic of the power Pd of this direct sound is a characteristic which is near the characteristic in hearing, a correction characteristic is computed so that the frequency characteristic of the power Pd of this frequency conforms to the desired characteristic.

More specifically, by computing a compensation characteristic from (frequency characteristic of total power)−(frequency characteristic of direct sound power)=compensation characteristic and imparting this compensation characteristic to any of the measured characteristic, desired characteristic or correction characteristic, this will result in imparting of the compensation characteristic to the correction characteristic. In other words, when the compensation characteristic is imparted to the measured characteristic, the relation {(measured characteristic)−(compensation characteristic)−(desired characteristic)=(compensated corrected characteristic)

is satisfied. When the compensation characteristic imparted to the desired characteristic, the relation (measured characteristic)−{(desired characteristic)+(compensated characteristic)=(compensated correction characteristic)

is satisfied. When the compensation characteristic is imparted to the correction characteristic, the relation (correction characteristic)+(compensation characteristic)=(compensated correction characteristic)

is satisfied. Further, since it will suffice if the frequency characteristic of the direct sound power conforms to the desired characteristic, the correction characteristic may be compensated directly (i.e., without computing the compensation characteristic independently) from the relation (frequency characteristic of direct sound power)−(desired characteristic)=(compensated correction characteristic).

Figure 35:
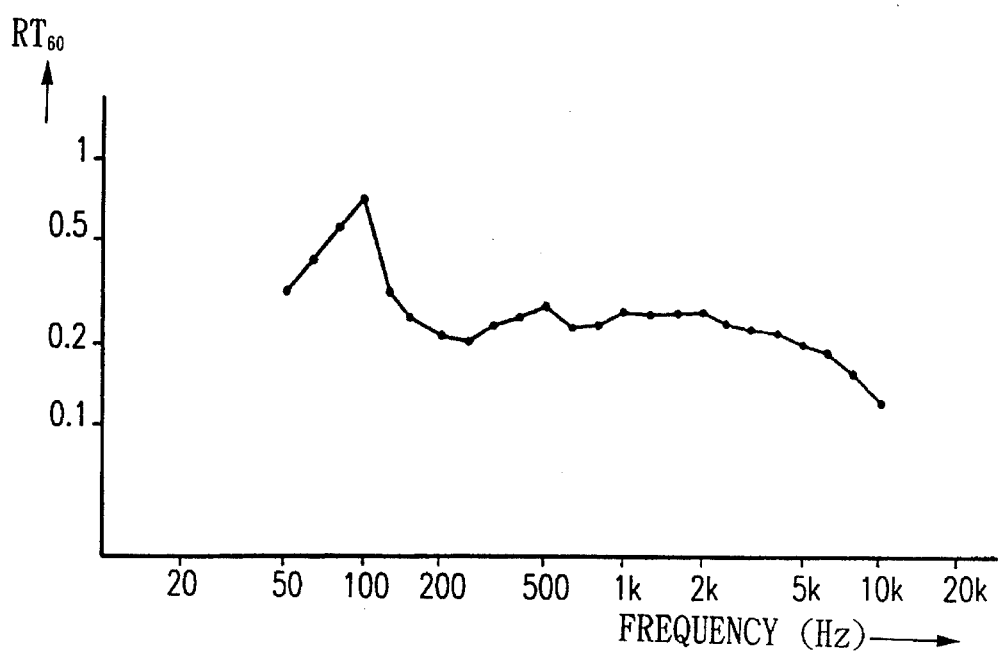
FIG. 35 is a graph showing an example of a reverberation time frequency characteristic.
Figure 36:
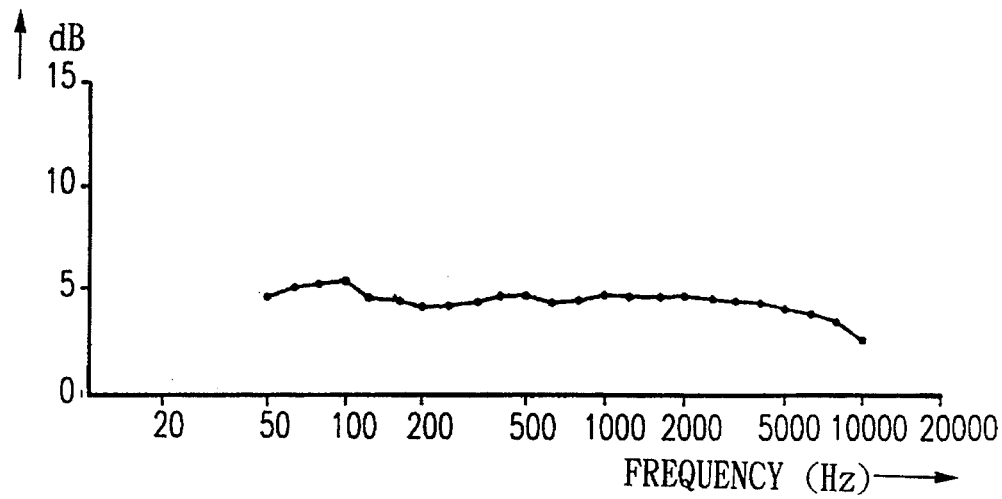
FIG. 36 is a graph showing an example of a compensation characteristic computed from the reverberation time frequency characteristic of FIG. 36 and the correction characteristic.

A specific example of the compensation characteristic will now be described. FIG. 35 shows an example of a reverberation time frequency characteristic in a certain room. In this example, the reverberation time is short with respect to a high frequency sound. A frequency characteristic of the direct sound power Pd is computed from the measured characteristic of the room (frequency characteristic of the total power P) stored in the RAM 134 and this reverberation time frequency characteristic and a difference (P−Pd) is computed. The result is shown in FIG. 36. This curve represents the compensation characteristic. By imparting this compensation characteristic to any of the measured characteristic, desired characteristic and correction characteristic, this will result in imparting of compensation to the correction characteristic and, by imparting this compensated correction characteristic a music signal, the characteristic in hearing conforms to the desired characteristic. The display of the respective characteristics in the display section 40 may remain those before the compensation has been made.

(5) Correction of a correction characteristic

Figure 18A:
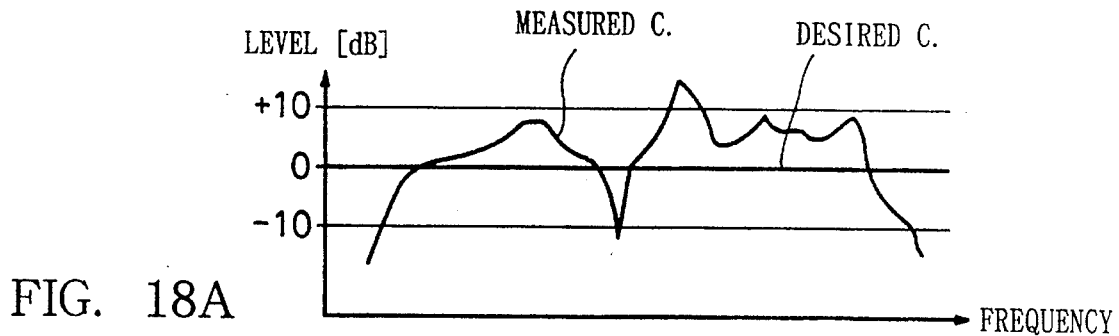
FIGS. 18A to 18E are graphs showing a manner of correcting a corrected characteristic.
Figure 18B:
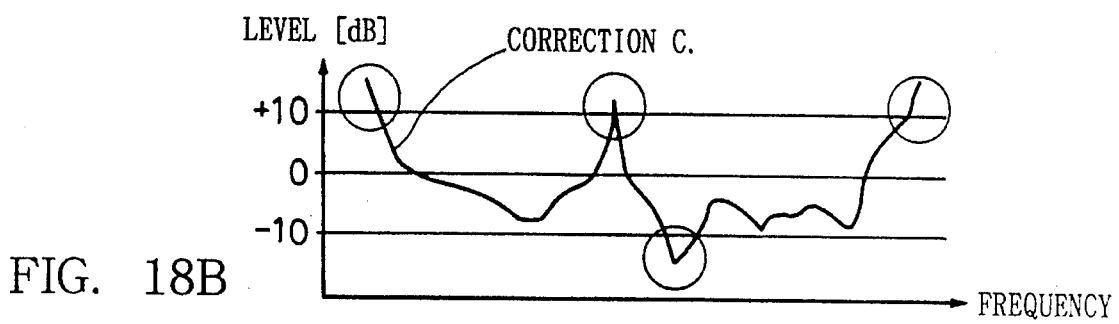
Figure 18C:
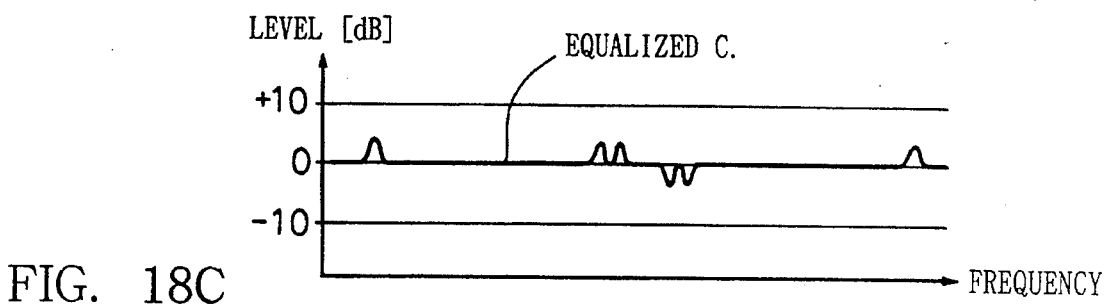
Figure 18D:
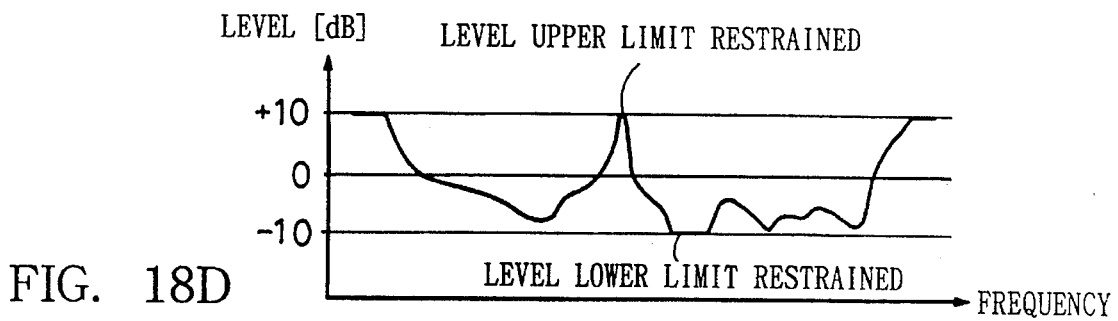

Assuming that a desired characteristic of 0 dB flat is set relative to a measured characteristic shown in FIG. 18A, there occurs a large peak dip in the correction characteristic as shown in FIG. 18B. This peak dip often is caused by a slight change in the measuring environment. If such correction characteristic is used directly for equalizing, portions in the correction characteristic in which a large amount of correction has been made (i.e., encircled portions in FIG. 18B) often fail to become a desired correction due to a slight change the environment (e.g., a slight change in the frequency characteristic due to temperature and humidity of the air) and rather become significant correction errors as shown in FIG. 18C in the equalized characteristic which do not normally appear with the result that a proper equalized characteristic cannot be obtained. For preventing this, upper and lower limit values in the correction characteristic are set at desired values (e.g., +10 dB and−10 dB) by an operation by the operating person. By this arrangement, the correction characteristic computing circuit 142 of FIG. 1 restricts the upper and lower limit values of the correction characteristic to these set values as shown in FIG. 18D so as to refrain from performing an excessive correction and thereby prevent increase in the correction error. Moreover, by this arrangement, since the maximum value on the plus side of the correction characteristic is restricted, the maximum input is thereby restricted and distortion in the entire system including the power amplifier and the loudspeakers can thereby be restrained.

Figure 18E:
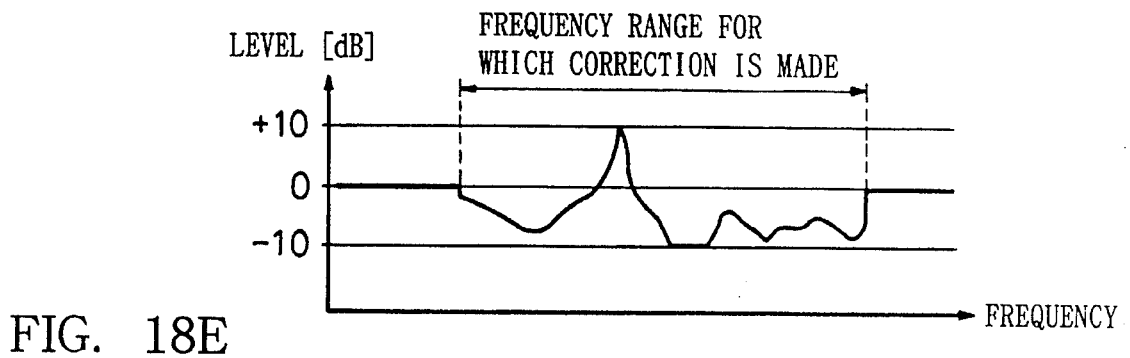

In a case where there is restriction on the range of correction due to the limit in the reproduced frequency characteristic of the loudspeakers used, overload may be applied to the loudspeakers if the loudspeakers are driven directly on the basis of the computed correction characteristic. For preventing this, a frequency range is set by an operation by the operating person and the correction characteristic is used within this set frequency range. The correction is not made in a range outside of the set frequency range by making the correction characteristic 0 dB flat in this outside range as shown in FIG. 18E. The frequency range in which correction is made is displayed with a bar graph as the correction frequency range display 50 in the display section 40 of FIG. 3.

Figure 19:
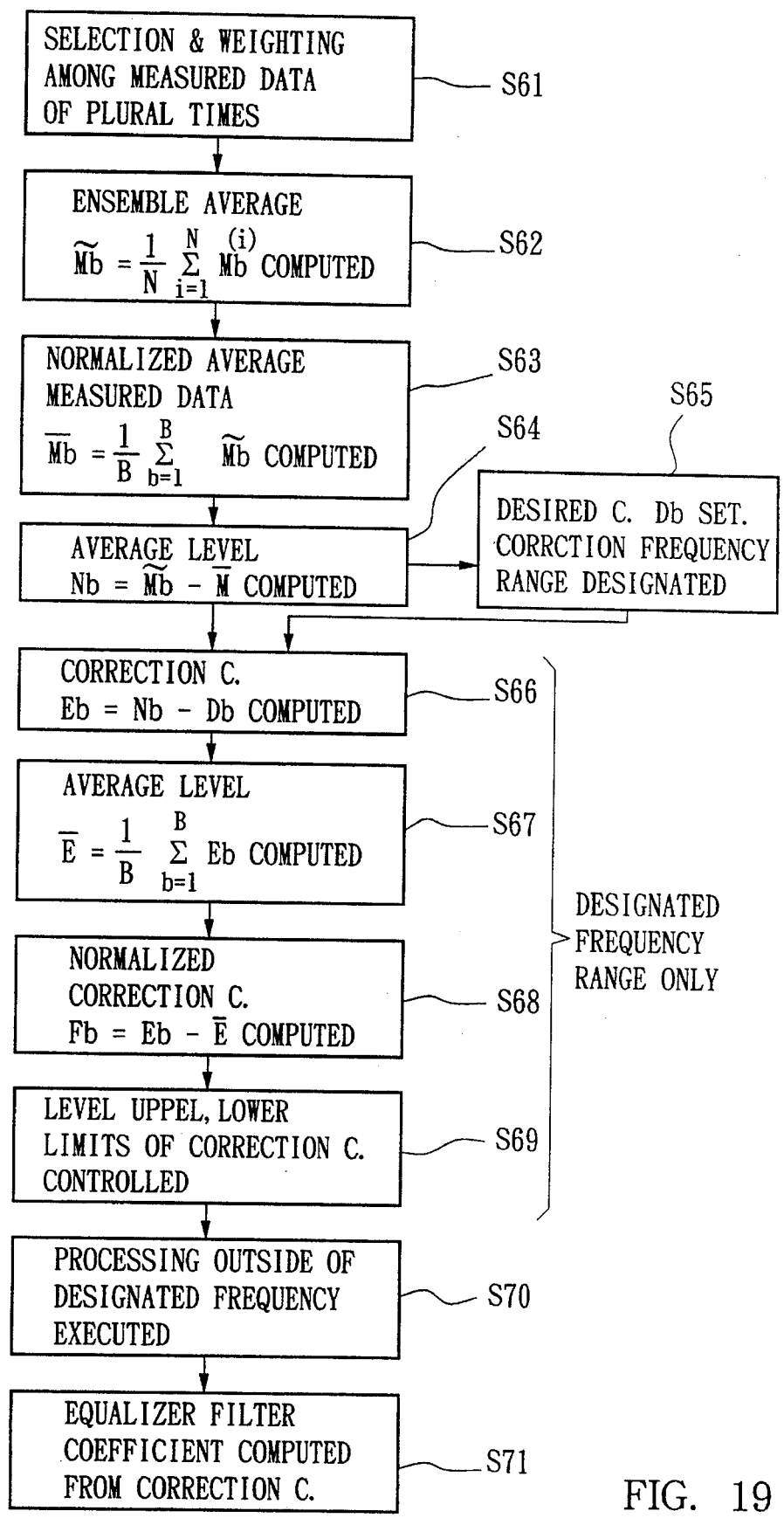
FIG. 19 is a flow chart showing an example of computation processing from obtaining of measured data to determination of a correction characteristic.

An example of a specific computing processing in respective stages from obtaining of measured data to determination of a final correction characteristic is shown in FIG. 19. Data used for computation of a measured characteristic is selected from among measured data of plural measuring times stored in the band data memory 126 of FIG. 1B (S61) and weighted. The selected data is designated $M_b^{(i)}$ where i represents a measuring number and is any number from 1 to N, and b represents a band number of bands obtained by dividing the entire frequency range and is any number from 1 to B. B in this example is 31 or 61.

Upon selection of plural data, $$\bar{M}_b = \frac{1}{N} \sum_{i=1}^{N} M_b^{(i)}$$

is computed as ensemble average each band by the ensemble average circuit 130 (S62). Then, as an average value of ensemble average of the all bands, $$\bar{M} = \frac{1}{B} \sum_{b=1}^{B} M_b^{(i)}$$

is computed (S63). Further, as normalized average measured data, $N_b = \bar{M}_b - \bar{M}$ is computed (S64) and this value is displayed as a measured characteristic in the display section 40. This measured characteristic Nb is spline interpolated to provide continuous data. By the normalizing processing, the average value of the measured characteristic Nb is always adjusted to 0 dB, so that the measured characteristic display in the display section 40 comes always to substantially the same level even if the level of the collected sound is small. This facilitates comparison of the measured characteristic with the desired characteristic.

Upon setting of the desired characteristic Db by the operation by the operating person (S65), $E_b = N_b - D_b$ is computed as the correction characteristic by the computing circuit 142 (S66). The measured characteristic Nb is data after being spline interpolated. As an average value of this correction characteristic of all bands, $$\bar{E} = \frac{1}{B} \sum_{b=1}^{B} E_b$$

is computed (S67). Further, the computing circuit 142 computes, as a normalized correction characteristic, $F_b = E_b - \bar{E}$ (S68). By the normalization, the average value of the correction characteristic Fb is always adjusted to 0 dB, so that a sound before and after the correction changes only in the quality of sound but not in the volume of sound.

The processing for restricting the upper and lower values of the level shown in FIG. 18D is applied to the correction characteristic Fb thus obtained (S69). The processing of steps S66 to S69 is performed only within the designated frequency range of FIG. 18E. As to the frequency range outside of this designated frequency range, a processing for making the correction characteristic 0 dB flat is performed separately (S70). The finally determined correction characteristic is subjected to a routine for computing filter coefficients for convolution (equalizer) (S71).

(6) Computation of equalizer filter cofficients

The algorithm of the FIR filter for acoustic characteristic correction has both benefits and defects and is not usable for some applications. For this reason, in the present embodiment, either one of a linear phase filter and a minimum phase filter is selectively used by an operation by the operating person. The impulse responses of the linear phase filter and the minimum phase filter are, for example, as shown in FIGS. 6D and 6E. Benefits and defects of the two filters are shown in the following table.

|  | Transmission characteristic | Amount of delay | Easyness of computing filter co-efficients |
| --- | --- | --- | --- |
| Linear phase filter | good | large | easy |
| Minimum phase filter | normal | small | normal |

According to this comparison, the linear phase filter has a good transmission characteristic and is easy for computing filter coefficients but its amount of delay is too large (see FIG. 6D) and, therefore, is not usable in a case where real time transmission is required as in public address and mixing down (because there is a delay between a live sound and an equalized sound). The minimum phase filter is inferior to the linear phase filter in the transmission characteristic and easiness in computation of filter coefficients but has little delay (see FIG. 6E) and, therefore, it is suited for a case where real time transmission is required. Accordingly, the operating person can select one of the algorithms depending upon application of the device, so that a single device can be used for various purposes.

An example of processing for computing, by an equalizer filter coefficient computing circuit 144, impulse response of the linear phase filter and impulse response of the minimum phase filter from the correction characteristic by utilizing, for example, Fourier inverse transform will now be described.

(A) Computation of impulse response of the linear phase filter

In all frequency range, the phase is made the linear phase and is 0. This state is obtained by the following processing:

i) The correction characteristic is once divided in band (e.g., by ⅓ octave pitch to ¹/₁₂ octave pitch) and power-mean value for each band is obtained.

ii) By using the power-mean values thus obtained as values at center frequency of the respect ire bands, interpolation such as spline interpolation is made so as to provide data at 4096 points for which Fourier transform is applicable.

iii) Fourier inverse transform is applied to complex data in which a real number portion (corresponding to the amplitude term) is constituted by the data obtained by ii) above and an imaginary number portion corresponding to the phase term) is all 0.

iv) Since the real number portion of the complex data obtained by iii) above directly constitutes the linear phase impulse response, this is set as the coefficients of the FIR filter (i.e., the convolution operator 34).

(B) Computation of impulse response of the minimum phase filter

A phase characteristic corresponding to the frequency characteristic is obtained by Hilbert transform. More specifically, this phase characteristic is obtained in the following processing:

i) The frequency characteristic is once divided in band e.g., by ⅓ octave pitch to ¹/₁₂ octave pitch) and power-mean value for each band is computed.

ii) By using the power-mean values thus obtained as values at the center frequency of the respective bands, interpolation is made by, for example, spline interpolation, to provide data at 4096 points for which Fourier transform is applicable.

iii) Hilbert transform is applied to comples data in which a real number portion is constituted by the data obtained by ii) above and an imaginary number portion is all 0 to provide comlex data which conforms to the corrected characteristic curve and constitutes a minimum phase system. This complex data is imparted with a necessary phase component in the imaginary number portion.

iv) Fourier inverse transform is applied to the complex data obtained in iii) above.

v) The real number portion of the complex data thus obtained constitutes the minimum phase impulse response and this impuse response is set as the coefficients of the FIR filter (i.e., the convolution operator 34).

(C) Computation of impulse response of the complex phase filter

A complex phase filter is set to the following characteristic.

(a) A high frequency range (exceeding f2) is a linear phase within a determined range of delay.

(b) A low frequency range (below f1) is a minimum phase characteristic.

(c) An intermediate range (f1 to f2) exhibits a characteristic which gradually changes from the minimum phase to the linear phase. Such characteristic is obtained in the following manner:

i) The frequency characteristic is once divided in band (e.g., by 1/3 octave pitch to 1/12 octave pitch) and power-mean value for each band is computed.

ii) By using the power-mean values thus obtained as values at the center frequency of the respective bands, interpolation is made by, for example, spline interpolation, to provide data at 4096 points for which Fourier transform is applicable.

iii) Hilbert transform is applied to complex data in which a real number portion is constituted by the data obtained by ii) above and an imaginary number portion is all 0 to provide complex data which conforms to the corrected characteristic curve and constitutes a minimum phase system. This complex data imparted with a necessary phase component in the imaginary number portion.

iv) The phase component obtained by iii) above is changed in such a manner that a frequency range below the lower switching frequency f1 remains unchanged, that the phase of a frequency range f is caused to gradually approach 0 by multiplying (f2−f)/(f2−f1), and that the phase of a frequency range above the upper switching frequency f2 is made 0.

v) Fourier inverse transform is applied to the complex data obtained in iii) above.

vi) The real number portion of the complex data thus contained constitutes the minimum phase impulse response and this impulse response is set as the coefficients of the FIR filter (i.e., the convolution operator 34). The values of the switching frequencies f1 and f2 are determined to, e.g., the following values in accordance with an allowable amount of delay:

In a case where the amount of delay is 10 msec:
the linear phase above 1 kHz, the minimum phase below 200 Hz In a case where the amount of delay is 5 msec:
the linear phase above 2 kHz, the minimum phase below 400 Hz.

Actual results of computation of the impulse responses of the linear phase filter, minimum phase filter and complex phase filter made in the above described manner will now be described.

Figure 28:
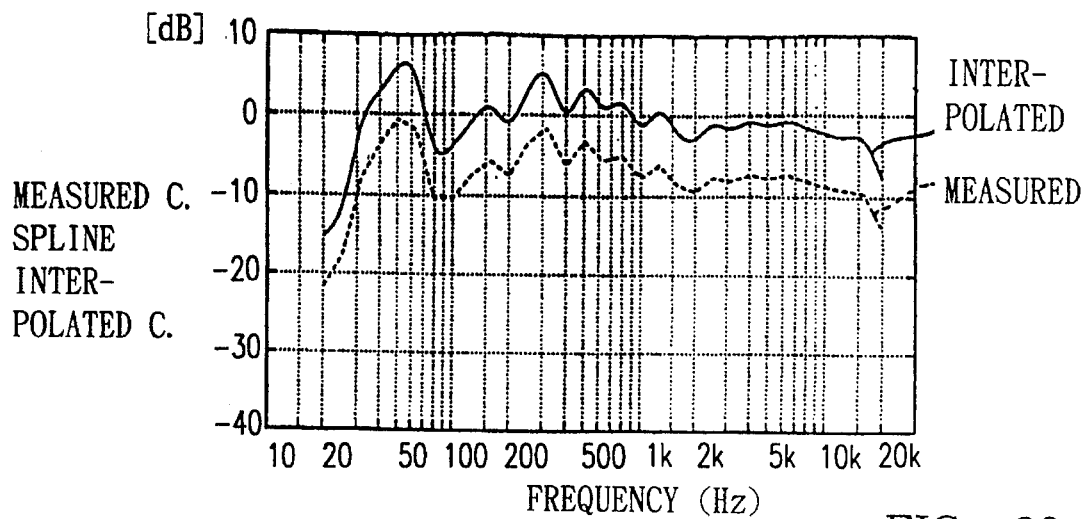
FIG. 28 is a graph show ing a measured characteristic (broken line) and a characteristic (solid line) obtain ed by spline interpolating the measured characteristic.
Figure 29:
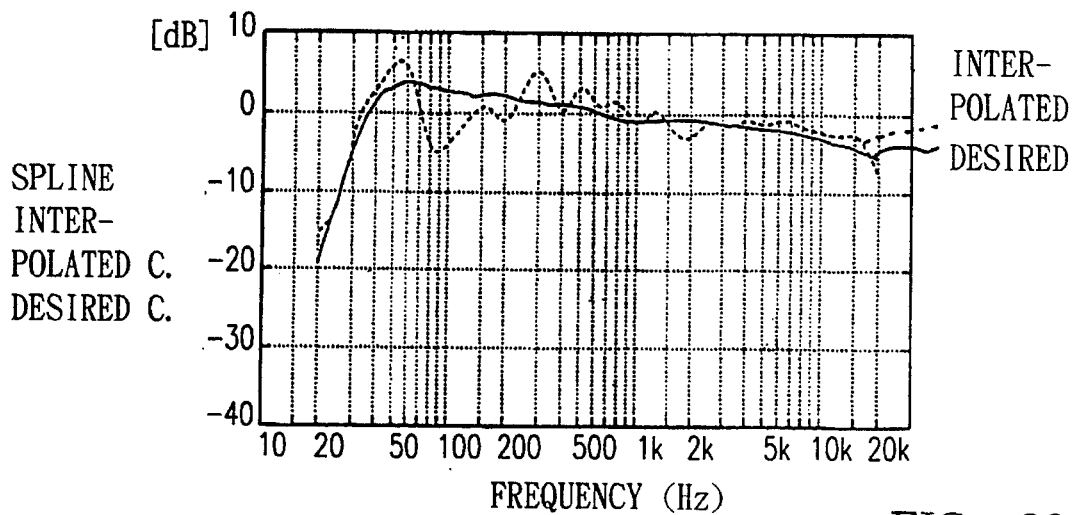
FIG. 29 is a graph showing the spline interpolated characteristic (broken line) of FIG. 28 and a desired characteristic (solid line)
Figure 30:
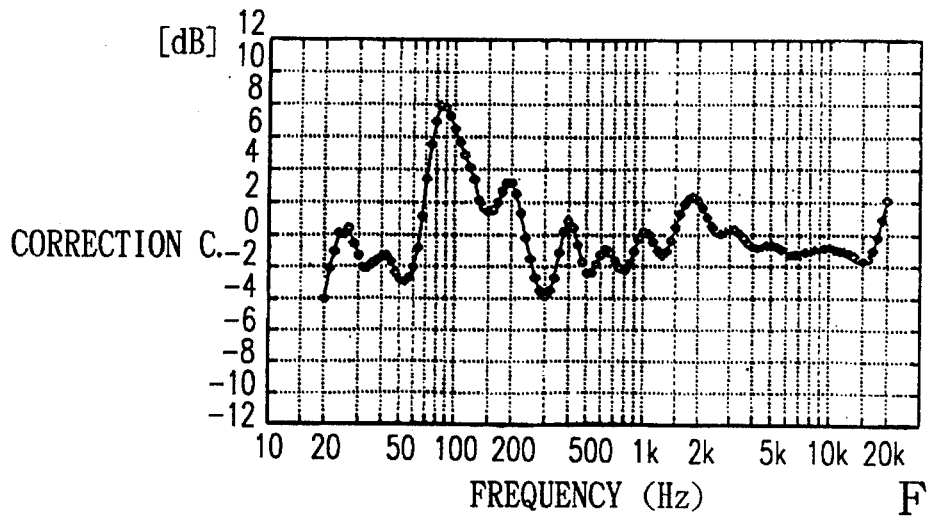
FIG. 30 is a graph showing a correction characteristic obtained as a difference between the two characteristics.

FIG. 28 shows a measured characteristic (shown by a broken line) and a characteristic (shown by a solid line) obtained by spline interpolating the measured characteristic. FIG. 29 shows the spline interpolated characteristic of FIG. 29 (shown by a broken line) and a desired characteristic (shown by a solid line). FIG. 30 shows a correction characteristic obtained as a difference between the two characteristics of FIG. 29.

Figure 31A:
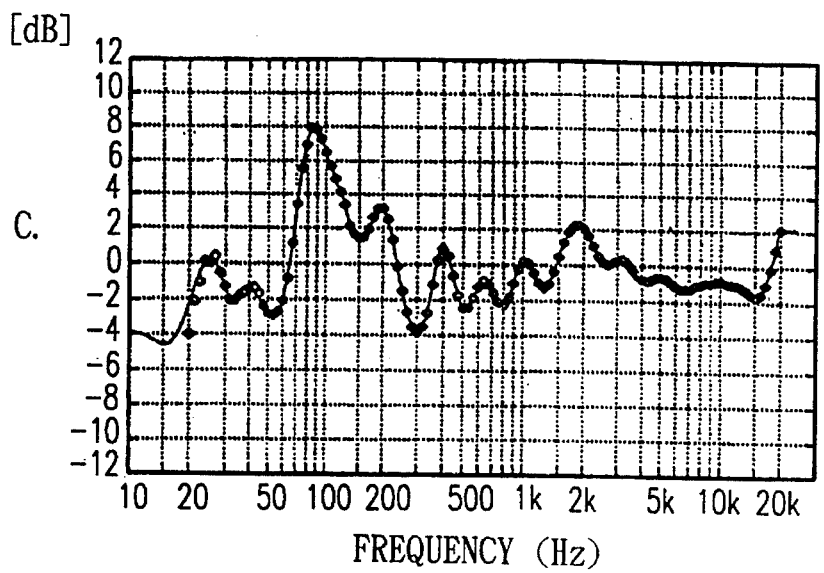
FIGS. 31A to 31C are graphs showing results of computation of the correction characteristic by a linear phase filter.
Figure 31B:
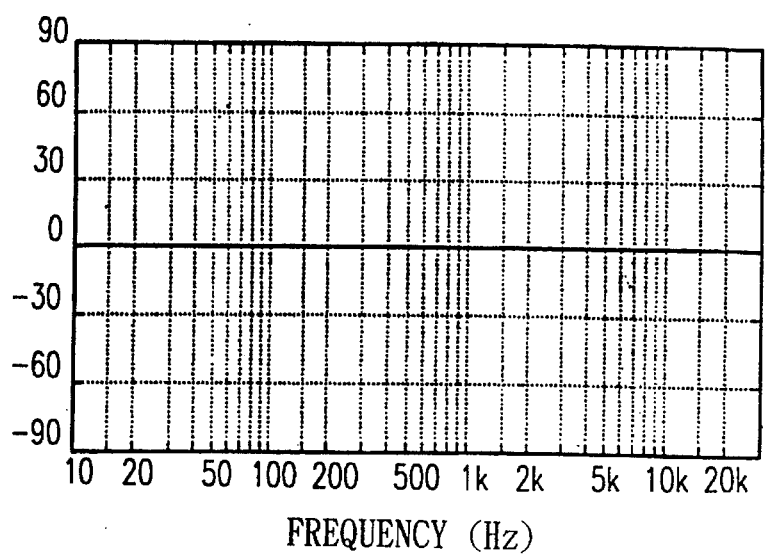
Figure 31C:
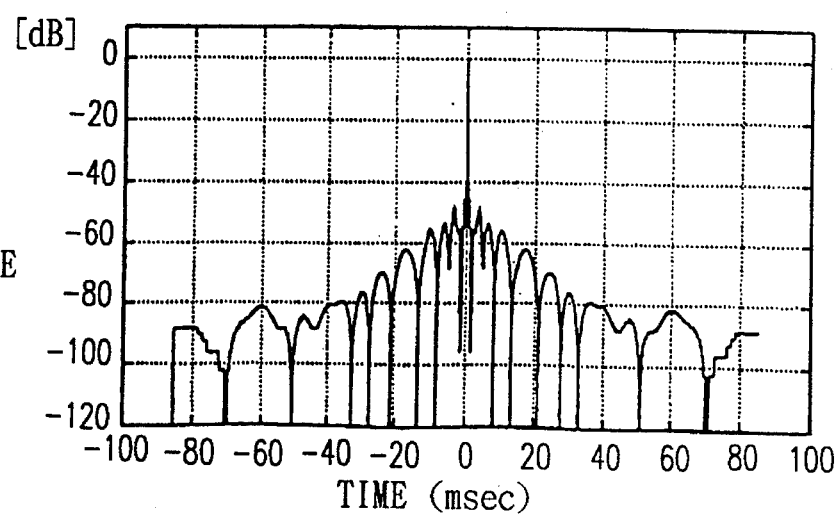
Figure 32A:
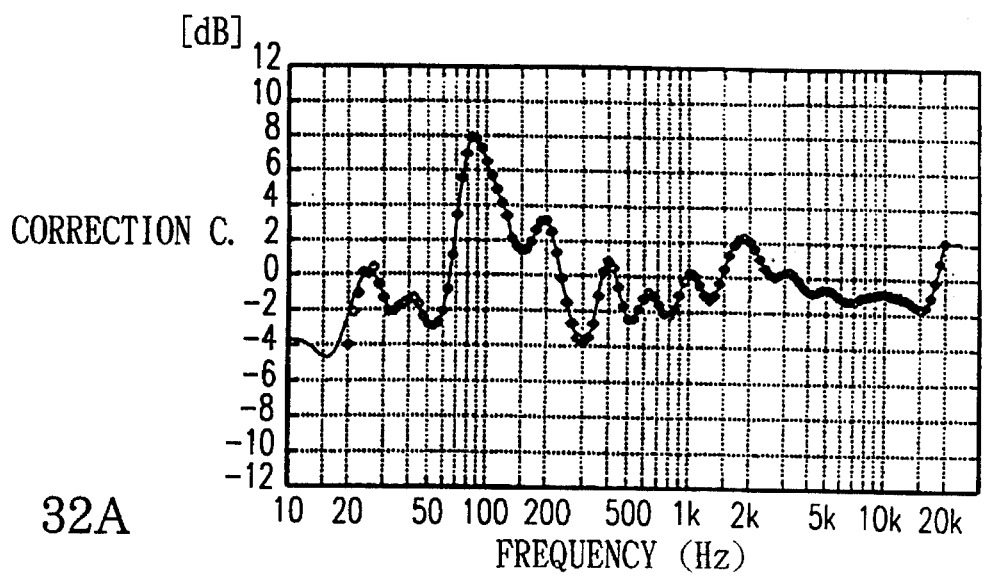
FIGS. 32A to 32C are graphs showing results of computation of the correction characteristic by a minimum phase filter.
Figure 32B:
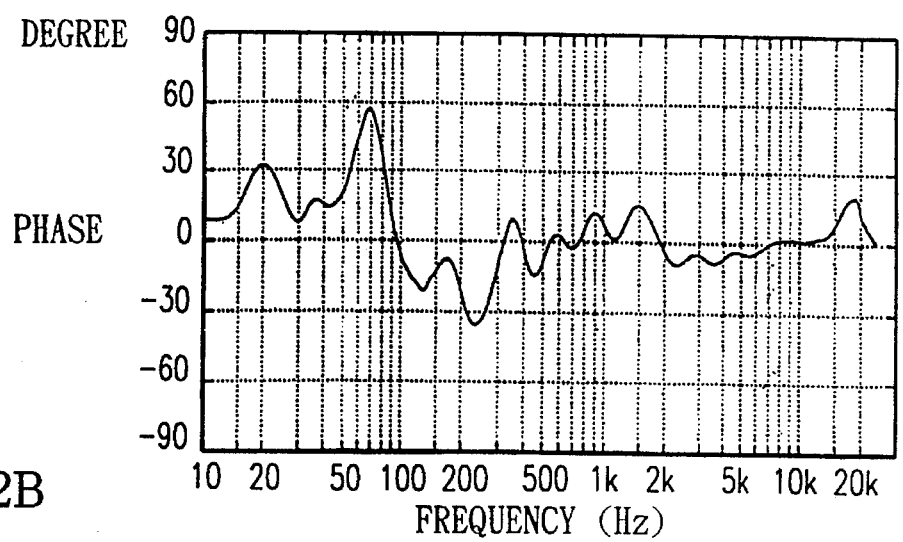
Figure 32C:
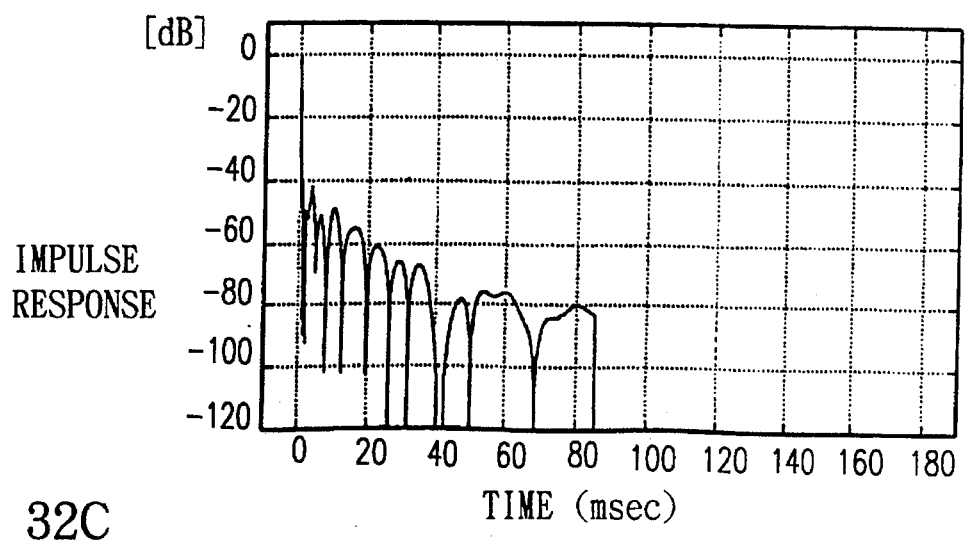
Figure 33A:
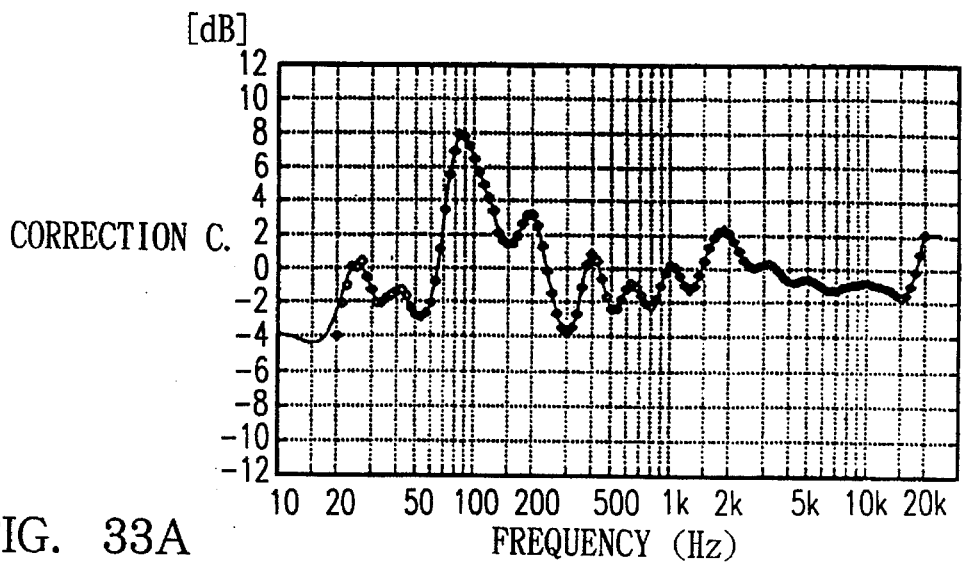
FIGS. 33A to 33C are graphs showing results of computation of the correction characteristic by a complex phase filter (in the case of the delay of 5 msec)
Figure 33B:
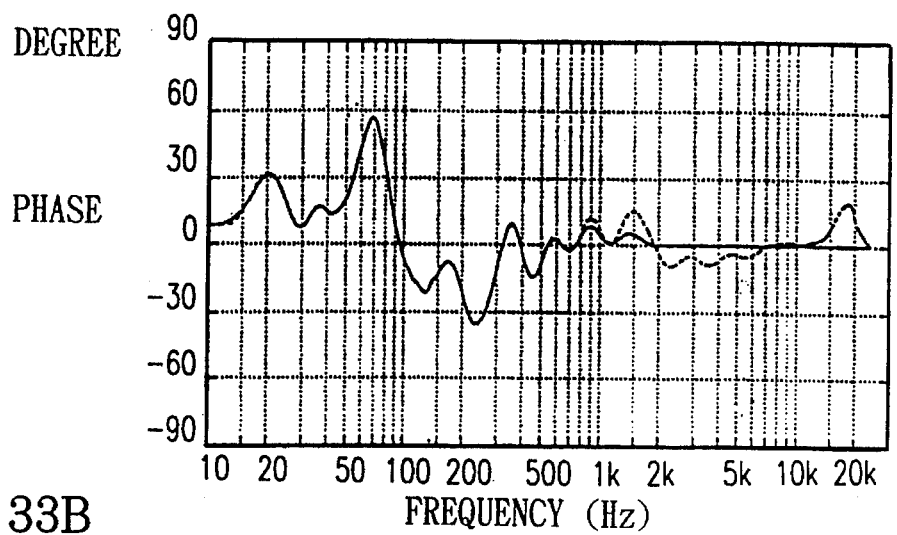
Figure 33C:
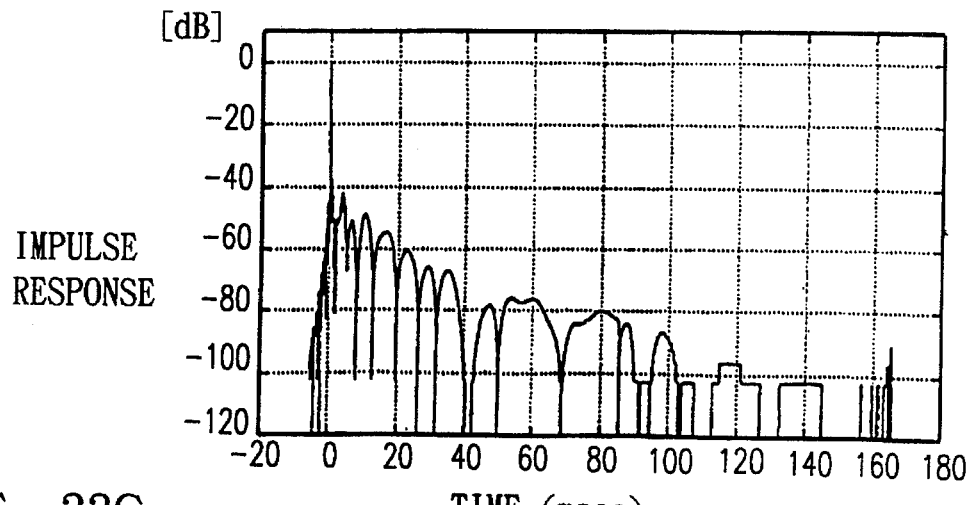
Figure 34A:
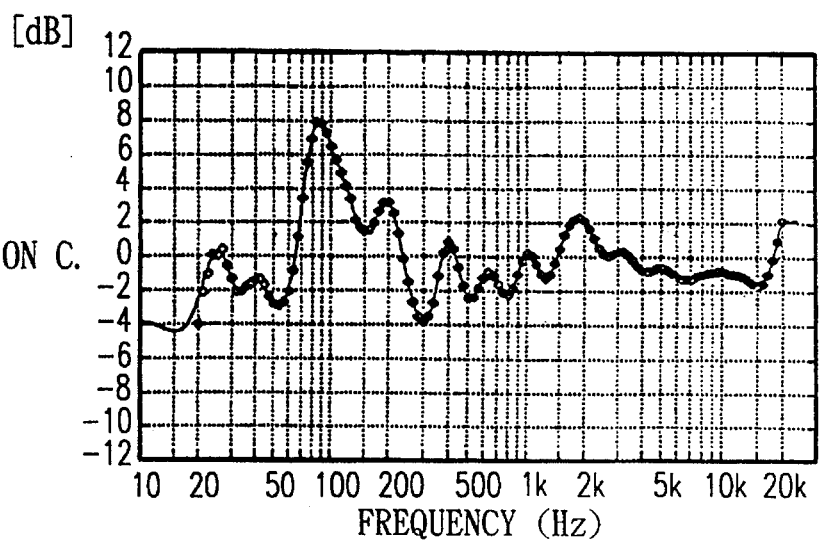
FIGS. 34A to 34C are graphs showing results of computation of the correction characteristic by a complex phase filter (in the case of the delay of 10 msec)
Figure 34B:
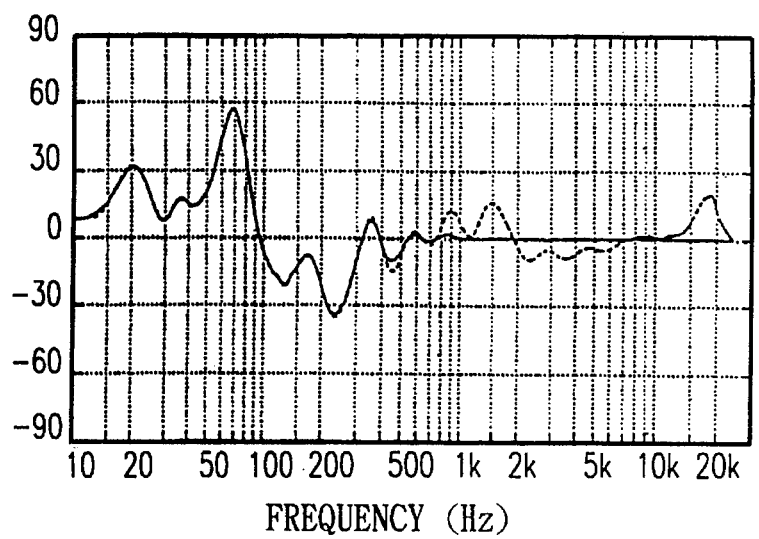
Figure 34C:
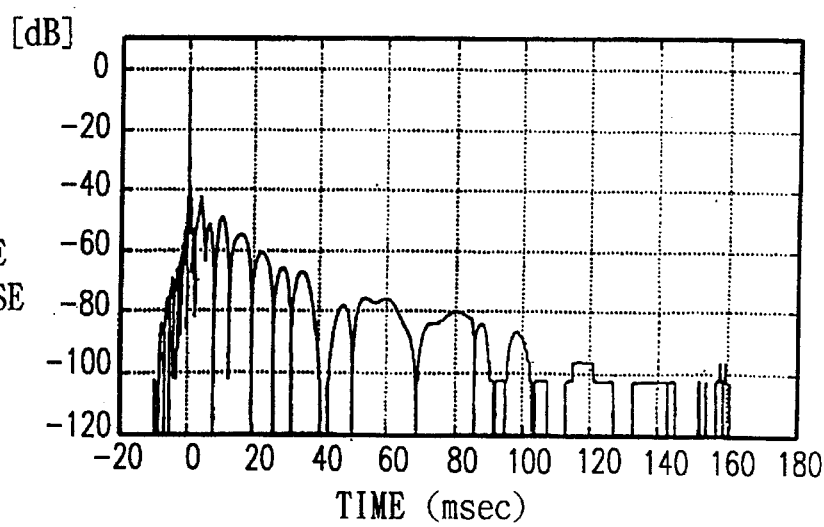

Results of computation of the correction characteristic of FIG. 30 by the linear phase filter are shown in FIGS. 31A to 31C. Results of computation of the correction characteristic of FIG. 30 by the minimum phase filter are shown in FIGS. 32A to 32C. Results of computation of the correction characteristic of FIG. 30 by the complex phase filter are shown in FIGS. 33A to 33C (in the case of the delay of 5 msec) and FIGS. 341A to 34C (in the case of the delay of 10 msec).

In addition to the linear phase filter, minimum phase filter and complex phase filter, filter or filters of other characteristics may be provided and a desired one among these filters may be selected.

(7) Confirmation of the correction characteristic

Figures 20C, 20D:
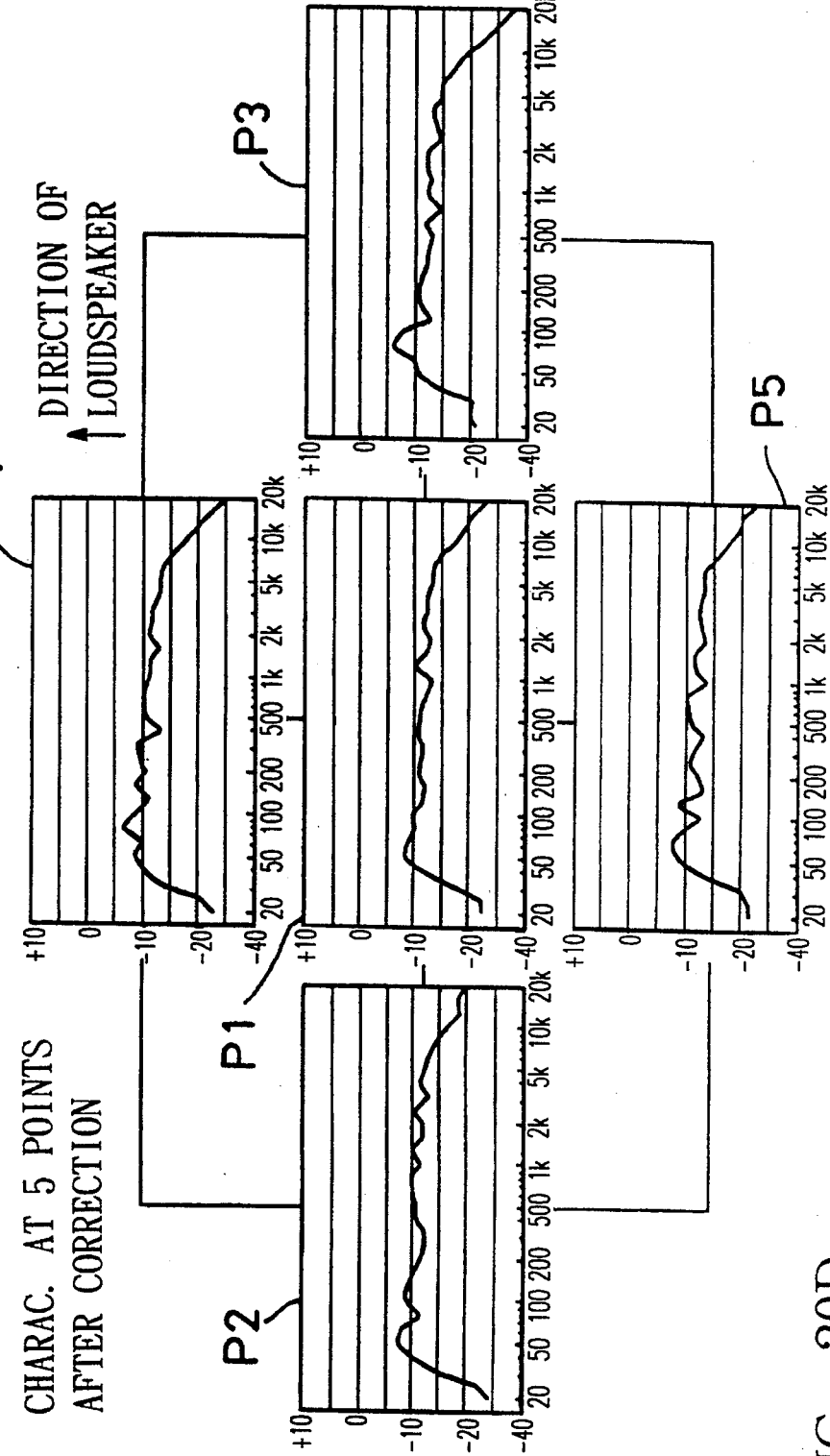

Results of confirmation of the correction effect by setting the coefficients of the FIR filter in the manner described above are shown in FIGS. 20A to 20D. FIG. 20A shows results of initial measurement (i.e., without equalizing) at the measuring points P1 to P5 (FIG. 5A). FIG. 20B shows a measured characteristic obtained by ensemble averaging measured data at the measuring points P1 to P5 weighted with the same weight and a desired characteristic set as desired by the operating person. FIG. 20C shows a correction characteristic obtained as difference between the measured characteristic and the desired characteristic of FIG. 20B. FIR filter coefficients computed on the basis of this correction characteristic are set in the convolution operator 34 to constitute an equalizer. A measuring signal (band signal or TSP signal) is reproduced through this equalizer and measured again. Results of the measurement at the respective measuring points P1 to P5 are shown in FIG. 20D. According to FIG. 20D, a considerable correction in the characteristic is made at any measuring point compared with the state before correction shown in FIG. 20A. Thus, it has been confirmed that a proper correction has been made with respect to the area including these measuring points.

(8) Playback of music

By inputting a musical source instead of a measuring signal and reproducing the musical source through the equalizer (i.e., convolution operator 34), music enjoyed with a desired can be reproduction characteristic.

In the above described embodiment, in computing a measured characteristic either by the band signal method or by the TSP method, a measured characteristic is computed by applying the spline interpolation, for example, to an average value obtained for each divided band and, further, the band division is made again when FIR filter coefficients realizing the correction characteristic are computed. The invention however is not limited to this method.

Figure 22:
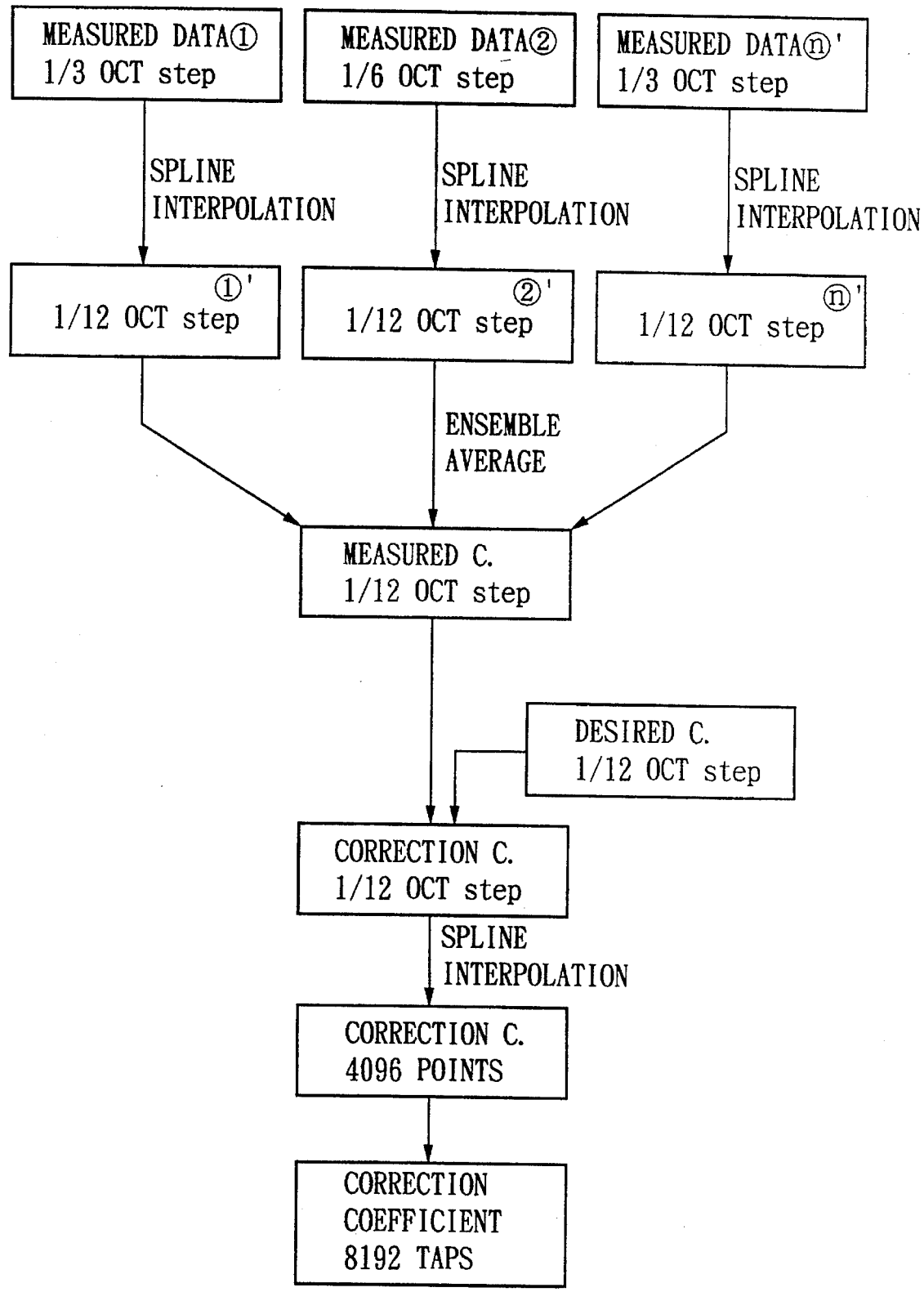
FIG. 22 is a flow chart showing another method for obtaining a correction characteristic.

In a case where obtained measured characteristic is to be expressed with a high precision or the measured characteristic is to be utilized for other purpose, data of a divided band itself cannot be used conveniently. For other purposes, however, by performing spline interpolation in computing a correction characteristic, an interpolation processing in computation of a measured characteristic in a prior stage can be omitted or simplified. FIG. 22 shows an example in which interpolation in computation of a measured characteristic is simplified. In this example, interpolation in computation of a measured characteristic is limit ed to spline interpolation performed to change data of the ⅓ octave band or ⅙ octave band to data of the ¹⁄₁₂ octave band. Thereafter, ensemble averaging is performed on the ¹⁄₁₂ octave band data and a desired characteristic is set and provided in the form of the ¹⁄₁₂ octave band data. The correction characteristic computation is also made initially in the form of the ¹⁄₁₂ octave band data. Thereafter, spline interpolation is performed with respect to this correction characteristic of ¹⁄₁₂ octave band data obtain a correction characteristic consisting of 4096 points and this correction characteristic is subjected to Fourier inverse transform to obtain FIR filter coefficients for correction. In other words, correction information is computed as a correction value for each frequency divided band on the basis of a measured characteristic computed for each frequency divided band and a desired characteristic set for each frequency divided band and, by treating the correction value computed for each band as a value at the center frequency of each band, values between the center frequencies of the respective bands are obtained by interpolation to provide a correction characteristic. By this arrangement, occurrence of a large peak dip in the correction characteristic can be prevented and occurrence of an unnatural impression in hearing due an excessive correction can be prevented. Moreover, an amount of computation can be greatly reduced as compared with a case where a correction characteristic is directly computed on the basis of a measured characteristic obtained by interpolating 4096 points and no significant deterioration in a finally obtained correction characteristic.

In the above described embodiment, in computing a measured characteristic either by the band signal method or by the TSP method, a measured characteristic is computed by applying the spline interpolation, for example, to an average value obtained for each divided band and, further, the band division is made again when FIR filter coefficients realizing the correction characteristic are computed. The invention however is not limited to this method.

In a case where obtained measured characteristic is to be expressed with a high precision or the measured characteristic is to be utilized for other purpose data of a divided band itself cannot be used conveniently. For other purposes, however, by performing spline interpolation in computing a correction characteristic, an interpolation processing in computation of a measured characteristic in a prior stage can be omitted or simplified. FIG. 22 shows an example in which interpolation in computation of a measured characteristic is simplified. In this example, interpolation in computation of a measured characteristic is limited to spline interpolation performed to change data of the ⅓ octave band or ⅙ octave band to data of the ¹⁄₁₂ octave band. Thereafter, ensemble averaging is performed on the ¹⁄₁₂ octave band data and a desired characteristic is set and provided in the form of the ¹⁄₁₂ octave band data. The correction characteristic computation is also made initially in the form of the ¹⁄₁₂ octave band data. Thereafter, spline interpolation is performed with respect to this correction characteristic of ¹⁄₁₂ octave band data to obtain a correction characteristic consisting of 4096 points and this correction characteristic is subjected to Fourier inverse transform to obtain FIR filter coefficients for correction. In other words, correction information is computed as a correction value for each frequency divided band on the basis of a measured characteristic computed for each frequency divided band and a desired characteristic set for each frequency divided band and, by treating the correction value computed for each band as a value at the center frequency of each band, values between the center frequencies of the respective bands are obtained by interpolation to provide a correction characteristic. By this arrangement, occurrence of a large peak dip in the correction characteristic can be prevented and occurrence of an unnatural impression in hearing due to an excessive correction can be prevented. Moreover, an amount of computation can be greatly reduced as compared with a case where a correction characteristic is directly computed on the basis of a measured characteristic obtained by interpolating 4096 points and no significant deterioration in a finally obtained correction characteristic.

Figure 21:
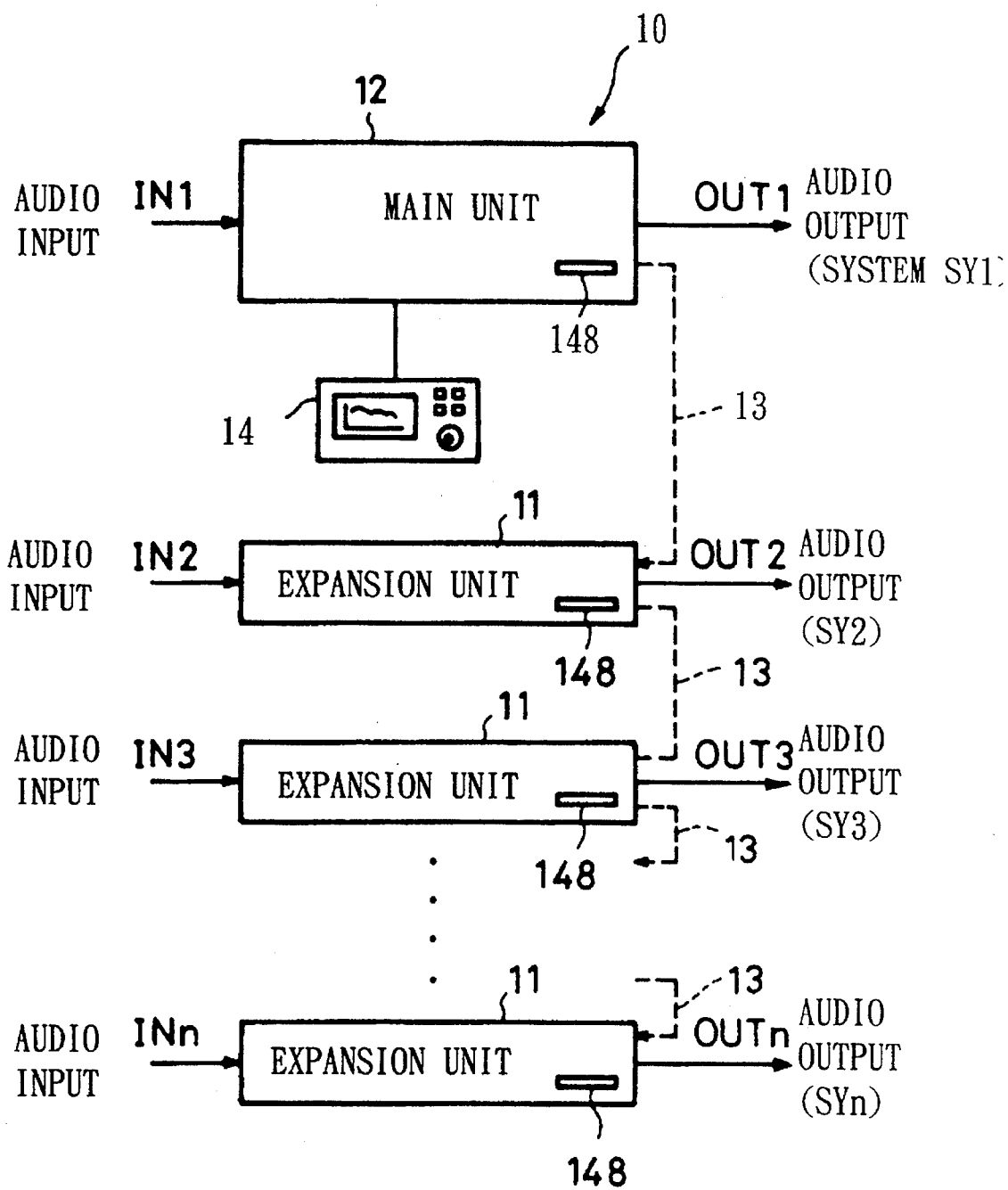
FIG. 21 is a block diagram showing an embodiment of the invention applied to a case where many loudspeaker systems exist.

In a case where many loudspeaker systems exist as, for example, in a hall, a correction device is required for each of these systems. If the acoustic characteristic correction device 10 having the response characteristic measuring function shown in FIGS. 1 and 2 is provided for each of these systems, it will require a high installation cost. In this case, as shown in FIG. 21, one system of the acoustic characteristic correction device 10 having the response characteristic measuring function may be provided and expansion units 11 may be used for other systems. For measuring a response characteristic in systems SY1 to SYn, each of the systems SY1 to SYn is connected one by one to the acoustic characteristic correction device 10 to perform measurement of each system and results of the measurement are stored in the main unit 12 of the device 10. Setting of a desired characteristic, computation of a correction characteristic and computation of coefficients of an FIR filter (equalizer) for each of the systems SY1 to SYn are made in the device 10. Results of the computation of the FIR filter coefficients are transferred to the expansion units 11 of each corresponding system by means of a communication cable 13 or a RAM card 148. By setting the transferred FIR filter coefficients in the convolution operator 34 in each expansion unit 11, equalizing according to a desired characteristic can be achieved. Since the structure for measuring a characteristic, setting a desired characteristic, computing and correcting a correction characteristic and computing FIR filter coefficients is not necessary in the expansion unit 11, the structure can be simplified with resulting reduction in the installation cost.

In the above described embodiment, the frequency characteristic of a measuring microphone has been described as being of a flat characteristic. When the characteristic of the microphone is not flat, a characteristic which is reverse to the characteristic of the microphone may be imparted to measured data whereby the same measured result as if a microphone of a flat characteristic was used can be obtained and so an inexpensive microphone may be used in the measurement.

What is claimed is:

1. An acoustic characteristic correction device comprising:

desired frequency-amplitude (gain) characteristic setting means for setting, on the basis of an operation by an operating person, a desired frequency-amplitude (gain) characteristic of a response characteristic in a reproduction system including a sound field;

desired frequency-amplitude (gain) characteristic display means for graphically displaying the set desired frequency-amplitude (gain) characteristic to assist the operation by the person;

measured frequency-amplitude (gain) characteristic input means for inputting information of a measured frequency-amplitude(gain) characteristic of the response characteristic of the reproduction system including the sound field;

correction frequency-amplitude (gain) characteristic computing means for computing a correction frequency-amplitude (gain) characteristic for realizing the desired frequency-amplitude (gain) characteristic on the basis of tile desired frequency-amplitude (gain) characteristic and the measured frequency-amplitude (gain) characteristic; and correction frequency-amplitude (gain) characteristic imparting means for imparting the computed correction frequency-amplitude (gain) characteristic to a sound signal to be reproduced.

2. A device as defined in claim 1, further comprising measured frequency-amplitude (gain) characteristic display means for graphically displaying the measured frequency-amplitude (gain) characteristic.

3. A device as defined in claim 2, wherein said desired frequency-amplitude (gain) characteristic display means and said measured frequency-amplitude (gain) characteristic display means display the desired frequency-amplitude (gain) characteristic and the measured frequency-amplitude (gain) characteristic so that these characteristics are superposed one upon the other on a common axis of a graph.

4. A device as defined in claim 1, further comprising correction frequency-amplitude (gain) characteristic display means for graphically displaying the correction frequency-amplitude (gain) characteristic.

5. A device as defined in claim 1, wherein said desired frequency-amplitude (gain) characteristic setting means comprises:

a non-volatile memory for holding a plurality of the desired frequency-amplitude (gain) characteristics; and desired frequency-amplitude,(gain) characteristic selection means for selectively reading out one of the desired frequency-amplitude (gain) characteristics held by the non-volatile memory on the basis of an operation by the operating person for setting the selected frequency-amplitude (gain) characteristic as the desired frequency-amplitude (gain) characteristic.

6. A deface as defined in claim 5, further comprising desired frequency-amplitude (gain) characteristic correction means for correcting the selected desired frequency-amplitude (gain) characteristic by operation of the operating person.

7. A device as defined in claim 6, further comprising corrected desired frequency-amplitude (gain) characteristic storage means for storing the desired frequency-amplitude (gain) characteristic which has been corrected by said desired frequency-amplitude (gain) characteristic correction means and wherein said desired frequency-amplitude (gain) characteristic selection means reads out, on the basis of an operation by the operating person, a desired one from among the corrected desired frequency-amplitude (gain) characteristic stored in said corrected desired frequency-amplitude (gain) characteristic storage means and the desired frequency-amplitude (gain) characteristics stored in said non-volatile memory for setting the selected frequency-amplitude (gain) characteristic as the desired frequency-amplitude (gain) characteristic.

8. A device as defined in claim 1, further comprising correction frequency-amplitude (gain) characteristic correction means for correcting, on the basis of an operation by the operating person for designating a correction frequency range, the frequency-amplitude (gain) characteristic outside of said range to a frequency-amplitude (gain) characteristic which is free from correction.

9. A device as defined in claim 1, further comprising:

measuring signal output means for outputting a measuring signal imparted with or without the correction frequency-amplitude (gain) characteristic on the basis of an operation by the operating person; and response characteristic measuring means for obtaining information of the measured the frequency-amplitude (gain) characteristic by inputting the output measuring signal which has been reproduced by a loudspeaker and collected by a microphone and thereby measuring the response characteristic of the reproduction system including the sound field.

10. An acoustic characteristic correction device comprising:

measuring signal output means for outputting a measuring signal;

response characteristic measuring means for obtaining information of a measured frequency-amplitude (gain) characteristic by inputting the output measuring signal which has been reproduced by a loudspeaker and collected by a microphone and thereby measuring a response characteristic of a reproduction system including a sound field;

desired frequency-amplitude (gain) characteristic setting means for setting, on the basis of an operation by an operating person, a desired frequency-amplitude (gain) characteristic of the response characteristic in the reproduction system including the sound field;

correction frequency-amplitude (gain) characteristic computing means for computing a correction frequency-amplitude (gain) characteristic of the response characteristic for realizing the desired frequency-amplitude (gain) characteristic on the basis of the desired frequency-amplitude (gain) characteristic and the measured frequency-amplitude (gain) characteristic; and correction frequency-amplitude (gain) characteristic imparting means for imparting the computed correction frequency-amplitude (gain) characteristic to a sound signal to be reproduced, said response characteristic measuring means comprising:
measured result storing means for storing results of measurement at plural points for plural measuring times with respect to the same measuring signal; and average frequency-amplitude (gain) characteristic computing means for computing an average value of the stored results of measurement to obtain the measured frequency-amplitude (gain) characteristic information.

11. An acoustic characteristic correction device comprising:

measuring signal output means for outputting a measuring signal;

response characteristic measuring means for obtaining information of a measured frequency-amplitude (gain) characteristic by inputting the output measuring signal which has been reproduced by a loudspeaker and collected by a microphone and thereby measuring a response characteristic of a reproduction system including a sound field:

desired frequency-amplitude (gain) characteristic setting means for setting, on the basis of an operation by an operating person, a desired frequency-amplitude (gain) characteristic of the response characteristic in the reproduction system including the sound field;

correction frequency-amplitude (gain) characteristic computing means for computing a correction frequency-amplitude (gain) characteristic of the response characteristic for realizing the desired frequency-amplitude (gain) characteristic on the basis of the desired frequency-amplitude (gain) characteristic and the measured frequency-amplitude (gain) characteristic; and correction frequency-amplitude (gain) characteristic imparting means for imparting the computed correction frequency-amplitude (gain) characteristic to a sound signal to be reproduced, said response characteristic measuring means comprising:
measured result storing means for storing results of measurement at plural points for plural measuring times with respect to the same measuring signal; and average frequency-amplitude (gain) characteristic computing means for computing an average value of the stored results of measurement to obtain the measured frequency-amplitude (gain) characteristic information; and measured result selection means for selecting, for the computation of the average value, one of the results of measurement at plural points for plural measuring times stored in said measured result storing means which satisfies a predetermined condition or which has been selected by an operation by the operating person.

12. An acoustic characteristic correction device comprising:

measuring signal output means for outputting a measuring signal;

response characteristic measuring means for obtaining information of a measured frequency-amplitude (gain) characteristic by inputting the output measuring signal which has been reproduced by a loudspeaker and collected by a microphone and thereby measuring a response characteristic of a reproduction system including a sound field;

desired frequency-amplitude (gain) characteristic setting means for setting, on the basis of an operation by an operating person, a desired frequency-amplitude (gain) characteristic of the response characteristic in the reproduction system including the sound field;

correction frequency-amplitude (gain) characteristic computing means for computing a correction frequency-amplitude (gain) characteristic of the response characteristic for realizing the desired frequency-amplitude (gain) characteristic on the basis of the desired frequency-amplitude (gain) characteristic and the measured frequency-amplitude (gain) characteristic; and correction frequency-amplitude (gain) characteristic imparting means for imparting the computed correction frequency-amplitude (gain) characteristic to a sound signal to be reproduced, said response characteristic measuring means comprising:
measured result storing means for storing results of measurement at plural points for plural measuring times with respect to the same measuring signal; and average frequency-amplitude (gain) characteristic computing means for computing an average value of the stored results of measurement to obtain the measured frequency-amplitude (gain) characteristic information; and weighting means for performing a predetermined weighting or a weighting set by an operation of the operating person with respect to the results of measurement at plural points for plural measuring times for outputting the weighted results of measurement for the computation of the average value.

13. An acoustic characteristic correction device comprising:

measuring signal output means for outputting a measuring signal;

response characteristic measuring means for obtaining information of a measured frequency-amplitude (gain) characteristic by inputting the output measuring signal which has been reproduced by a loudspeaker and collected by a microphone and thereby measuring a response characteristic of a reproduction system including a sound field;

desired frequency-amplitude (gain) characteristic setting means for setting, on the basis of an operation by an operating person, a desired frequency-amplitude (gain) characteristic of the response characteristic in the reproduction system including the sound field;

correction frequency-amplitude (gain) characteristic computing means for computing a correction frequency-amplitude (gain) characteristic of the response characteristic for realizing the desired frequency-amplitude (gain) characteristic on the basis of the desired frequency-amplitude (gain) characteristic and the measured frequency-amplitude (gain) characteristic; and correction frequency-amplitude (gain) characteristic imparting means for imparting the computed correction frequency-amplitude (gain) characteristic to a sound signal to be reproduced;

said response characteristic measuring means comprising:
band average value computing means for computing an average value of result of measurement for each of frequency divided bands; and interpolation means for computing values between average values for the respective divided bands by interpolation by treating these average values computed for the respective divided bands substantially as values at center frequency of the respective divided bands and thereby obtaining the measured frequency-amplitude (gain) characteristic information.

14. A device as defined in claim 13, wherein the respective divided bands are divided so that an end portion of each of the divided bands is overlapped with an end portion of an adjacent one of the divided bands.

15. A device as defined in claim 13, further comprising means for generating measuring signals which are divided in the frequency with a time lag to divide the frequency into bands.

16. An acoustic characteristic correction device comprising:

measuring signal output means for outputting a measuring signal;

response characteristic measuring means for obtaining information of a measured frequency-amplitude (gain) characteristic by inputting the output measuring signal which has been reproduced by a loudspeaker and collected by a microphone and thereby measuring a response characteristic of a reproduction system including a sound field;

desired frequency-amplitude (gain) characteristic setting means for setting, on the basis of an operation by an operating person, a desired frequency-amplitude (gain) characteristic of the response characteristic in the reproduction system including the sound field;

correction frequency-amplitude (gain) characteristic computing means for computing a correction frequency-amplitude (gain) characteristic of the response characteristic for realizing the desired frequency-amplitude (gain) characteristic on the basis of the desired frequency-amplitude (gain) characteristic and the measured frequency-amplitude (gain) characteristic; and correction frequency-amplitude (gain) characteristic imparting means for imparting the computed correction frequency-amplitude (gain) characteristic to a sound signal to be reproduced;

said response characteristic measuring means comprising:

band average value computing means for computing an average value of result of measurement for each of frequency divided bands;

interpolation means for computing values between average values for the respective divided bands by interpolation by treating these average values computed for the respective divided bands substantially as values at center frequency of the respective divided bands and thereby obtaining the measured frequency-amplitude (gain) characteristic information; and means for generating a time stretched pulse (TSP) as the measuring signal and means for analyzing an impulse response collected by the microphone in frequency to divide result of analysis into bands.

17. An acoustic characteristic correction device comprising:

measuring signal output means for outputting a measuring signal;

response characteristic measuring means for obtaining information of a measured frequency-amplitude (gain) characteristic by inputting the output measuring signal which has been reproduced by a loudspeaker and collected by a microphone and thereby measuring a response characteristic of a reproduction system including a sound field;

desired frequency-amplitude (gain) characteristic setting means for setting, on the basis of an operating person, a desired frequency-amplitude (gain) characteristic of the response characteristic in the reproduction system including the sound field;

correction frequency-amplitude (gain) characteristic computing means for computing a correction frequency-amplitude (gain) characteristic of the response characteristic for realizing the desired frequency-amplitude (gain) characteristic on the basis of the desired frequency-amplitude (gain) characteristic and the measured frequency-amplitude (gain) characteristic; and correction frequency-amplitude (gain) characteristic imparting means for imparting the computed correction frequency-amplitude (gain) characteristic to a sound signal to be reproduced, said correction frequency-amplitude (gain) characteristic imparting means comprising:

band correction value computing means for computing, as a correction value for each of frequency divided bands, correction information of the response characteristic for realizing the desired frequency-amplitude (gain) characteristic on the basis of a measured frequency-amplitude (gain) characteristic computed for each of the frequency divided bands and a desired frequency-amplitude (gain) characteristic set for each of the frequency divided bands; and interpolation means for computing values between the correction values for the respective divided bands by interpolation by treating these correction values computed for the respective divided bands substantially as values at center frequency of the respective divided bands and thereby obtaining the measured frequency-amplitude (gain) characteristic information.

18. An acoustic characteristic correction device comprising:

measuring signal output means for outputting a time stretched pulse (TSP) signal as a measuring signal;

inverse filter means for obtaining impulse response by inputting the output measuring signal which has been reproduced by a loudspeaker and collected by a microphone and performing time compression by a convolution operation with an inverse frequency-amplitude (gain) characteristic of the TSP signal;

frequency conversion means for converting the obtained impulse response in frequency to obtain information of a measured frequency-amplitude (gain) characteristic of a reproduction system including a sound field;

desired frequency-amplitude (gain) characteristic setting means for setting, on the basis of an operation by an operating person, a desired frequency-amplitude (gain) characteristic of a response characteristic in the reproduction system including the sound field;

correction frequency-amplitude (gain) characteristic computing means for computing a correction frequency-amplitude (gain) characteristic of the response characteristic for realizing the desired frequency-amplitude (gain) characteristic on the basis of the desired frequency-amplitude (gain) characteristic and the measured frequency-amplitude (gain) characteristic; and correction frequency-amplitude (gain) characteristic imparting means for imparting the computed correction frequency-amplitude (gain) characteristic to a sound signal to be reproduced by a convolution operation, said correction frequency-amplitude (gain) characteristic imparting means performing the convolution operation by utilizing a convolution operator which is commonly used for the convolution operation by said inverse filter means.

19. A device as defined in claim 18, wherein said convolution operator has the number of stages necessary for imparting the correction frequency-amplitude (gain) characteristic and has not the number of stages necessary for the time compression by said inverse filter frequency-amplitude (gain) characteristic and performs the time compression on timewise divided basis.

20. An acoustic characteristic correction device comprising:

desired frequency-amplitude (gain) characteristic setting means for the setting, on the basis of an operation by an operating person, a desired frequency-amplitude (gain) characteristic of a response characteristic in a reproduction system including a sound field;

measured frequency-amplitude (gain) characteristic output means for outputting information of a measured frequency-amplitude (gain) characteristic of the response characteristic of the reproduction system including the sound field;

correction frequency-amplitude (gain) characteristic computing means for computing a correction frequency-amplitude (gain) characteristic for realizing the desired frequency-amplitude (gain) characteristic on the basis of the desired frequency-amplitude (gain) characteristic and the measured frequency-amplitude (gain) characteristic; and correction frequency-amplitude (gain) characteristic imparting means for imparting the computed correction frequency-amplitude (gain) characteristic to a sound signal to be reproduced;

said correction frequency-amplitude (gain) characteristic imparting means comprising:

filter coefficient computing means for computing, as filter coefficients for a convolution operation corresponding to said correction frequency-amplitude (gain) characteristic, filter coefficients of a filter frequency-amplitude (gain) characteristic selected from among a plurality of filter frequency-amplitude (gain) characteristics including at least a linear phase filter according to which the entire range of the reproduction system becomes a linear phase frequency-amplitude (gain) characteristic and a minimum phase filter according to which the entire range of the reproduction system becomes a characteristic having no delay; and a convolution operator for imparting said correction frequency-amplitude (gain) characteristic corresponding to the filter frequency-amplitude (gain) characteristic by performing a convolution operation using the filter coefficients of the selected filter frequency-amplitude (gain) characteristic with respect to the sound signal to be reproduced.

21. An acoustic characteristic correction device comprising:

desired frequency-amplitude (gain) characteristic setting means for the setting, on the basis of an operation by an operating person, a desired frequency-amplitude (gain) characteristic of a response characteristic in a reproduction system including a sound field;

measured frequency-amplitude (gain) characteristic output means for outputting information of a measuring frequency-amplitude(gain) characteristic of the response characteristic of the reproduction system including the sound field;

correction frequency-amplitude (gain) characteristic computing means for computing a correction frequency-amplitude (gain) characteristic for realizing the desired frequency-amplitude (gain) characteristic on the basis of the desired frequency-amplitude (gain) characteristic and the measured frequency-amplitude (gain) characteristic; and correction frequency-amplitude (gain) characteristic imparting means for imparting the computed correction frequency-amplitude (gain) characteristic to a sound signal to be reproduced;

said correction frequency-amplitude (gain) characteristic imparting means comprising:

filter coefficient computing means for computing, as filter coefficients for a convolution operation corresponding to said correction frequency-amplitude (gain) characteristic, filter coefficients of a filter frequency-amplitude (gain) characteristic selected from among a plurality of filter frequency-amplitude (gain) characteristics including at least a linear phase filter according to which the entire range of the reproduction system becomes a linear phase frequency-amplitude (gain) characteristic and a minimum phase filter according to which the entire range of the reproduction system becomes a characteristic having no delay; and a convolution operator for imparting said correction frequency-amplitude (gain) characteristic corresponding to the filter frequency-amplitude (gain) characteristic by performing a convolution operation using the filter coefficients of the selected filter frequency-amplitude (gain) characteristic with respect to the sound signal to be reproduced, wherein said filter coefficient computing means further has, as a selectable filter frequency-amplitude (gain) characteristic, a complex phase filter frequency-amplitude (gain) characteristic according to which a low frequency region in the reproduction system becomes a minimum phase frequency-amplitude (gain) characteristic, a high frequency region becomes a linear phase frequency-amplitude (gain) characteristic, and an intermediate frequency region becomes a frequency-amplitude (gain) characteristic which changes from the minimum phase frequency-amplitude (gain) characteristic to the linear phase frequency-amplitude (gain) characteristic.

22. An acoustic characteristic correction device comprising:

desired frequency-amplitude (gain) characteristic setting means for setting, on the basis of an operation by an operating person, a desired frequency-amplitude (gain) characteristic of a response characteristic in a reproduction system including a sound field;

measured frequency-amplitude (gain) characteristic output means for outputting information of a measured frequency-amplitude (gain) characteristic of the response characteristic of the reproduction system including the sound field;

correction frequency-amplitude (gain) characteristic computing means for computing a correction frequency-amplitude (gain) characteristic for realizing the desired frequency-amplitude (gain) characteristic on the basis of the desired frequency-amplitude (gain) characteristic and the measured frequency-amplitude (gain) characteristic;

correction frequency-amplitude (gain) characteristic level control means for controlling at least either an upper limit value or a lower limit value of the level of the computed correction frequency-amplitude (gain) characteristic; and correction frequency-amplitude (gain) characteristic imparting means for imparting the computed correction frequency-amplitude (gain) characteristic which has been controlled in the level to a sound signal to be reproduced.

23. An acoustic characteristic correction device comprising:

desired frequency-amplitude (gain) characteristic setting means for setting, on the basis of an operation by an operating person, a desired frequency-amplitude (gain) characteristic of a response characteristic in a reproduction system including a sound field;

measured frequency-amplitude (gain) characteristic output means for outputting information of a measured frequency-amplitude (gain) characteristic of the response characteristic of the reproduction system including the sound field;

correction frequency-amplitude (gain) characteristic computing means for computing a correction frequency-amplitude (gain) characteristic for realizing the desired frequency-amplitude (gain) characteristic on the basis of the desired frequency-amplitude (gain) characteristic and the measured frequency-amplitude (gain) characteristic;

correction frequency-amplitude (gain) characteristic frequency control means for controlling at least either an upper limit value of a lower limit value of the frequency range of the computed correction frequency-amplitude (gain) characteristic; and correction frequency-amplitude (gain) characteristic imparting means for imparting the computed correction frequency-amplitude (gain) characteristic which has been controlled in the frequency range to a sound signal to be reproduced.

24. An acoustic characteristic correction device comprising:

desired frequency-amplitude (gain) characteristic setting means for setting, on the basis of an operation by an operating person, a desired frequency-amplitude (gain) characteristic of a response characteristic in a reproduction system including a sound field;

measured frequency-amplitude (gain) characteristic output means for outputting information of a measured frequency-amplitude (gain) characteristic of a response characteristic of the reproduction system including the sound field;

correction frequency-amplitude (gain) characteristic computing means for computing a correction frequency-amplitude (gain) characteristic for realizing the desired frequency-amplitude (gain) characteristic on the basis of the desired frequency-amplitude (gain) characteristic and the measured frequency-amplitude (gain) characteristic;

correction frequency-amplitude (gain) characteristic imparting means for imparting the computed correction frequency-amplitude (gain) characteristic to a sound signal to be reproduced;

reverberation time frequency characteristic/average sound absorption rate frequency characteristic output means for outputting information of a reverberation time frequency characteristic or an average sound absorption rate frequency characteristic of said sound field; and characteristic compensation means for imparting, on the basis of the information of the reverberation time frequency characteristic or the average sound absorption rate frequency characteristic, a compensation characteristic to the correction frequency-amplitude (gain) characteristic so as to relatively increase the level of the correction frequency-amplitude (gain) characteristic with respect to a frequency for which the reverberation time is long or for which the average sound absorption rate is low.

\* \* \* \* \*